United States Patent
Katoh et al.

(10) Patent No.: US 9,236,496 B2
(45) Date of Patent: Jan. 12, 2016

(54) THIN FILM TRANSISTOR AND DISPLAY DEVICE

(75) Inventors: Sumio Katoh, Osaka (JP); Hidehito Kitakado, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 173 days.

(21) Appl. No.: 14/002,794

(22) PCT Filed: Mar. 2, 2012

(86) PCT No.: PCT/JP2012/055367
§ 371 (c)(1),
(2), (4) Date: Sep. 3, 2013

(87) PCT Pub. No.: WO2012/124511
PCT Pub. Date: Sep. 20, 2012

(65) Prior Publication Data
US 2013/0334530 A1    Dec. 19, 2013

(30) Foreign Application Priority Data
Mar. 11, 2011  (JP) ................................. 2011-054664

(51) Int. Cl.
| | | |
|---|---|---|
| *H01L 29/10* | (2006.01) | |
| *H01L 29/786* | (2006.01) | |
| *H01L 27/12* | (2006.01) | |
| *H01L 33/00* | (2010.01) | |
| *H01L 29/417* | (2006.01) | |

(52) U.S. Cl.
CPC ...... *H01L 29/78693* (2013.01); *H01L 27/1222* (2013.01); *H01L 29/41733* (2013.01); *H01L 29/7869* (2013.01); *H01L 29/78609* (2013.01); *H01L 29/78618* (2013.01); *H01L 29/78696* (2013.01); *H01L 33/0041* (2013.01)

(58) Field of Classification Search
CPC ............ H01L 29/7869; H01L 27/1225; H01L 27/1214; H01L 2924/0002; H01L 29/78696; H01L 27/124; H01L 27/1288; H01L 2924/00; H01L 29/4908; H01L 29/78606; H01L 21/02554; H01L 21/02565; H01L 21/02631
USPC .................. 257/E29.296, 43, 57, 59, E21.46, 257/E27.111, E21.04, E21.293, E21.413, 257/E21.414, E21.476, E21.704, E27.121, 257/E29.002, E29.278, E29.283, E33.003, 257/E33.004, E33.053, 71, 72, 88; 438/104, 158, 149, 155, 792
See application file for complete search history.

(56) References Cited

U.S. PATENT DOCUMENTS

| | | | |
|---|---|---|---|
| 6,130,119 A | 10/2000 | Jinnai | |
| 2002/0089616 A1* | 7/2002 | Hashimoto et al. | ............. 349/44 |
| 2008/0299702 A1* | 12/2008 | Son et al. | ....................... 438/104 |

(Continued)

FOREIGN PATENT DOCUMENTS

| | | |
|---|---|---|
| CN | 101859799 A | 10/2010 |
| JP | 2009-099944 A | 5/2009 |

(Continued)

OTHER PUBLICATIONS

Official Communication issued in International Patent Application No. PCT/JP2012/055367, mailed on May 22, 2012.

*Primary Examiner* — Robert Bachner
(74) *Attorney, Agent, or Firm* — Keating & Bennett, LLP

(57) ABSTRACT

The invention provides a thin film transistor that can reduce an off-current flowing in end-parts in a channel width direction of a channel layer and a manufacturing method therefor.

15 Claims, 28 Drawing Sheets

(56) References Cited

U.S. PATENT DOCUMENTS

| | | |
|---|---|---|
| 2010/0200858 A1 | 8/2010 | Toyota et al. |
| 2010/0207119 A1 | 8/2010 | Sakata et al. |
| 2010/0213459 A1 | 8/2010 | Shimada et al. |
| 2010/0224880 A1* | 9/2010 | Kimura .......... 257/59 |
| 2010/0252832 A1 | 10/2010 | Asano et al. |
| 2010/0301328 A1 | 12/2010 | Yamazaki et al. |
| 2011/0024751 A1* | 2/2011 | Yamazaki et al. .......... 257/57 |

FOREIGN PATENT DOCUMENTS

| | | |
|---|---|---|
| JP | 2010-062229 A | 3/2010 |
| JP | 2010-205850 A | 9/2010 |
| JP | 2010-232652 A | 10/2010 |
| JP | 2011-009719 A | 1/2011 |
| JP | 2011-049539 A | 3/2011 |
| TW | 381187 B | 2/2000 |
| TW | 201044594 A | 12/2010 |

* cited by examiner

FIG. 1
(a)
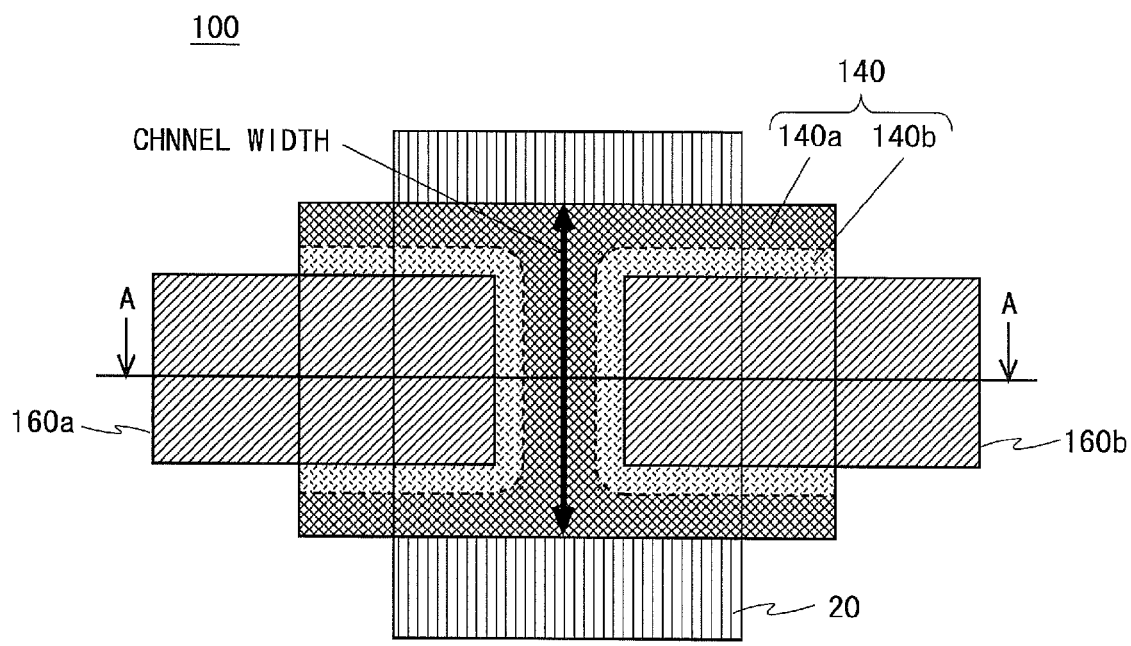
(b)
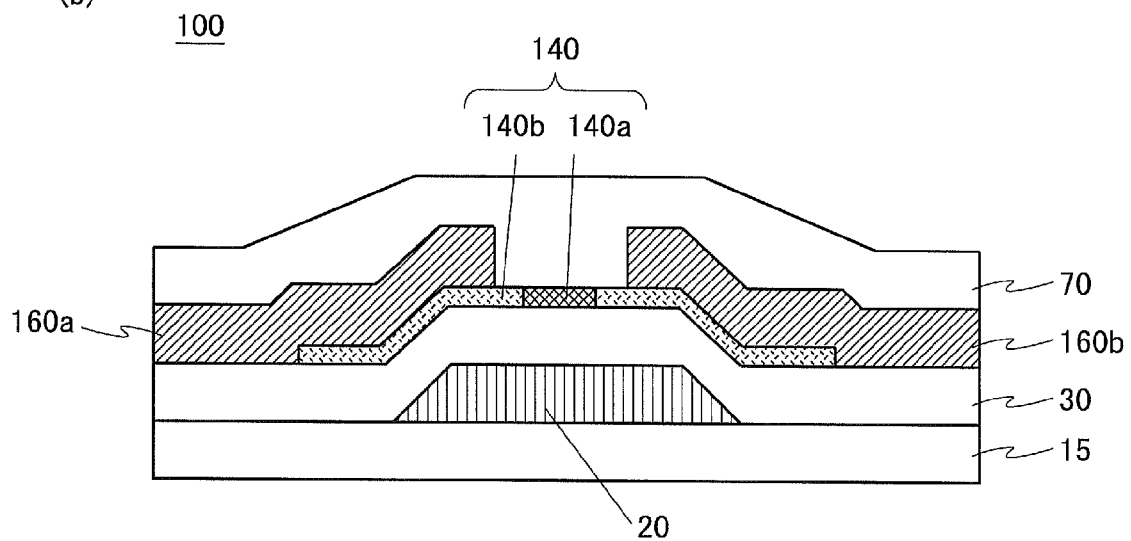

FIG. 3
(a)
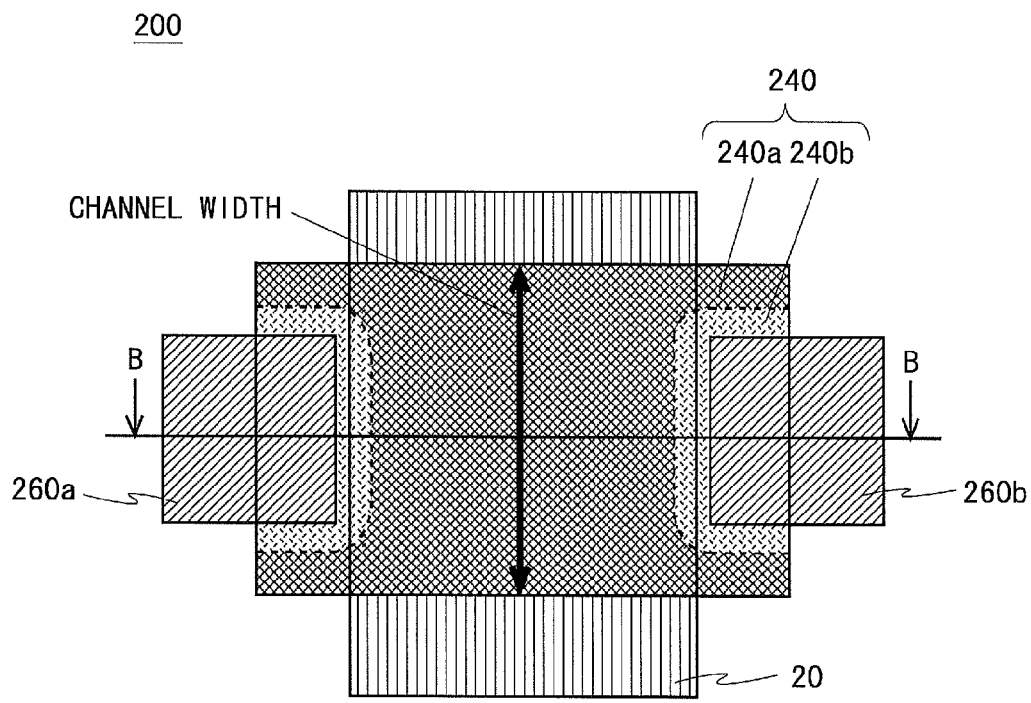
(b)
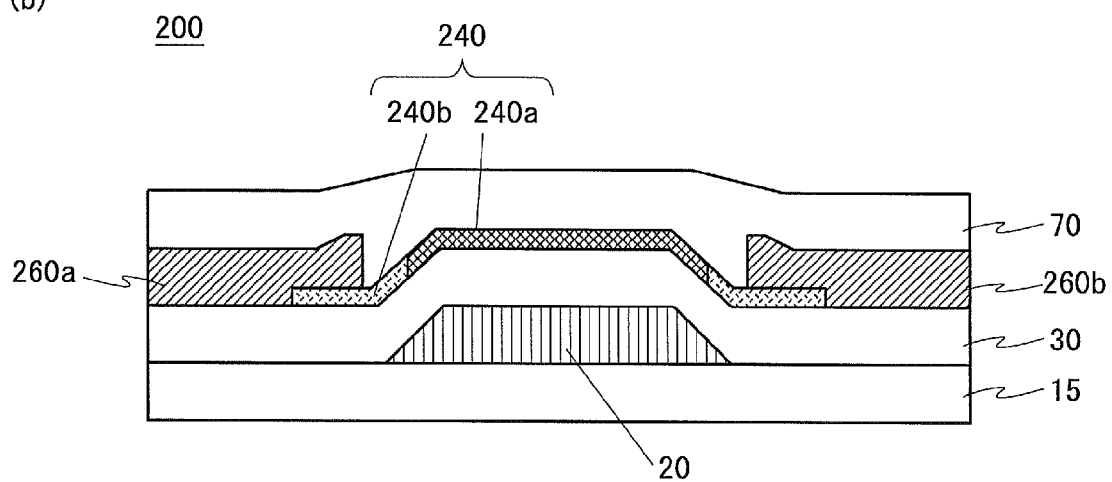

FIG. 4
(a)
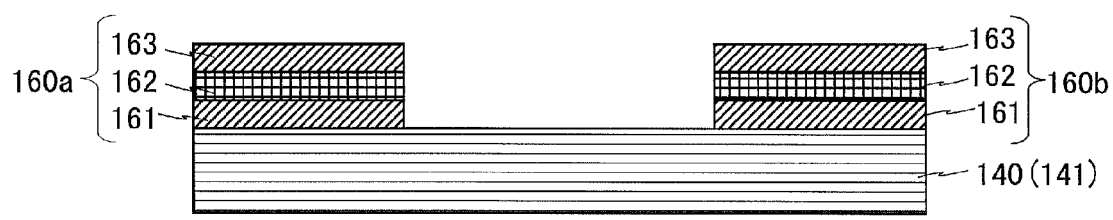
(b)
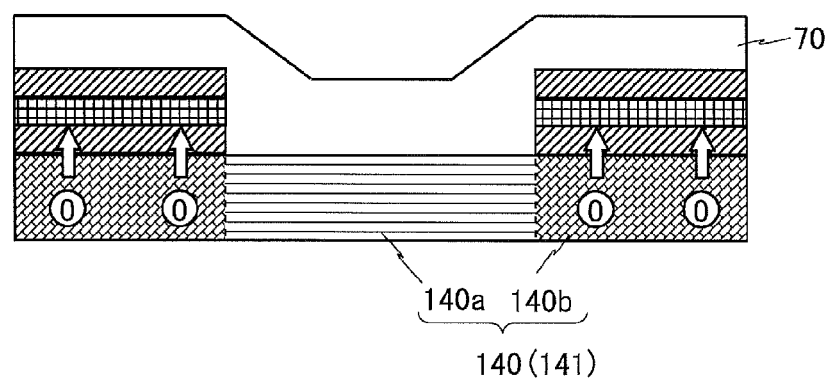
(c)
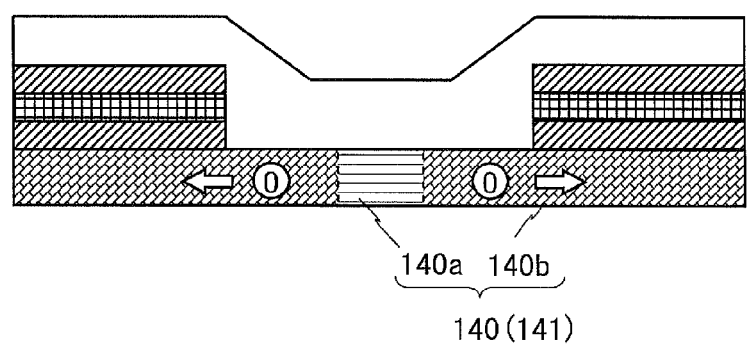

FIG. 9
(a)
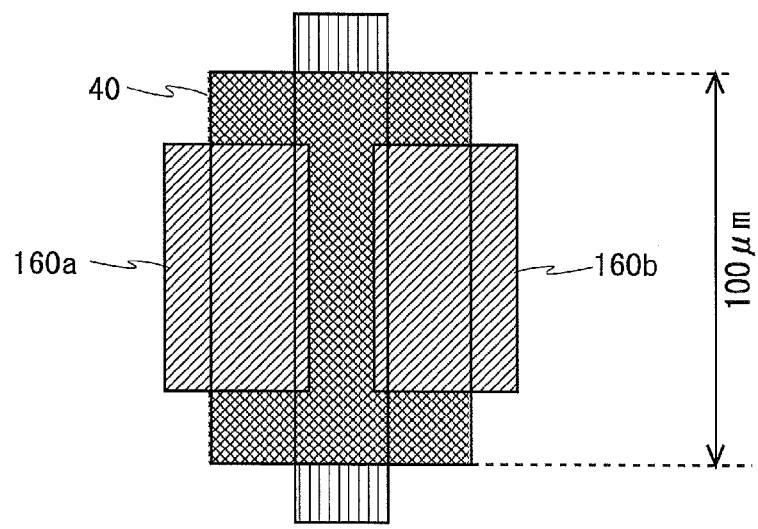
(b)
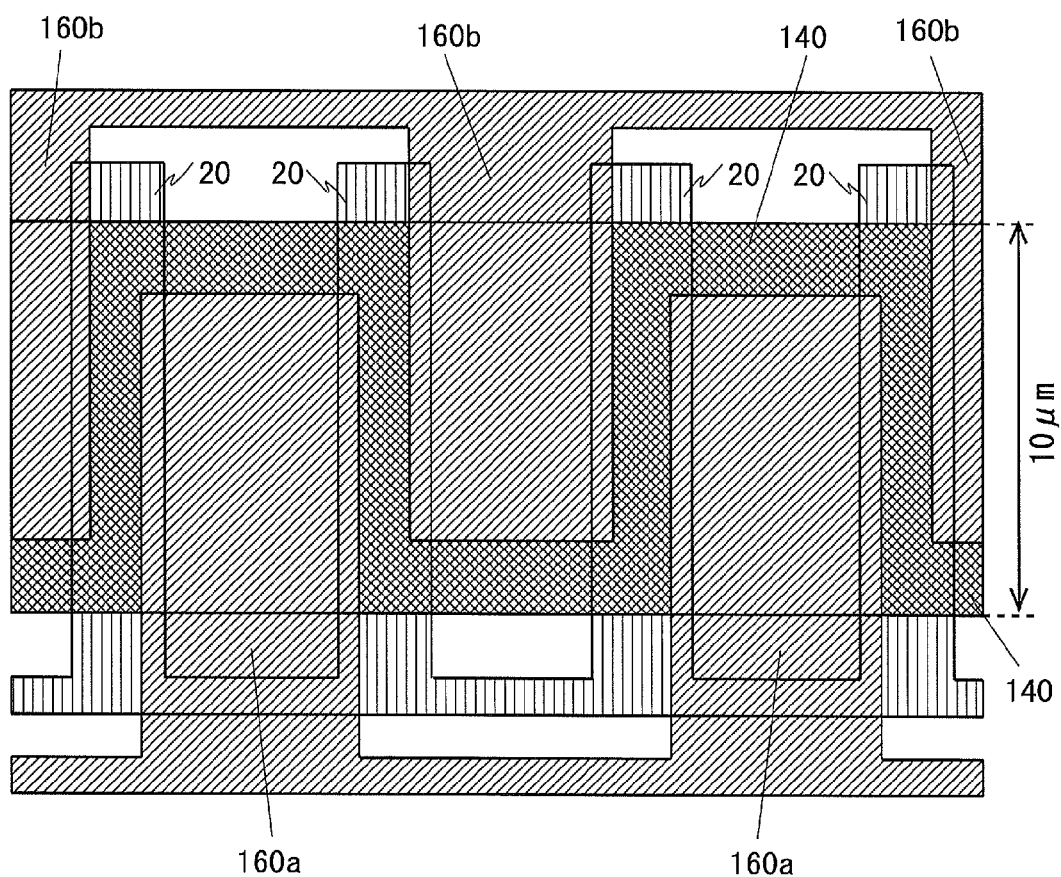

FIG. 13
(a)
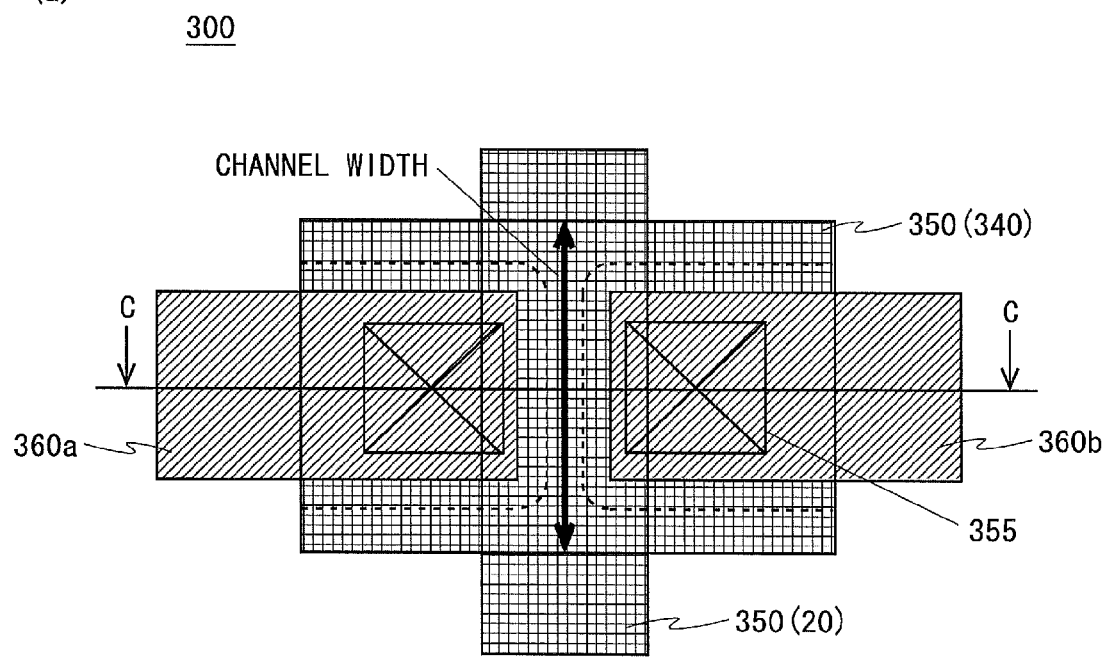
(b)
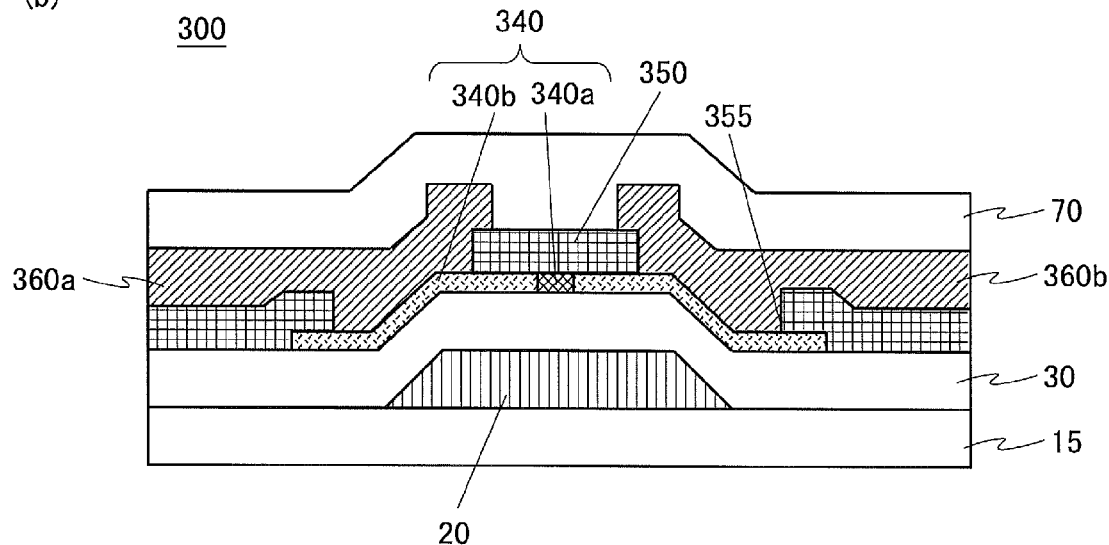

FIG. 14
(a)
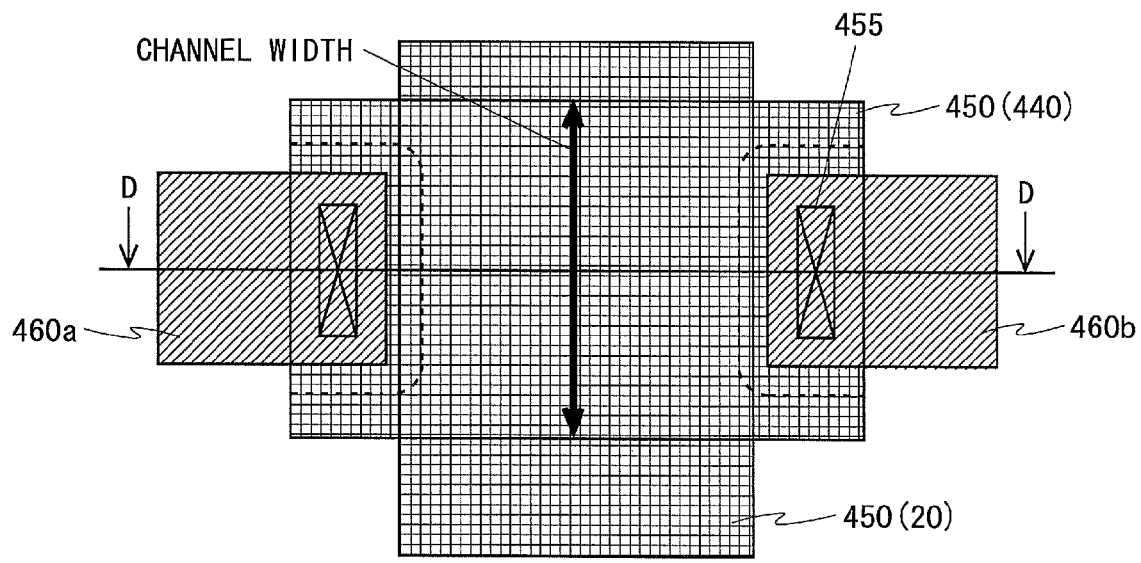
(b)
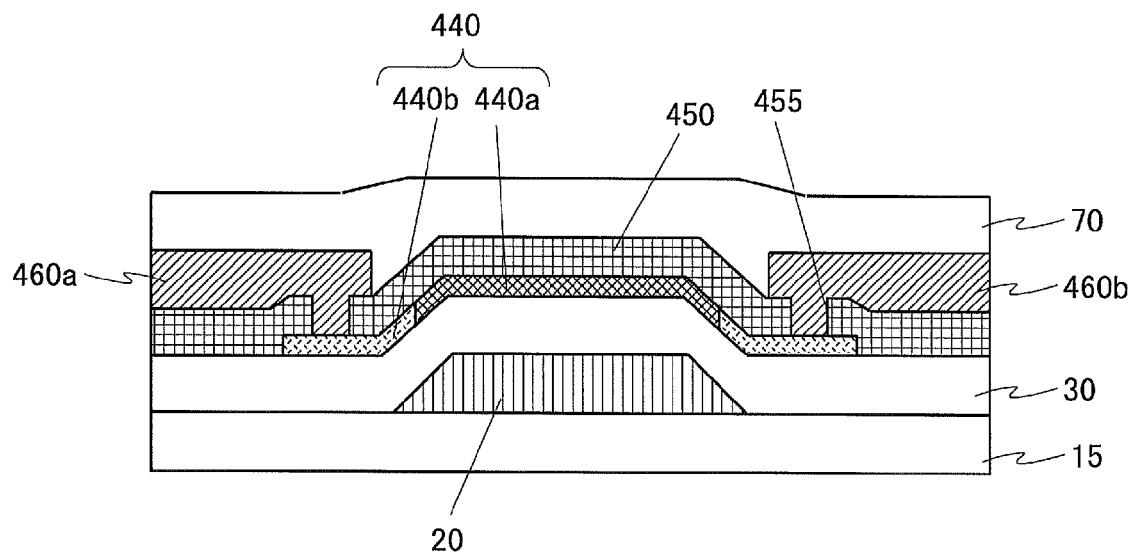

FIG. 19
(a)
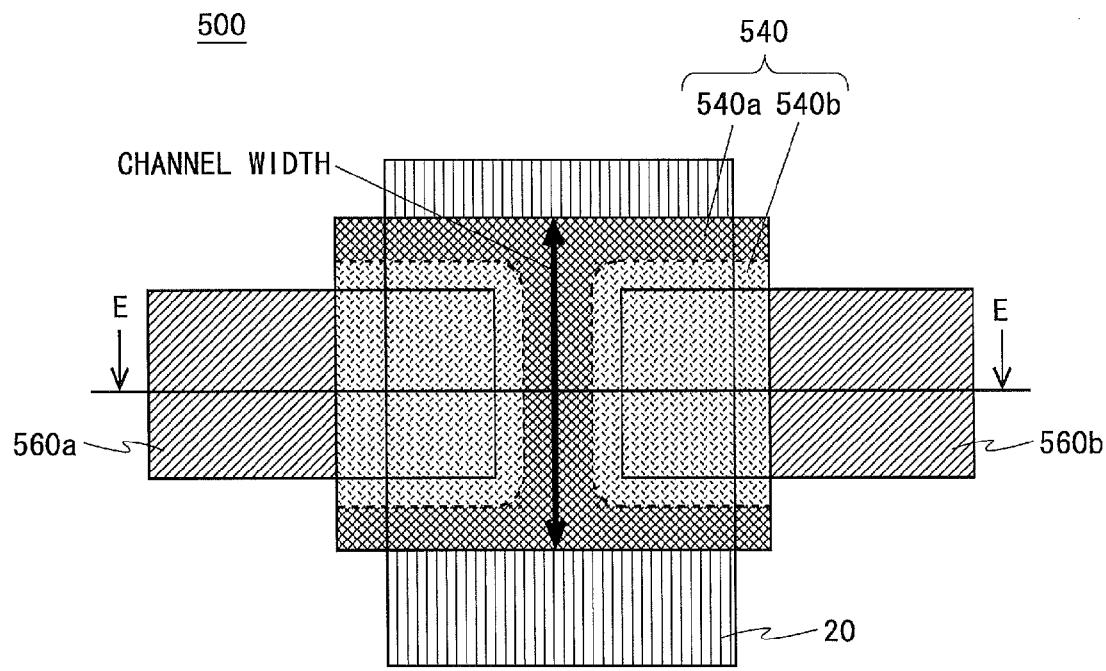
(b)
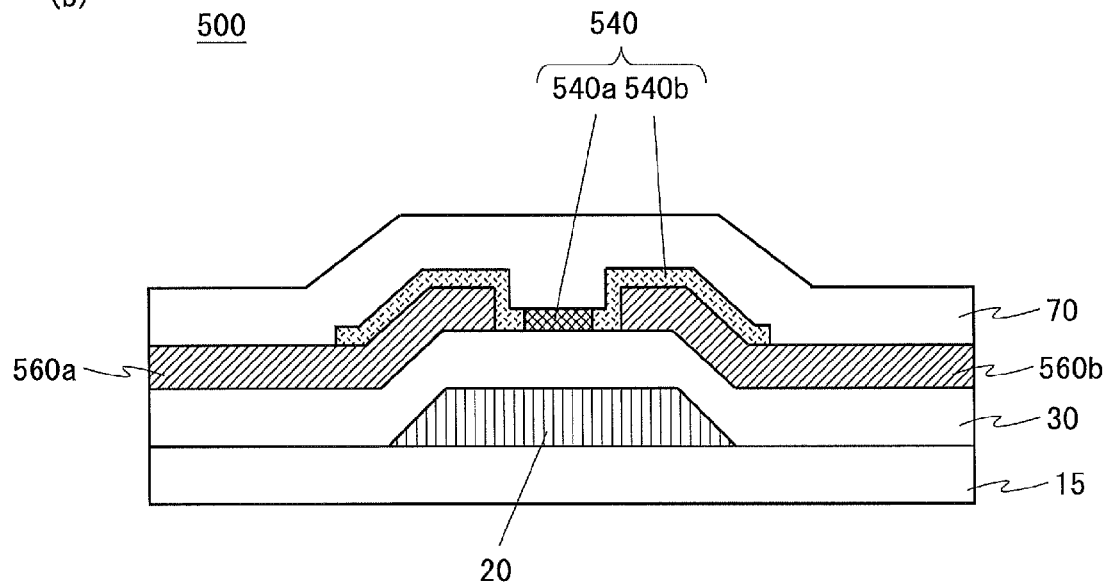

FIG. 20
(a)
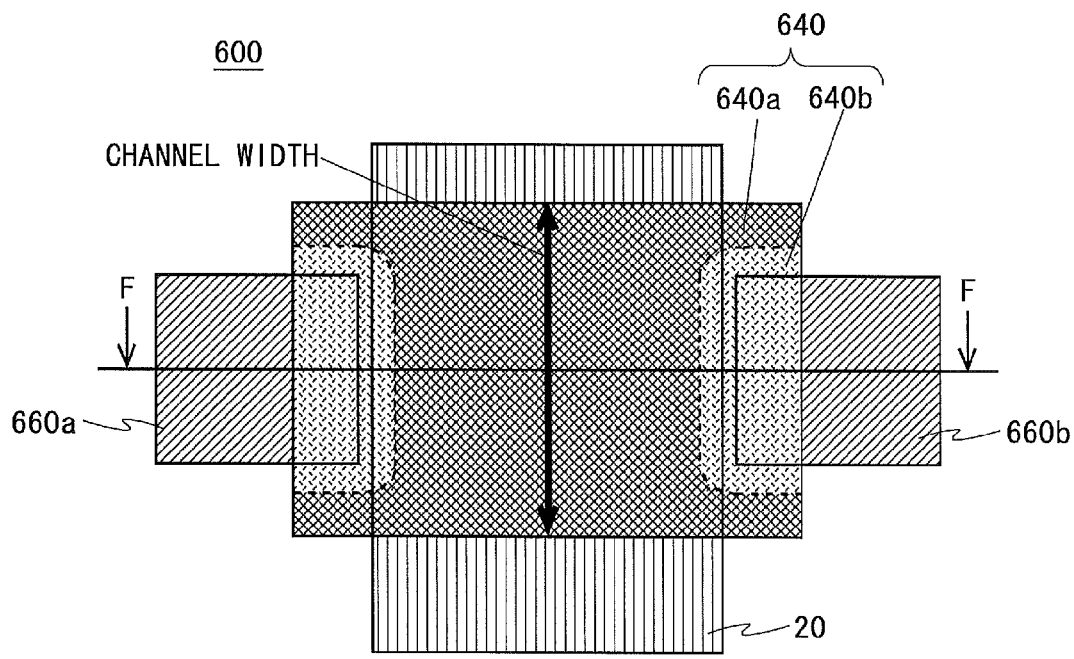
(b)
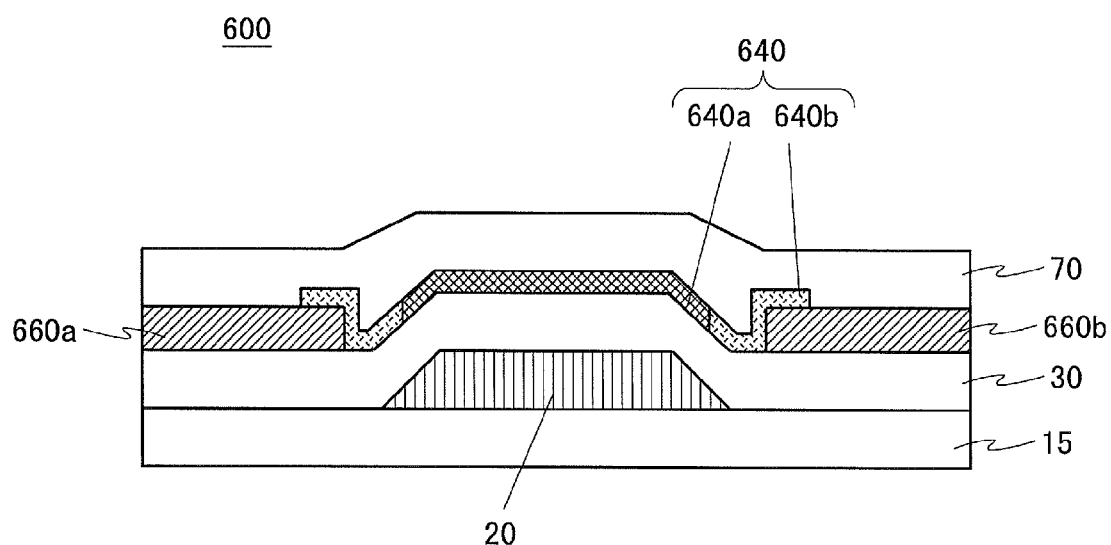

FIG. 23
(a)
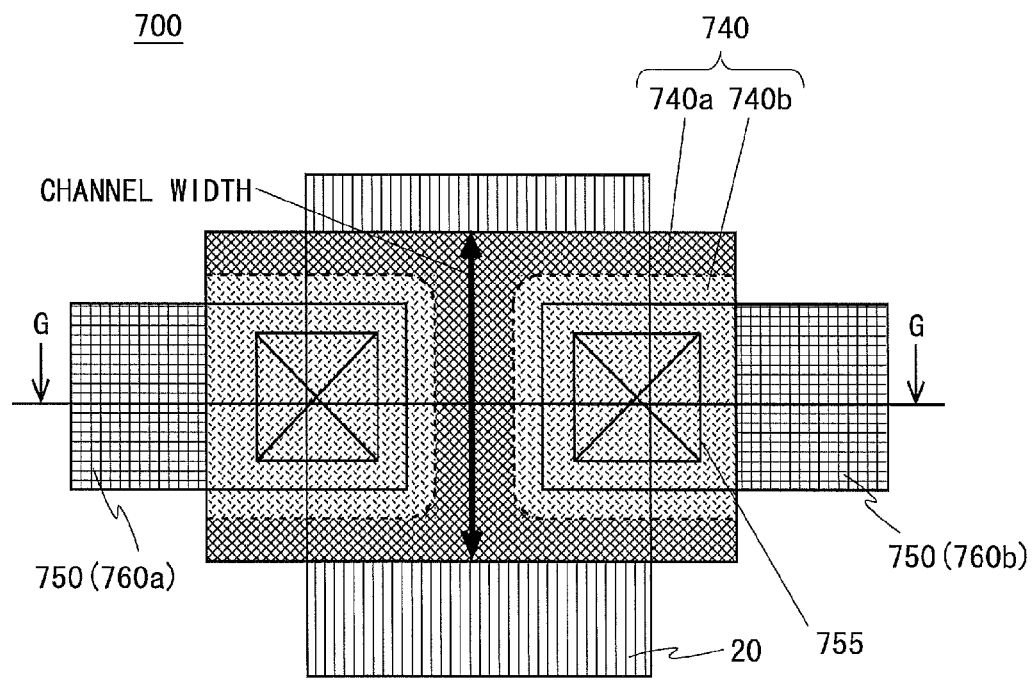
(b)
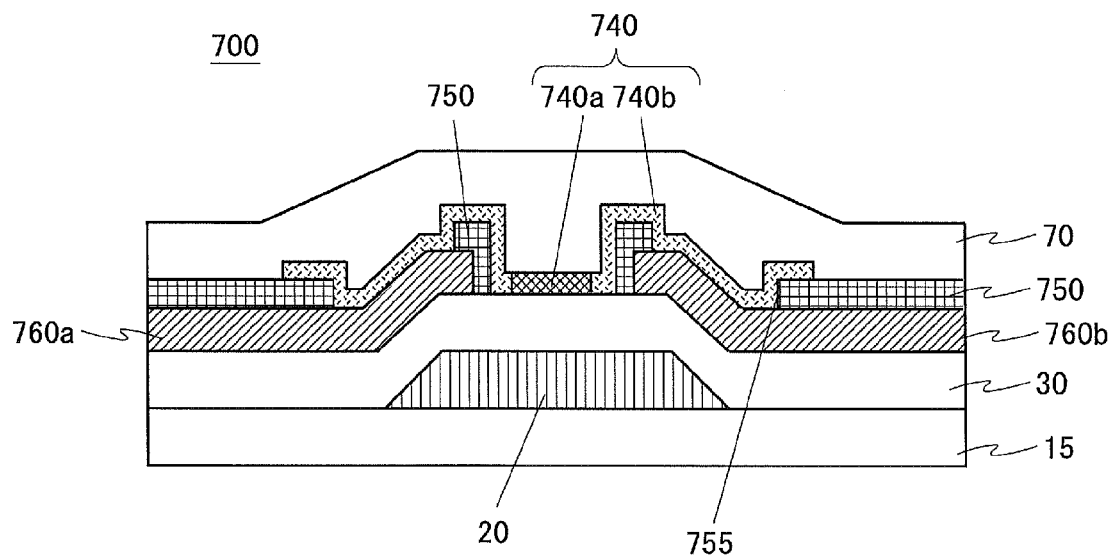

FIG. 24
(a)
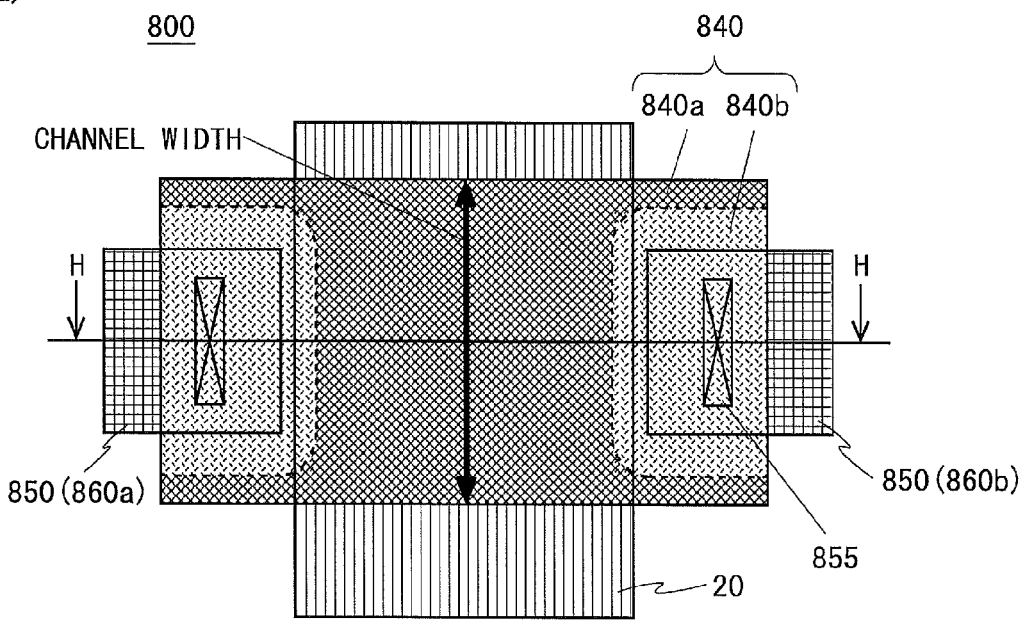
(b)
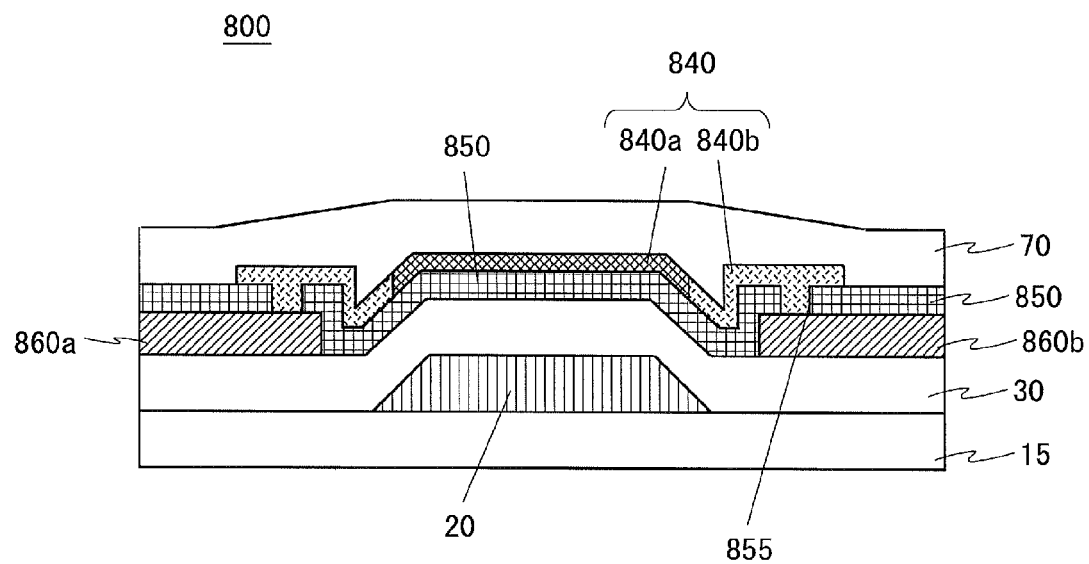

FIG. 28
(a)
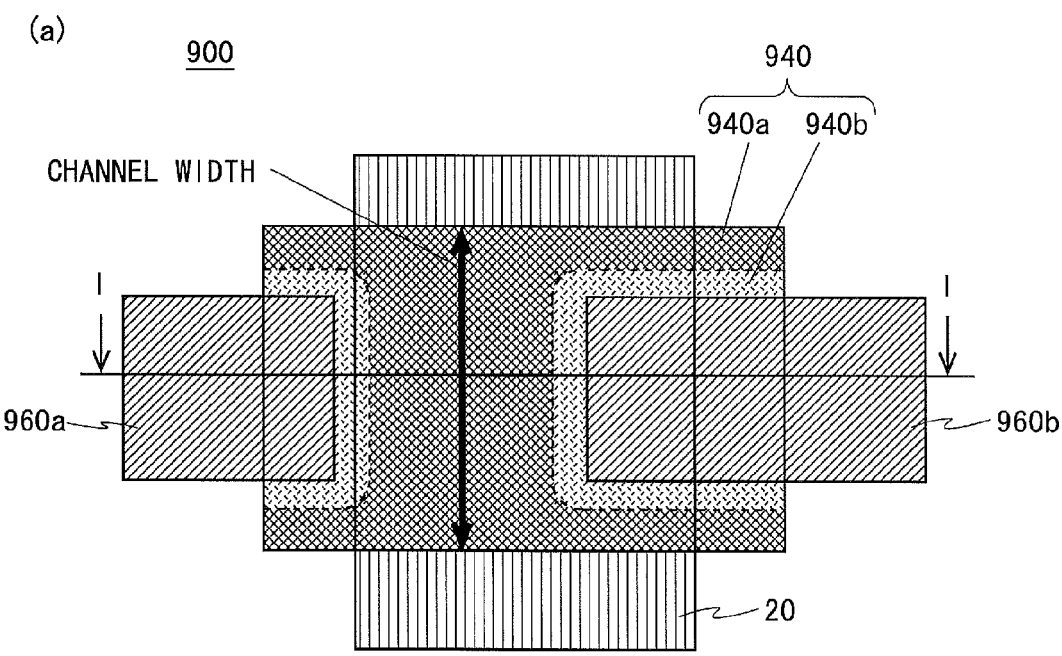
(b)
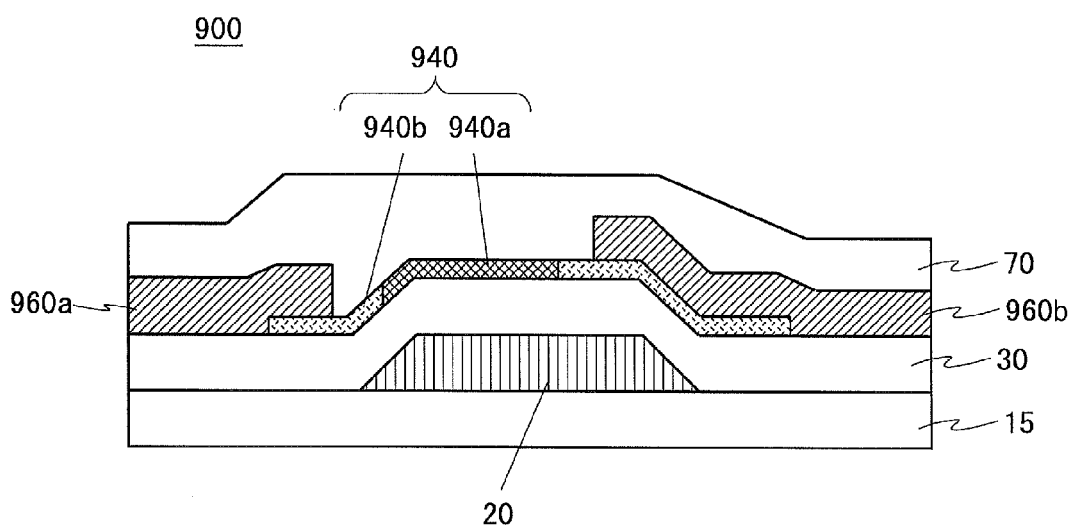

THIN FILM TRANSISTOR AND DISPLAY DEVICE

TECHNICAL FIELD

The present invention relates to a thin film transistor, a manufacturing method therefor, and a display device, and relates particularly to a thin film transistor having an oxide semiconductor layer as a channel layer, a manufacturing method therefor, and a display device.

BACKGROUND ART

A thin film transistor (hereinafter, referred to as a "TFT") having an oxide semiconductor layer of indium gallium zinc oxide (hereinafter, referred to as "IGZO") or the like as a channel layer has a characteristic in that the TFT has a fast operating speed as compared with a TFT having an amorphous silicon layer as a channel layer and that the TFT requires no crystallization process as compared with a TFT having a polycrystalline silicon layer as a channel layer. Therefore, in recent years, development of TFTs having an oxide semiconductor layer as a channel layer is being actively progressed.

However, the TFT having an oxide semiconductor layer as a channel layer has a problem in that an off-current (the current flowing between a source electrode and a drain electrode in the off state) becomes large. To reduce such an off-current, Patent Document 1 discloses a method for causing a microcrystalline layer to be not easily formed at a backchannel side of the oxide semiconductor layer, by increasing an oxygen concentration at the backchannel side in the TFT having the oxide semiconductor layer as a channel layer. In this way, by causing a microcrystalline layer to be not easily formed at the backchannel side, the backchannel side is made amorphous, and therefore, the off-current of the TFT is reduced.

PRIOR ART DOCUMENT

Patent Document

[Patent Document 1] Japanese Patent Application Laid-Open Publication No. 2010-62229

SUMMARY OF THE INVENTION

Problems to be Solved by the Invention

To form a channel layer by patterning an oxide semiconductor film, a dry etching method is used. At this time, end parts of the oxide semiconductor layer are easily damaged by plasma. When the oxide semiconductor layer thus damaged is used as a channel layer, an off-current easily flows via the damaged portion that remains at the end parts in the channel width direction of the channel layer. On the other hand, because the TFT described in Patent Document 1 reduces the off-current by increasing the oxygen concentration of a whole surface of the oxide semiconductor layer at the backchannel side, it is difficult to further reduce the off-current flowing through the end parts in the channel width direction of the channel layer.

Therefore, an object of the present invention is to provide a thin film transistor that can reduce an off-current flowing through end parts in a channel width direction of a channel layer, and a manufacturing method therefor.

Solution to the Problems

A first aspect of the present invention is directed to a thin film transistor formed on an insulating substrate, comprising:
a gate electrode formed on the insulating substrate;
a gate insulating film formed to cover the gate electrode;
a source electrode and a drain electrode formed on the gate insulating film with a predetermined distance, to sandwich the gate electrode; and
a channel layer made of an oxide semiconductor layer which is formed in a region sandwiched between the source electrode and the drain electrode and of which one end and the other end are respectively electrically connected to the source electrode and the drain electrode,
wherein the channel layer includes two first regions each having a width larger than the source electrode and the drain electrode and having a first resistance value, and a second region sandwiched between the two first regions and having a second resistance value higher than the first resistance value, and
the second region is extended to end parts in a channel width direction.

In a second aspect of the present invention, based on the first aspect of the invention, the source electrode and the drain electrode are formed to be overlapped with the gate electrode in a planar view.

In a third aspect of the present invention, based on the first aspect of the invention, the source electrode and the drain electrode are formed not to be overlapped with the gate electrode in a planar view.

In a fourth aspect of the present invention, based on the third aspect of the invention, the first region is formed to be overlapped with the gate electrode in a planar view.

In a fifth aspect of the present invention, based on the first aspect of the invention, one of the source electrode and the drain electrode is formed to be overlapped with the gate electrode in a planar view, and the other is formed not to be overlapped with the gate electrode in a planar view.

In a sixth aspect of the present invention, based on the second or third aspect of the invention, the source electrode is formed to cover one end of the channel layer, and the drain electrode is formed to cover the other end of the channel layer.

In a seventh aspect of the present invention, based on the second or third aspect of the invention, further comprising an etching stopper layer formed to cover the second region, on the channel layer in a region sandwiched between the end part of the source electrode and the end part of the drain electrode, wherein the source electrode and the drain electrode are respectively electrically connected to the two first regions of the channel layer via a contact hole formed in the etching stopper layer.

In an eighth aspect of the present invention, based on the second or third aspect of the invention, one end of the channel layer is electrically connected to the source electrode by covering one end of the source electrode, and the other end of the channel layer is electrically connected to the drain electrode by covering one end of the drain electrode.

In a ninth aspect of the present invention, based on the second or third aspect of the invention, further comprising an interlayer insulating layer which covers the source electrode and the drain electrode, wherein one end of the channel layer is electrically connected to the source electrode via a contact hole opened in the interlayer insulating layer on the source electrode, and the other end of the channel layer is electrically connected to the drain electrode via a contact hole opened in the interlayer insulating layer on the drain electrode.

In a tenth aspect of the present invention, based on the first aspect of the invention, a desired combination of a channel length and a channel width is selected from among data of a plurality of combinations of channel lengths and channel widths determined such that an off-current becomes smaller than a predetermined current value.

In an eleventh aspect of the present invention, based on the first aspect of the invention, the channel layer is made of an indium gallium zinc oxide layer, and the source electrode and the drain electrode have a titanium film that is in contact with the indium gallium zinc oxide layer.

In a twelfth aspect of the present invention, based on the first aspect of the invention, the oxide semiconductor layer is made of a microcrystalline oxide semiconductor layer.

A thirteenth aspect of the present invention is directed a method for manufacturing a thin film transistor formed on an insulating substrate, the method comprising the steps of:

forming a gate electrode on an insulating substrate;

forming a gate insulating film to cover the gate electrode;

forming a channel layer made of an oxide semiconductor layer, on the gate insulating film;

forming a source electrode and a drain electrode, on the gate insulating film; and performing first annealing, after forming a passivation film which covers the insulating substrate, wherein the passivation film is made of a silicon oxide film.

In a fourteenth aspect of the present invention, based on the thirteenth aspect of the invention, the first annealing is performed for 0.5 hour to 2 hours (inclusive) at a temperature of 250° C. to 350° C. (inclusive) in an atmosphere containing oxygen.

In a fifteenth aspect of the present invention, based on the fourteenth aspect of the invention, further comprising the steps of: forming an etching stopper layer made of a silicon oxide layer, on the channel layer; and a performing second annealing after forming the etching stopper layer, wherein the second annealing is performed for 0.5 hour to 2 hours (inclusive) at a temperature of 200° C. to 350° C. (inclusive) in the atmosphere containing oxygen.

A sixteenth aspect of the present invention is directed an active matrix-type display device for displaying an image, the device comprising:

the first thin film transistor according to the first aspect;

an auxiliary capacitance part including a lower electrode, an upper electrode, and an insulating film formed between the lower electrode and the upper electrode;

an intersection part where a gate electrode of the first thin film transistor intersects with one of a source electrode and a drain electrode; and a contact part where the gate electrode is electrically connected to one of the source electrode and the drain electrode by a connection electrode, wherein the lower electrode is formed when the gate electrode of the first thin film transistor is formed, the upper electrode is formed when the source electrode and the drain electrode of the first thin film transistor are formed, and the insulating film is formed when a gate insulating film of the first thin film transistor is formed.

In a seventeenth aspect of the present invention, based on the sixteenth aspect of the invention, the first thin film transistor is a thin film transistor according to claim 7, the insulating film of the auxiliary capacitance part includes a first insulating film formed when the gate insulating film of the thin film transistor is formed, and the intersection part includes the first insulating film, and a second insulating film formed when the etching stopper layer of the thin film transistor is formed.

In an eighteenth aspect of the present invention, based on the sixteenth aspect of the invention, in the contact part, the connection electrode for electrically connecting the gate electrode to one of the source electrode and the drain electrode is made of a transparent metal film.

Effects of the Invention

According to the first aspect, the second region having a higher resistance value than that in the first regions is extended not only to the channel region sandwiched between the source electrode and the drain electrode, but also to the end parts in the channel width direction of the channel layer. Accordingly, because the off-current flowing through the end parts in the channel width direction reduces, the off-current of the thin film transistor can be reduced.

According to the second aspect, because the source electrode and the drain electrode are overlapped with the gate electrode in the planar view, a high-concentration carrier layer is formed in the channel layer by the gate voltage applied to the gate electrode. Accordingly, the source electrode and the drain electrode become in ohmic contact with the channel layer.

According to the third aspect, because the source electrode and the drain electrode are not overlapped with the gate electrode in the planar view, a parasitic capacitance formed by the source electrode and the gate electrode and a parasitic capacitance formed by the drain electrode and the gate electrode become small. Accordingly, the operation speed of the thin film transistor can be made fast.

According to the fourth aspect, because the first regions of the channel layer are overlapped with the gate electrode in the planar view, the thin film transistor operates normally without becoming in the offset state.

According to the fifth aspect, one of the source electrode and the drain electrode is formed to be overlapped with the gate electrode in the planar view, and the other is formed not to be overlapped with the gate electrode. Accordingly, the parasitic capacitance of the thin film transistor can be set to approximately a half of the parasitic capacitance of the thin film transistor of which the source electrode and the drain electrode are overlapped with the gate electrode.

According to the sixth aspect, in the bottom gate type thin film transistor with the channel-etched structure, the off-current flowing through the end parts in the channel width direction reduces. Therefore, the off-current of the thin film transistor can be reduced.

According to the seventh aspect, in the bottom gate type thin film transistor with the etch-stopper structure, the off-current flowing through the end parts in the channel width direction reduces. Therefore, the off-current of the thin film transistor can be reduced.

According to the eighth aspect, in the bottom gate type thin film transistor with the bottom-contact structure, the off-current flowing through the end parts in the channel width direction reduces. Therefore, the off-current of the thin film transistor can be reduced.

According to the ninth aspect, in the bottom gate type thin film transistor with the bottom-contact structure having the interlayer insulating layer, the off-current flowing through the end parts in the channel width direction reduces. Therefore, the off-current of the thin film transistor can be reduced.

According to the tenth aspect, because the channel layer and the channel width are selected from among the combinations such that an off-current becomes smaller than a predetermined value, designing of a thin film transistor of which the off-current is smaller than the predetermined value and having a desired size is facilitated.

According to the eleventh aspect, because the indium gallium zinc oxide layer is easily reduced by the titanium film, the first regions can be easily formed. Accordingly, the channel length becomes short, and consequently, the on-current of the thin film transistor becomes large.

According to the twelfth aspect, because the oxide semiconductor layer is made of the microcrystalline semiconductor layer, the on-current of the thin film transistor becomes large.

According to the thirteenth aspect, by performing the first annealing, the first and second regions are formed in the channel layer. Further, because the oxygen contained in the passivation film is supplied to the oxide semiconductor layer in the channel layer, lattice defects in the oxide semiconductor layer are repaired. Accordingly, the resistance value of the oxide semiconductor layer becomes high, and the shift in the threshold voltage due to the gate voltage stress is suppressed, and consequently, reliability of the thin film transistor improves.

According to the fourteenth aspect, repair of the lattice defects in the oxide semiconductor layer can be performed efficiently.

According to the fifteenth aspect, when the second annealing is also performed after forming the etching stopper layer, the lattice defects in the oxide semiconductor layer can be repaired more completely. Further, by performing the second annealing, the first annealing can be performed at a lower temperature. Accordingly, a variation in the shrinkage of the insulating substrate due to the annealing becomes small, and therefore, an alignment margin can be made small. As a result, a design margin between the layers becomes small, and the parasitic capacitance can be made small.

According to the sixteenth aspect, in the display device, during the formation of the components of the first thin film transistor according to the first aspect, the lower electrode, the upper electrode, and the insulating film sandwiched between the lower electrode and the upper electrode of the auxiliary capacitance part are simultaneously formed.

According to the seventeenth aspect, the etching stopper layer is formed on the thin film transistor according to the seventh aspect. Therefore, at the intersection part, the parasitic capacitance between the electrodes can be made small by using the etching stopper layer as the second insulating film together with the first insulating film. In the auxiliary capacitance part, by removing the etching stopper layer, reduction in the capacitance of the capacitor can be avoided.

According to the eighteenth aspect, because the connection electrode is made of a transparent metal film, the connection electrode can be formed simultaneously with the pixel electrode. Accordingly, the manufacturing process of the display device can be simplified.

BRIEF DESCRIPTION OF THE DRAWINGS

FIG. 1(a) is a plan view of a first bottom gate type TFT included in a liquid crystal display device according to a first embodiment, and FIG. 1(b) is a cross-sectional view of the first bottom gate type TFT taken along section line A-A shown in FIG. 1(a).

FIG. 3(a) is a plan view of a second bottom gate type TFT included in the liquid crystal display device according to the first embodiment, and FIG. 3(b) is a cross-sectional view of the second bottom gate type TFT taken along section line B-B shown in FIG. 3(a).

FIGS. 4(a) to 4(c) are cross-sectional views each showing a state where low resistance regions are formed in the TFT shown in FIG. 1.

FIG. 9(a) is a plan view of a TFT having a channel length of 10 μm and a channel width of 100 μm, and FIG. 9(b) is a view showing a circuit that has TFTs connected in parallel, each TFT having a channel length of 10 μm and a channel width of 10 μm.

FIG. 13(a) is a plan view showing a configuration of a third bottom gate type TFT included in a liquid crystal display device according to a second embodiment, and FIG. 13(b) is a cross-sectional view of the third bottom gate type TFT taken along section line C-C shown in FIG. 13(a).

FIG. 14(a) is a plan view showing a configuration of a fourth bottom gate type TFT included in the liquid crystal display device according to the second embodiment, and FIG. 14(b) is a cross-sectional view of the fourth bottom gate type TFT taken along section line D-D shown in FIG. 14(a).

FIG. 19(a) is a plan view showing a configuration of a fifth bottom gate type TFT included in a liquid crystal display device according to a third embodiment, and FIG. 19(b) is a cross-sectional view of the fifth bottom gate type TFT taken along section line E-E shown in FIG. 19(a).

FIG. 20(a) is a plan view showing a configuration of a sixth bottom gate type TFT included in a liquid crystal display device according to the third embodiment, and FIG. 20(b) is a cross-sectional view of the sixth bottom gate type TFT taken along section line F-F shown in FIG. 20(a).

FIG. 23(a) is a plan view showing a configuration of a seventh bottom gate type TFT included in a liquid crystal display device according to a fourth embodiment, and FIG. 23(b) is a cross-sectional view of the seventh bottom gate type TFT taken along section line G-G shown in FIG. 23(a).

FIG. 24(a) is a plan view showing a configuration of an eighth bottom gate type TFT included in a liquid crystal display device according to the fourth embodiment, and FIG. 24(b) is a cross-sectional view of the eighth bottom gate type TFT taken along section line H-H shown in FIG. 24(a).

FIG. 28(a) is a plan view showing a configuration of a TFT as a modification of the TFT shown in FIG. 1, and FIG. 28(b) is a cross-sectional view showing the configuration of the TFT as the modification taken along section line I-I shown in FIG. 28(a).

MODES FOR CARRYING OUT THE INVENTION

1. First Embodiment

Figure 2:
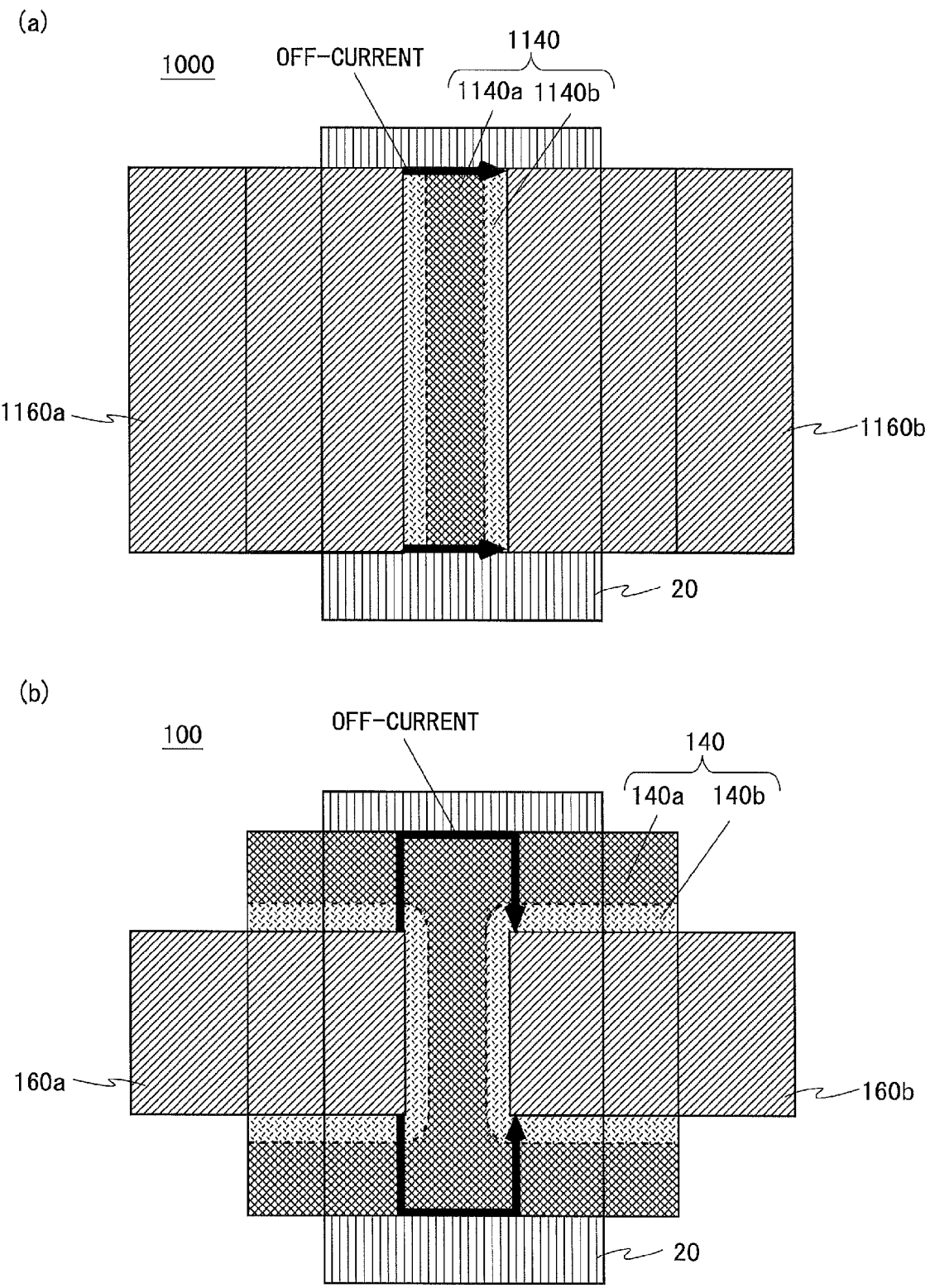
FIG. 2(a) is a view showing a path for an off-current to flow through the end parts in the channel width direction of the TFT in which widths of the source electrode and the drain electrode are the same as the width of the channel layer.
FIG. 2(b) is a view showing a path for an off-current to flow through the end parts in the channel width direction of the TFT shown in FIG. 1.

A liquid crystal display device according to a first embodiment of the present invention is described. The liquid crystal display device according to the present embodiment includes two kinds of TFTs. First, a configuration of each TFT is described.

<1.1 Configuration of First TFT>

FIG. 1(a) is a plan view of a first bottom gate type TFT 100 included in a liquid crystal display device according to the present embodiment, and FIG. 1(b) is a cross-sectional view of the first bottom gate type TFT 100 taken along section line A-A shown in FIG. 1(a). The TFT 100 shown in FIG. 1(a) and FIG. 1(b) is also referred to as a TFT with a channel-etched structure. A configuration of the first bottom gate type TFT 100 is described with reference to FIG. 1(a) and FIG. 1(b). In the following description, the first bottom gate type TFT 100 is simply referred to as the TFT 100.

A gate electrode 20 is formed on an insulating substrate 15 such as a glass substrate. The gate electrode 20 is configured by a laminated metal film obtained by laminating a titanium (Ti) film (not shown) having a film thickness of 10 nm to 100 nm, an aluminum (Al) film (not shown) having a film thickness of 50 nm to 500 nm, and a titanium film (not shown) having a film thickness of 50 nm to 300 nm in order on the insulating substrate 15. The gate electrode 20 may be configured by a laminated metal film obtained by laminating a titanium film and a copper (Cu) film in order on the insulating substrate 15.

A gate insulating film 30 is formed to cover the whole surface of the insulating substrate 15 including the gate electrode 20. The gate insulating film 30 is configured by a laminated insulating film obtained by laminating a silicon oxide ($SiO_2$) film (not shown) having a film thickness of 20 nm to 100 nm on a silicon nitride (SiNx) film (not shown) having a film thickness of 100 nm to 500 nm. In this way, the reason why the silicon oxide film is laminated on the silicon nitride film is to cause the gate insulating film 30 not to easily deprive the oxygen from an IGZO layer that becomes a channel layer 140 to be described later. The gate insulating film 30 may be configured by a laminated insulating film obtained by laminating a silicon nitride film and a silicon oxynitride film in order, or by a single-layer insulating film such as a silicon oxide film, for example.

The channel layer 140 in an island shape is formed on the surface of the gate insulating film 30 to cover the gate electrode 20 in the planar view. The channel layer 140 is made of an IGZO layer including indium (In), gallium (Ga), zinc (Zn), and oxygen (O).

A film thickness of the IGZO layer is preferably about 20 nm to 200 nm. This is for the following reasons. When the film thickness of the IGZO layer becomes smaller than 20 nm, the transistor characteristic of the TFT 100 becomes unstable, and the shift of a threshold voltage due to temperature stress and gate voltage stress occurs. On the other hand, when the film thickness becomes larger than 200 nm, controllability by the gate voltage becomes poor, and an off-current (particularly, the off-current when the gate voltage is 0 V) increases.

A composition ratio of the IGZO layer used in the present embodiment is shown by the following equation (1).

$$\text{Indium:gallium:zinc}=1:1:1 \quad (1)$$

However, the composition ratio of the IGZO layer may be as shown by the following equation (2), or may be other composition ratio.

$$\text{Indium:gallium:zinc}=4:5:1 \quad (2)$$

Although the IGZO layer used in the present embodiment is most preferably an amorphous film, the IGZO layer may be a crystalline film such as a microcrystalline film and a polycrystalline film. In the microcrystalline film, the on-resistance of the TFT 100 becomes small, and the on-current becomes large.

The oxide semiconductor that can be used as the channel layer 140 of the TFT 100 is not limited to IGZO, and may be an In—Zn—O system, an In—Zn—Sn—O system, or an In—Zn—Si—O system. Specifically, the oxide semiconductor may be IZO (indium zinc oxide), ITO (indium tin oxide), ZnO (zinc oxide), SnO (stannous oxide), WO (tungsten oxide), or IO (indium oxide).

On the upper surface of the channel layer 140, there are arranged a source electrode 160a and a drain electrode 160b separated into left and right with a predetermined distance. The source electrode 160a is extended from a left upper surface of the gate electrode 20 onto the left-side gate insulating film 30 in the planar view. The drain electrode 160b is extended from a right upper surface of the gate electrode 20 onto the right-side gate insulating film 30 in the planar view.

The source electrode 160a and the drain electrode 160b are configured by a laminated metal film obtained by laminating a titanium film (not shown) having a film thickness of 10 nm to 100 nm, an aluminum film (not shown) having a film thickness of 50 nm to 400 nm, and a titanium film (not shown) having a film thickness of 50 nm to 300 nm in order, for example. In this way, the source electrode 160a and the drain electrode 160b are configured by the laminated metal film for the following reason. Because a resistance value of the titanium film is high, resistance values of the source electrode 160a and the drain electrode 160b can be lowered by sandwiching an aluminum film having a low resistance value between the upper and lower titanium films. When the resistance values of the source electrode 160a and the drain electrode 160b may be high, the source electrode 160a and the drain electrode 160b may be configured by only a titanium film. This is also applied to TFTs to be described later, and therefore, this description is omitted in the TFTs described later.

The formation of the titanium film on the respective surfaces of the source electrode 160a and the drain electrode 160b that are in contact with the channel layer 140 is for the following reason. When the titanium film deprives oxygen from the IGZO layer that becomes the channel layer 140, lattice defects (oxygen vacancies) are formed in the IGZO layer. Regions in which the lattice defects are formed become low resistance regions (also referred to as "first regions") 140b having a low resistance value. In this way, the low resistance regions 140b are formed in the channel layer 140.

The source electrode 160a and the drain electrode 160b may be configured by a single-layer metal film such as titanium, aluminum, copper, tungsten (W), molybdenum (Mo), and tantalum (Ta); a single-layer alloy film such as aluminum-neodymium (Nd), titanium-aluminum, molybdenum-tungsten, and indium-tin; and a laminated metal film obtained by laminating a copper film, an aluminum film, or a molybdenum film on a titanium film.

Widths of the source electrode 160a and the drain electrode 160b (lengths in a vertical direction in FIG. 1(*a*)) are smaller than a width of the channel layer 140 (a length in a vertical direction in FIG. 1(*a*), also referred to as a "channel width"). In the channel layer 140, the low resistance regions 140b are formed to surround respectively the source electrode 160a and the drain electrode 160b. The IGZO layer sandwiched between the two low resistance regions 140b remains as a high resistance region (also referred to as a "second region") 140a of which a resistance value is higher than those of the low resistance regions 140b. In this case, the high resistance region 140a is extended not only to a region (channel region) sandwiched between the source electrode 160a and the drain electrode 160b, but also to the end parts in the channel width direction of these electrodes. A position and a length of the channel width are indicated by an arrow shown in FIG. 1(*a*). The position and the length of the channel width are similarly applied to the TFTs to be described later, and therefore, an arrow that indicates a position and a length of the channel width is also described in the plan views of the TFTs described later.

A passivation film 70 is formed to cover the whole surface of the insulating substrate 15 including the source electrode 160a and the drain electrode 160b. The passivation film 70 is made of a silicon oxide film having a film thickness of 50 nm to 500 nm. The reason why the passivation film 70 is made of the silicon oxide film is described later.

Next, a description will be given of the reason why the off-current can be reduced by forming the high resistance region 140a extending to the end parts in the channel width direction of the TFT 100. FIG. 2(*a*) is a view showing a path for an off-current to flow through the end parts in the channel width direction of a TFT 1000 in which widths of a source electrode 1160a and a drain electrode 1160b are the same as the width of a channel layer 1140, and FIG. 2(*b*) is a view showing a path for the off-current to flow through the end parts in the channel width direction of the TFT 100 in which widths of the source electrode 160a and the drain electrode 160b are smaller than the width of the channel layer 140. In the TFT 1000 shown in FIG. 2(*a*), low resistance regions 1140b are formed along the end parts of the source electrode 1160a and the drain electrode 1160b to be in parallel with these end parts. A region sandwiched between the left and right low resistance regions 1140b remains as a high resistance region 1140a, and constitutes a channel layer 1140 together with the left and right low resistance regions 1140b. In this case, the high resistance region 1140a is not formed to surround the source electrode 1160a and the drain electrode 1160b. At the time of forming the channel layer 1140 by etching, the end parts in the channel width direction of the channel layer 1140 are easily damaged and low resistance regions (not shown) are easily formed in the end parts. When such low resistance regions are formed at the end parts in the channel width direction of the channel layer 1140, an off-current easily flows from the source electrode 1160a to the drain electrode 1160b through the low resistance region in the end parts in the channel width direction. Therefore, the off-current becomes large in the TFT 1000.

However, according to the TFT 100 shown in FIG. 2(*b*), because the widths of the source electrode 160a and the drain electrode 160b are smaller than the width of the channel layer 140, the low resistance regions 140b are formed in the channel layer 140 to surround the source electrode 160a and the drain electrode 160b. Accordingly, the high resistance region 140a is extended not only to the region sandwiched between the source electrode 160a and the drain electrode 160b, but also to the end parts in the channel width direction. Also in the TFT 100 shown in FIG. 2(*b*), when the low resistance regions due to the damage at the time of etching are formed at the end parts in the channel width direction of the channel layer 140, for example, a path for the off-current to flow is the path from the source electrode 160a to the drain electrode 160b in order through the low resistance regions 140b, the high resistance region 140a adjacent to the low resistance regions 140b, the low resistance regions (not shown) formed at the end parts in the channel width direction, the high resistance region 140a near the drain electrode 160b, and the low resistance regions 140b adjacent to the high resistance region 140a.

According to the TFT 100, because the high resistance region 140a is extended to the end parts in the channel width direction of the channel layer 140, the off-current flowing through the above path reduces. Accordingly, the off-current of the TFT 100 can be reduced. The effect of reducing the off-current is present if any part of the high resistance region 140a at the end parts in the channel width direction is formed. In FIG. 2(b), to emphasize the high resistance region 140a at the end parts in the channel width direction, the high resistance region 140a is drawn wider than the actual width. Because the path for the off-current to flow through the end parts in the channel width direction is also similar to that of the TFTs to be described later, the description of the path for the off-current to flow is omitted in the description of the TFTs described later.

Further, the end part of the source electrode 160a is arranged to be overlapped with the left upper surface of the gate electrode 20 in the planar view, and the end part of the drain electrode 160b is arranged to be overlapped with the right upper surface of the gate electrode 20 in the planar view. Therefore, when a predetermined voltage is applied to the gate electrode 20, a high-concentration electron layer (high-concentration carrier layer) is formed in the low resistance regions 140b of the channel layer 140 by the electric field from the gate electrode 20. Based on the formation of the high-concentration electron layer, the source electrode 160a and the drain electrode 160b become in ohmic connection with the channel layer 140.

<1.2 Configuration of Second TFT>

FIG. 3(a) is a plan view of a second bottom gate type TFT 200 included in the liquid crystal display device according to the present embodiment, and FIG. 3(b) is a cross-sectional view of the second bottom gate type TFT 200 taken along section line B-B shown in FIG. 3(a). The second bottom gate type TFT 200 shown in FIG. 3(a) and FIG. 3(b) is also referred to as a TFT with a channel-etched structure. A configuration of the second bottom gate type TFT 200 is described with reference to FIG. 3(a) and FIG. 3(b). Out of components of the TFT 200, the components having the same configurations and arrangements as those of the components of the TFT 100 shown in FIG. 1(a) and FIG. 1(b) are designated by the same or corresponding reference characters, and their descriptions are omitted. In the following description, the second bottom gate type TFT 200 is simply referred to as the TFT 200.

Configurations and arrangements of the gate electrode 20, the gate insulating film 30, and a channel layer 240 formed on the insulating substrate 15 are the same as the configurations and the arrangements of the gate electrode 20, the gate insulating film 30, and the channel layer 140 of the TFT 100, and therefore, their descriptions are omitted. Low resistance regions 240b and a high resistance region 240a that are formed in the channel layer 240 are described later.

A source electrode 260a and a drain electrode 260b that are formed to sandwich the gate electrode 20 are arranged not to be overlapped with the gate electrode 20 in the planar view. The source electrode 260a is extended from an upper surface at one end of the channel layer 240 onto the left-side gate insulating film 30. The drain electrode 260b is extended from an upper surface at the other end of the channel layer 240 onto the right-side gate insulating film 30. A laminated metal film constituting the source electrode 260a and the drain electrode 260b is the same as that constituting the source electrode 160a and the drain electrode 160b of the TFT 100, and therefore, its description is omitted.

Widths of the source electrode 260a and the drain electrode 260b are smaller than the channel with of the channel layer 240. In the channel layer 240, the low resistance regions 240b are formed to surround respectively the source electrode 260a and the drain electrode 260b. The channel layer 240 sandwiched between the two low resistance regions 240b remains as a high resistance region 240a. In this case, the high resistance region 240a becomes longer than the high resistance region 140a of the TFT 100 by an increased distance between the source electrode 260a and the drain electrode 260b. The high resistance region 240a is extended not only to the channel region sandwiched between the source electrode 260a and the drain electrode 260b, but also to the end part in the channel width direction of these electrodes.

Further, the passivation film 70 is formed to cover the whole surface of the insulating substrate 15 including the source electrode 260a and the drain electrode 260b. The passivation film 70 is the same as that of the TFT 100, and therefore, its description is omitted.

In the TFT 200, because the high resistance region 240a is extended to the end parts in the channel width direction of the channel layer 240 like in the TFT 100, the off-current flowing through the end parts in the channel width direction reduces. Accordingly, the off-current of the TFT 200 can be reduced. The effect of reducing the off-current is present if any part of the high resistance region 240a at the end parts in the channel width direction is formed.

Unlike in the TFT 100, a distance between the source electrode 260a and the drain electrode 260b in the TFT 200 is larger than the length of the gate electrode 20. Accordingly, because each of the source electrode 260a and the drain electrode 260b is not overlapped with the gate electrode 20 in the planer view, the parasitic capacitance of the TFT 200 becomes small.

Further, unlike in the TFT 100, each of the source electrode 260a and the drain electrode 260b in the TFT 200 is not overlapped with the gate electrode 20 in the planer view. Therefore, when the low resistance regions 240b formed in the channel layer 240 are not extended to above the gate electrode 20, the TFT 200 becomes in the offset state. Even when a predetermined voltage is applied to the gate electrode 20 in this state, the TFT 200 is not turned on. Therefore, in the TFT 200, a distance between the source electrode 260a and the gate electrode 20 and a distance between the drain electrode 260b and the gate electrode 20 are set small. Accordingly, because the low resistance regions 240b of the channel layer 240 are extended to above the gate electrode 20, the TFT 200 normally operates without becoming in the offset state.

<1.3 Low Resistance Regions in Channel Layer and Off-Current>

Taking the TFT 100 as an example, a description will be given of a mechanism of forming the resistance regions 140b so as to surround the source electrode 160a and the drain electrode 160b, in the channel layer 140 around the source electrode 160a and the drain electrode 160b. FIGS. 4(a) to 4(c) are cross-sectional views each showing a state where the low resistance regions 140b are formed in the TFT 100.

First, as shown in FIG. 4(a), the source electrode 160a and the drain electrode 160b are formed on a surface of an IGZO layer 141 constituting the channel layer 140. Both the source electrode 160a and the drain electrode 160b are configured by a laminated metal film obtained by laminating a titanium film 161, an aluminum film 162, and a titanium film 163 in order.

As shown in FIG. 4(b), by the annealing performed after forming the passivation film 70, the titanium film 161 on the lower surfaces of the source electrode 160a and the drain electrode 160b deprives oxygen from the IGZO layer 141. As a result of the depriving of the oxygen, lattice defects (oxygen vacancies) occur in the IGZO layer 141 that is in contact with the lower surfaces of the source electrode 160a and the drain electrode 160b, and the IGZO layer 141 becomes the low resistance regions 140b.

Further, when the annealing is continued, as shown in FIG. 4(c), the oxygen which is contained in the IGZO layer 141 around the source electrode 160a and the drain electrode 160b sequentially moves to the interface with the titanium film 161, and is deprived by the titanium film 161. The titanium film 161 is oxidized by the oxygen deprived from the IGZO layer 141. In this way, the titanium film 161 deprives oxygen not only from the IGZO layer 141 beneath thereof, but also from the IGZO layer 141 around the source electrode 160a and the drain electrode 160b. As a result, the low resistance regions 140b are extended to the IGZO layer 141 around the source electrode 160a and the drain electrode 160b. On the other hand, the IGZO layer 141 from which oxygen is not deprived remains as the high resistance region 140a.

In this way, in the IGZO layer 141, the low resistance regions 140b are formed around the source electrode 160a and the drain electrode 160b, and the high resistance region 140a remains in a region at the outside of the two low resistance regions 140b.

As a result, as shown in FIG. 1(a), when the widths of the source electrode 160a and the drain electrode 160b of the TFT 100 are set smaller than the channel width of the channel layer 140, the low resistance regions 140b are formed to surround respectively the source electrode 160a and the drain electrode 160b, and a region sandwiched between the two low resistance regions 140b remains as the high resistance region 140a.

Because the surface of the titanium film 161 that is in contact with the IGZO layer 141 becomes titanium oxide (TiO$_2$) by being oxidized, contact resistance values between the source electrode 160a and the channel layer 140 and between the drain electrode 160b and the channel layer 140 become low.

<1.4 Comparison between Configurations of First TFT and Second TFT>

Figure 5:
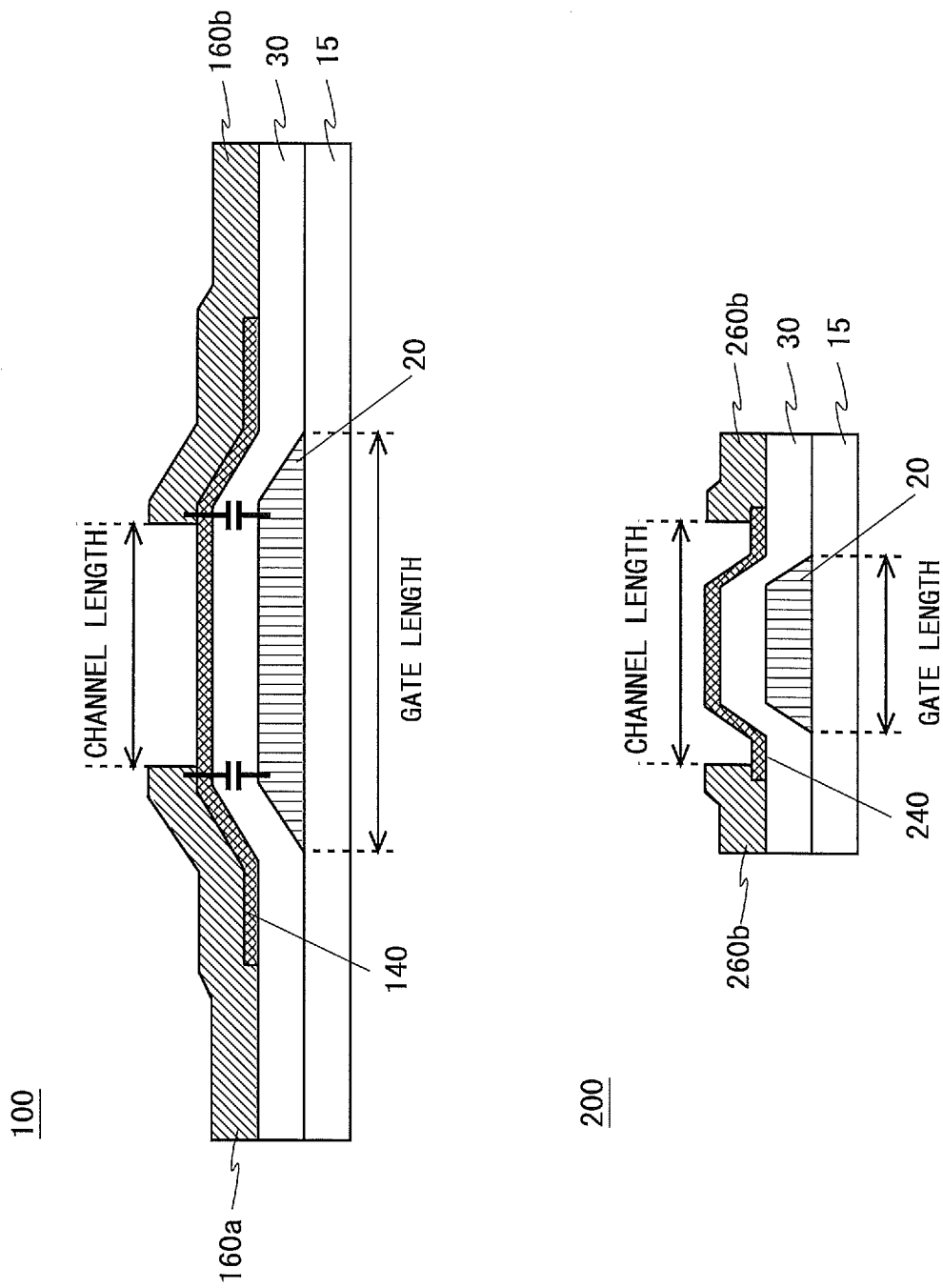
FIG. 5 is a cross-sectional view showing comparison between a configuration of the TFT shown in FIG. 1(b) and a configuration of the TFT shown in FIG. 3(b).

FIG. 5 is a cross-sectional view showing comparison between the configuration of the TFT 100 shown in FIG. 1(b) and the configuration of the TFT 200 shown in FIG. 3(b). As described above, in the TFT 100, the source electrode 160a and the drain electrode 160b are formed to be overlapped with the gate electrode 20 in the planar view. On the other hand, in the TFT 200, the source electrode 260a and the drain electrode 260b are formed not to be overlapped with the gate electrode 20 in the planar view.

As shown in FIG. 5, when the channel lengths of the TFT 100 and the TFT 200 are set the same, the gate length of the TFT 100 becomes larger than the gate length of the TFT 200. Therefore, in the TFT 100, the source electrode 160a and the drain electrode 160b are overlapped with the gate electrode 20, and the parasitic capacitance becomes large. On the other hand, in the TFT 200, the source electrode 260a and the drain electrode 260b are not overlapped with the gate electrode 20, and therefore, the parasitic capacitance becomes small. Accordingly, the on/off operation of the TFT 200 becomes fast. Therefore, in the liquid crystal display device, the TFT 100 is used as a switching of a pixel part, for example, and the TFT 200 is used as the TFT constituting a source driver and a gate driver (hereinafter, collectively referred to as a "drive circuit").

<1.5 Off-Current of TFT Used in Pixel Part>

Figure 6:
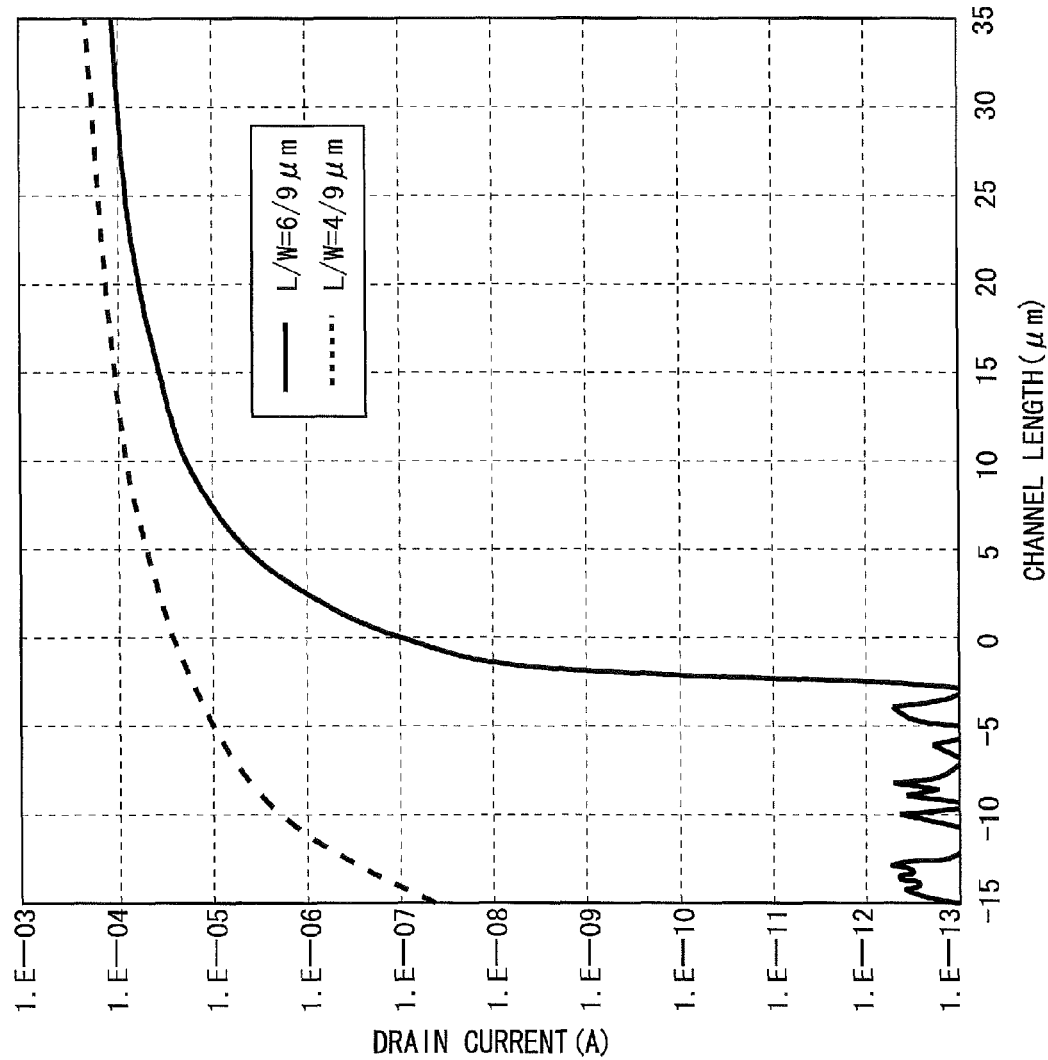
FIG. 6 is a graph showing a transistor characteristic of the TFT shown in FIG. 1(a) and FIG. 1(b).

FIG. 6 is a graph showing a transistor characteristic of the TFT 100 shown in FIG. 1(a) and FIG. 1(b). The transistor characteristic shown in FIG. 6 is the characteristic measured for a TFT having a channel length of 4 μm and a channel width of 9 μm, and a TFT having a channel length of 6 μm and a channel width of 9 μm.

As is clear from FIG. 6, in the TFT having the channel length of 6 μm, when −15 V is applied as a gate voltage, the off-current flowing between the source electrode and the drain electrode is 1 pA/μm or less. On the other hand, in the TFT having the channel length of 4 μm, the off-current becomes very large, that is, a few hundred nA/m. In this way, the off-current of the TFT is greatly different depending on the channel length and the channel width. Hereinafter, the off-current refers to a value obtained by dividing the current flowing between the source electrode and the drain electrode by the channel width, when the TFT is in the off-state, that is, the current that flows per channel width of 1 μm when the TFT is in the off state.

To measure the off-current, a plurality of TFTs having different channel lengths and channel widths are prepared, and the off-current of each TFT is measured. The off-current is measured for each prepared TFT, by applying −15 V to the gate electrode and 10 V to between the source electrode and the drain electrode.

Figure 7:
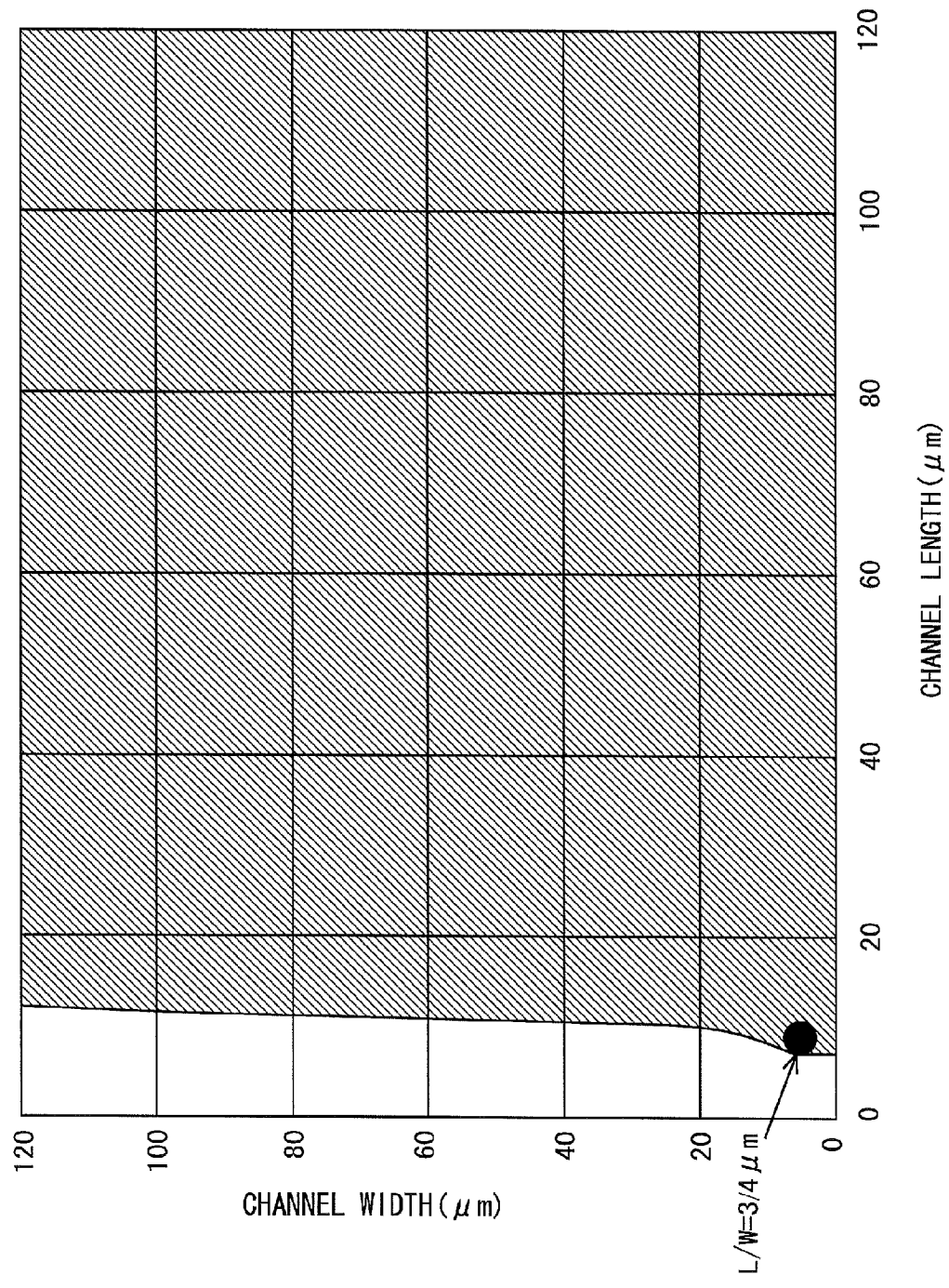
FIG. 7 is a graph showing a range of a channel length and a channel width of a TFT that can be used as a switching element of a pixel part of the liquid crystal display device according to the first embodiment.

FIG. 7 is a graph showing a range of a channel length and a channel width of a TFT that can be used as a switching element of the pixel part of the liquid crystal display device according to the present embodiment. Specifically, FIG. 7 shows a range of a channel length and a channel width of the TFT having an off-current of 1 pA/μm or less when the off-current is measured in the above measurement condition. This measurement condition of the off-current is a condition based on the assumption that the TFT is used as the switching element of the pixel part of the liquid crystal display device.

As can be seen in FIG. 7, in the TFT having a channel length of 3 μm and a channel width of 4 μm, for example, the off-current becomes 1 pA/μm or less. When this TFT is used as the switching element of the liquid crystal display device, reduction of a signal voltage of the pixel capacitance can be suppressed. Accordingly, a displayed image can be maintained in high quality.

<1.6 Off-Current of TFT Used in Drive Circuit>

Figure 8:
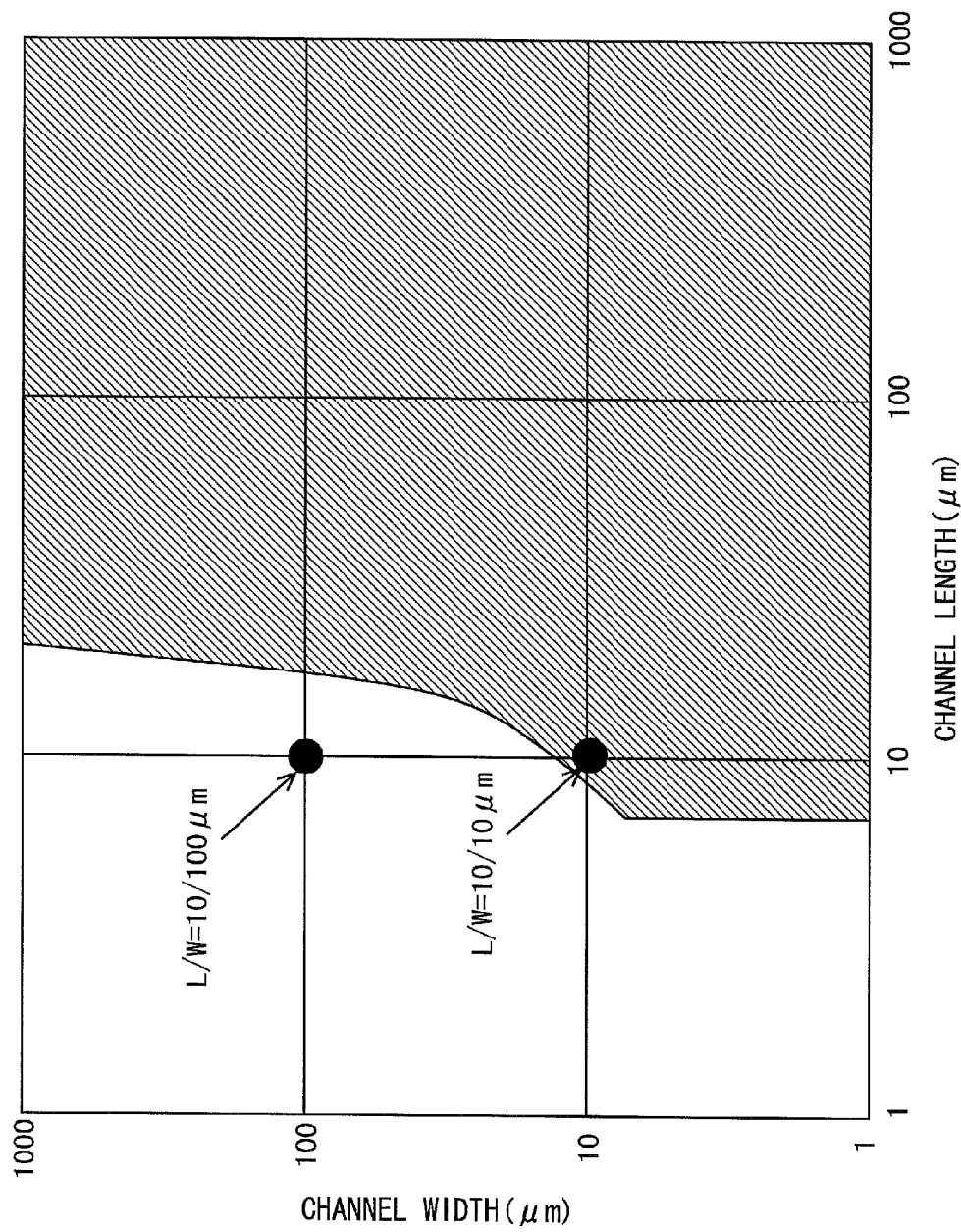
FIG. 8 is a graph showing a range of a channel length and a channel width that can be used as a TFT constituting a drive circuit of the liquid crystal display device according to the first embodiment.

FIG. 8 is a graph showing a range of a channel length and a channel width that can be used as a TFT constituting the drive circuit of the liquid crystal display device according to the present embodiment. In a similar manner to that in FIG. 7, for a plurality of TFTs having different channel lengths and channel widths, 0 V is applied to the gate electrode and 10 V is applied to between the source electrode and the drain electrode, and the off-current at this time is measured. FIG. 8 shows a range of a channel length and a channel width of the TFT of which the off-current measured in this way becomes 100 pA/μm or less. This measurement condition is a condition based on the assumption that the TFT is used as a TFT constituting a drive circuit of the liquid crystal display device.

As can be seen in FIG. 8, the off-current of the TFT having a channel length of 10 μm and a channel width of 100 μm becomes larger than 100 pA, for example. However, the off-current of the TFT having only a channel width set to 10 μm without changing the channel length becomes 100 pA/μm or less. From this, it becomes clear that the off-current of a circuit that has ten TFTs connected in parallel, each TFT having a channel length of 10 μm and a channel width of 10 μm becomes 100 pA or less. Therefore, the off-current can be set 100 pA or less, by replacing the TFT having a channel length of 10 μm and a channel width of 100 μm with a circuit that has ten TFTs connected in parallel, each TFT having a channel length of 10 μm and a channel width of 10 μm.

FIG. 9(*a*) is a plan view of a TFT having a channel length of 10 μm and a channel width of 100 μm, and FIG. 9(*b*) is a view showing a circuit that has TFTs connected in parallel, each TFT having a channel length of 10 μm and a channel width of 10 μm. The TFT shown in FIG. 9(*a*) is a TFT of a widely-known configuration, except that the channel width is 100 μm, and therefore, its description is omitted.

In the circuit that has TFTs connected in parallel, the channel layer 140 extending so as to cross above the gate electrodes 20 which are arranged in parallel is formed as shown in FIG. 9(*b*). On the channel layers 140 at the left and right sides of the gate electrode 20 with the gate electrode 20 interposed therebetween, the source electrode 160*a* and the drain electrode 160*b* are alternately formed. The source electrode 160*a* and the drain electrode 160*b* are formed to serve as the source electrode 160*a* and the drain electrode 160*b* of mutually adjacent TFTs as well. Each TFT formed in this way is a TFT having a channel length of 10 μm and a channel width of 10 μm. In the ten TFTs, the off-current of a circuit that is formed by connecting between gate electrodes, between source electrodes, and between drain electrodes is reduced more than the off-current of a TFT having a channel length of 10 μm and a channel width of 100 μm, and becomes 1 pA/μm or less. When a drive circuit driving a pixel part of a liquid crystal display device is configured by using this circuit, power consumption of the drive circuit can be reduced.

<1.7 Manufacturing Method for Liquid Crystal Display Device>

Figure 10:
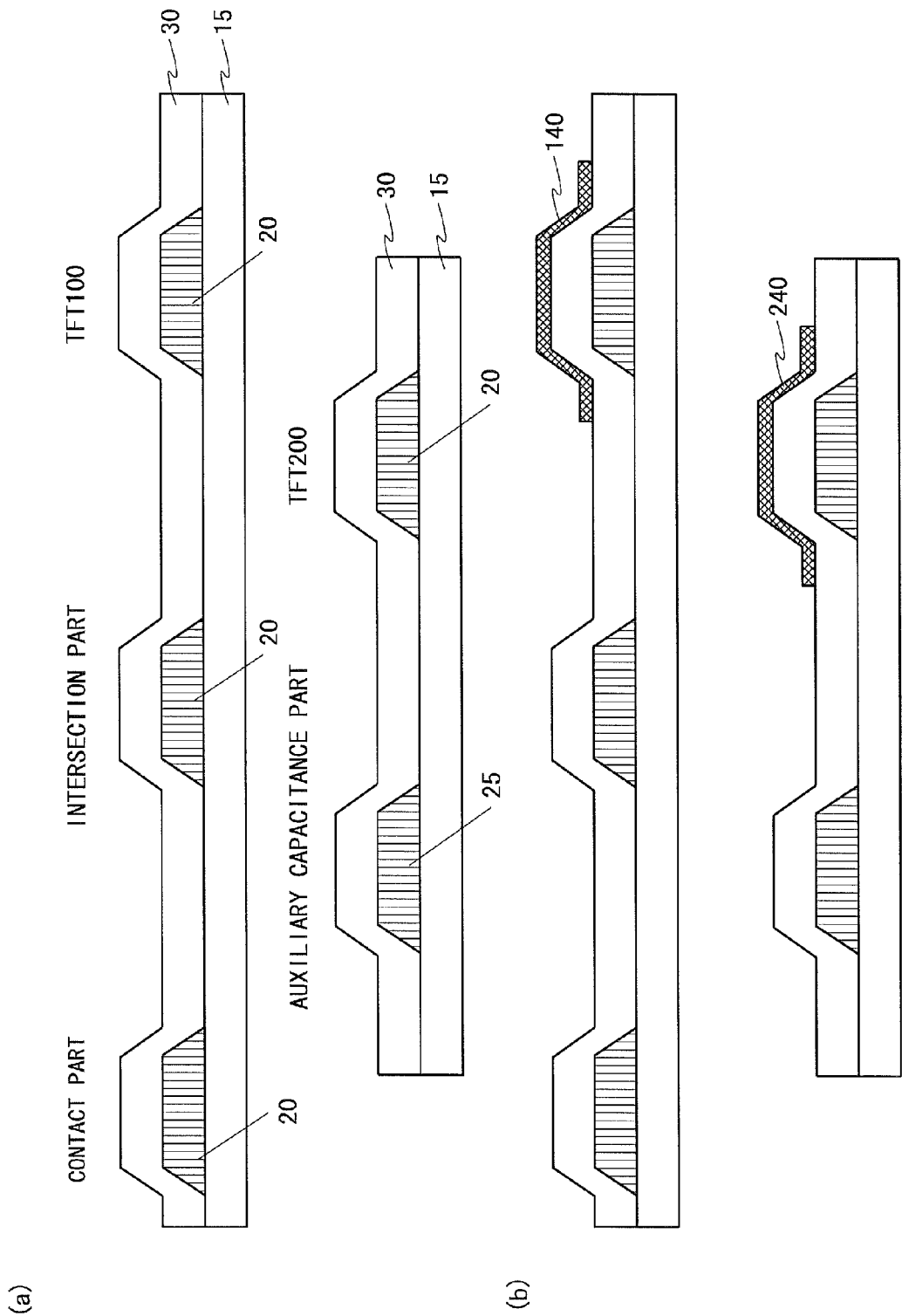
FIG. 10 is a process cross-sectional view showing each manufacturing process of the liquid crystal display device including the TFT shown in FIG. 1, the TFT shown in FIG. 3, the auxiliary capacitance part, the intersection part, and the contact part.
Figure 11:
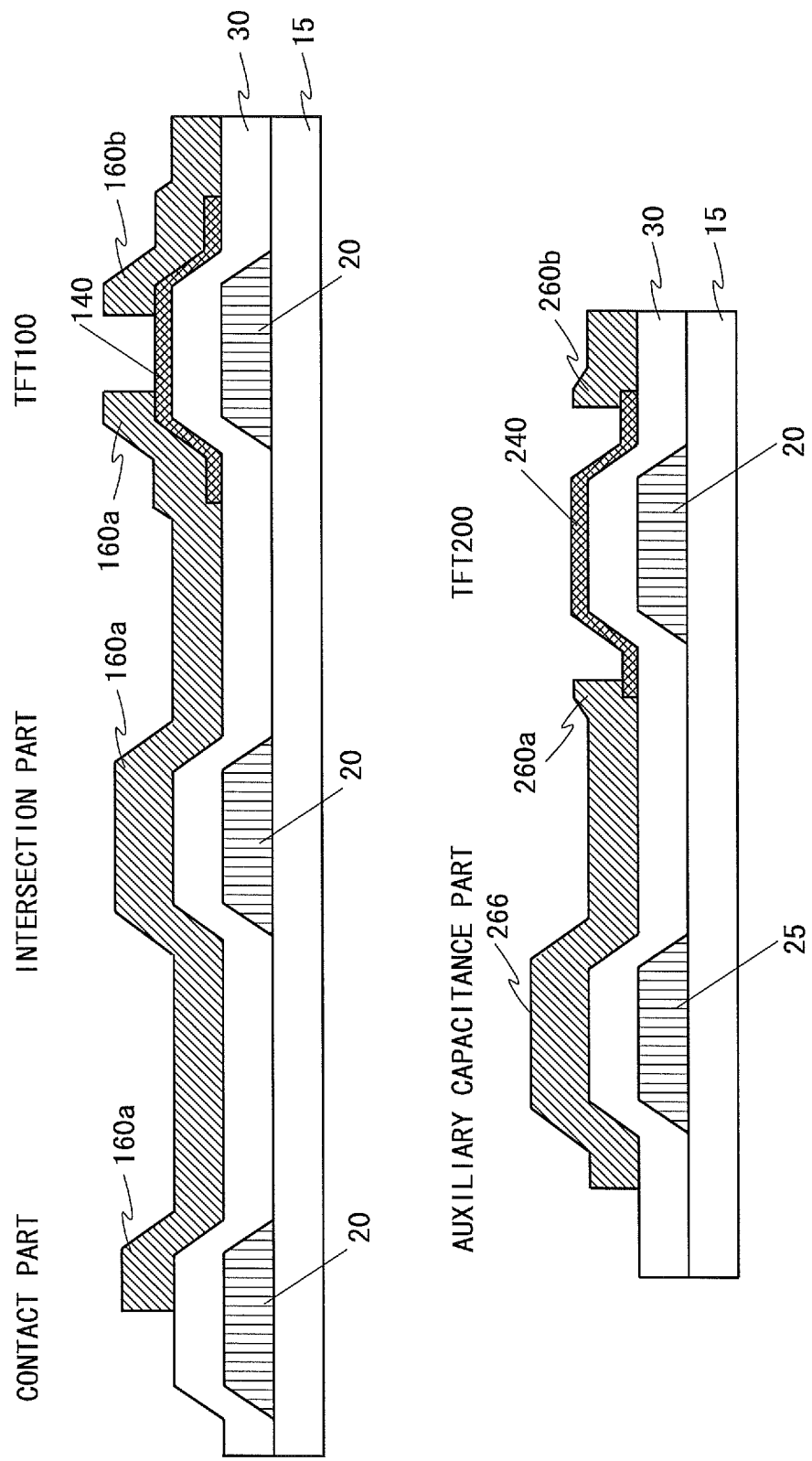
FIG. 11 is a process cross-sectional view showing each manufacturing process of the liquid crystal display device including the TFT shown in FIG. 1, the TFT shown in FIG. 3, the auxiliary capacitance part, the intersection part, and the contact part.
Figure 12:
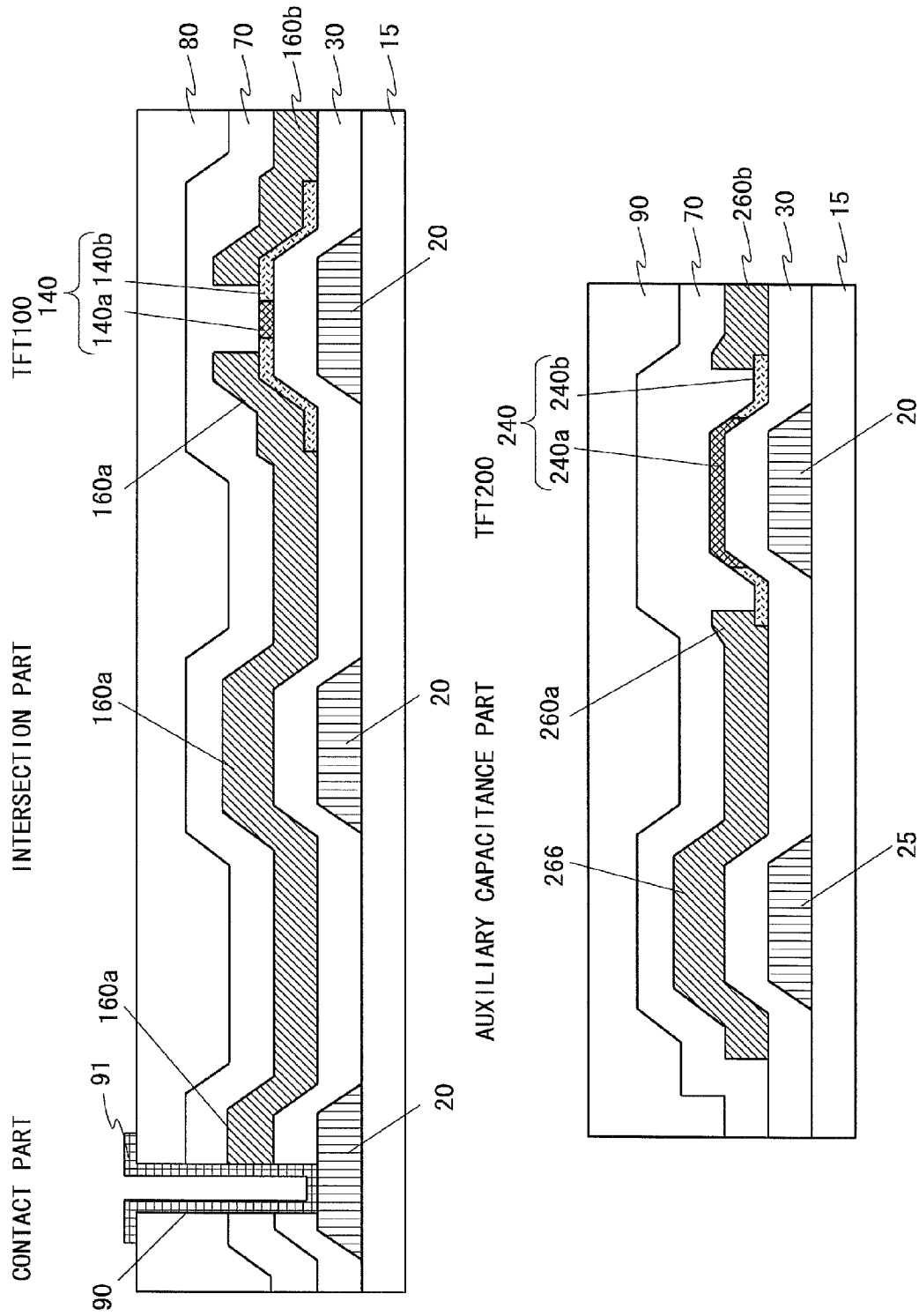
FIG. 12 is a process cross-sectional view showing each manufacturing process of the liquid crystal display device including the TFT shown in FIG. 1, the TFT shown in FIG. 3, the auxiliary capacitance part, the intersection part, and the contact part.

A manufacturing method for the liquid crystal display device including the TFT 100 shown in FIG. 1(*a*) and FIG. 1(*b*) and the TFT 200 shown in FIG. 3(*a*) and FIG. 3(*b*) is described. FIG. 10 to FIG. 12 are process cross-sectional views showing each manufacturing process of the liquid crystal display device including the TFT 100, the TFT 200, the auxiliary capacitance part, the intersection part between the gate electrode and the source electrode (hereinafter, referred to as the "intersection part"), and the contact part between the gate electrode and the source electrode (hereinafter, referred to as the "contact part").

On the insulating substrate 15, a laminated metal film is formed by continuously forming a titanium film (not shown), an aluminum film (not shown), and a titanium film (not shown) in this order, by using a sputtering method, for example. Next, on the surface of the laminated metal film, a resist pattern (not shown) is formed by using a photolithography method. By using the resist pattern as a mask, the laminated metal film is etched in order from the top by using a wet etching method. As a result, as shown in FIG. 10(*a*), the gate electrodes 20 of the TFT 100 and the TFT 200, and a lower electrode 25 of the auxiliary capacitance part are formed. The gate electrodes 20 are also formed in the intersection part and the contact part, respectively.

Next, the gate insulating film 30 is formed, by continuously forming a silicon nitride film (not shown) and a silicon oxide film (not shown), by using a plasma chemical vapor deposition method (hereinafter, referred to as a "plasma CVD method"), to cover the whole surface of the insulating substrate 15 including the gate electrodes 20. Accordingly, the gate electrodes 20 of the TFT 100 and the TFT 200, the lower electrode 25 of the auxiliary capacitance part, and the gate electrodes 20 of the intersection part and the contact part are covered by the gate insulating film 30.

An IGZO film (not shown) that contains indium, gallium, zinc, and oxygen is formed on the surface of the gate insulating film 30 by using a DC sputtering method. The IGZO film is formed by the DC (Direct Current) sputtering method, by using a target obtained by mixing in equivalent moles, indium oxide ($In_2O_3$), gallium oxide ($Ga_2O_3$), and zinc oxide (ZnO) and by sintering the mixture. A film thickness of the IGZO film is 20 nm to 200 nm.

Next, a resist pattern (not shown) is formed on the surface of the IGZO film, and the IGZO film is etched by a dry etching method by using the resist pattern as a mask. Accordingly, as shown in FIG. 10(*b*), the channel layers 140, 240 in an island shape are formed to cover the gate electrodes 20 of the TFTs 100, 200.

A source metal film (not shown) is formed to cover the whole surface of the insulating substrate 15 including the channel layers 140, 240. The source metal film includes a laminated metal film obtained by continuously forming a titanium film (not shown), an aluminum film (not shown), and a titanium film (not shown), by using a sputtering method.

Next, a resist pattern (not shown) is formed to sandwich each gate electrode in the planar view, by using the photolithography method. The source metal film is etched by a wet etching method, by using the resist pattern as a mask.

As a result, as shown in FIG. 11, in the TFT 100, there are formed the source electrode 160*a* that is overlapped with the left upper surface of the gate electrode 20 and is further extended onto the left-side gate insulating film 30 in the planar view, and the drain electrode 160*b* that is overlapped with the right upper surface of the gate electrode 20 and is further extended onto the right-side gate insulating film 30 in the planar view. In the TFT 200, there are formed the source electrode 260*a* that covers one end of the channel layer 240 so as not to be overlapped with the gate electrode 20 and is further extended onto the left-side gate insulating film 30 in the planar view, and the drain electrode 260*b* that covers the other end of the channel layer 240 so as not to be overlapped with the gate electrode 20 and is further extended onto the right-side gate insulating film 30 in the planar view.

In the auxiliary capacitance part, an upper electrode 266 is formed to cover the lower electrode 25 with the gate insulating film 30 interposed therebetween. In the intersection part, the source electrode 160*a* is formed to cover the gate electrode 20 with the gate insulating film 30 interposed therebetween. In the contact part, the source electrode 160*a* is formed to cover only a half of the gate electrode 20 with the gate insulating film 30 interposed therebetween.

As shown in FIG. 12, the passivation film 70 is formed by using the plasma CVD method to cover the whole surface of the insulating substrate 15 including the source electrodes 160*a*, 260*b* and the drain electrodes 160*b*, 260*b*. The passivation film 70 is preferably made of a silicon oxide film. Next, annealing is performed for 0.5 hour to two hours in an atmosphere at a temperature of 250° C. to 350° C. By the annealing, oxygen is desorbed from the IGZO layer that becomes the channel layers 140, 240, and lattice defects are formed in the IGZO layer. Accordingly, the low resistance regions 140*b* are formed to surround respectively the source electrode 160*a* and the drain electrode 160*b* in the channel layer 140. The high resistance region 140*a* remains in the center of the channel layer 140 sandwiched between the two low resistance regions 140*b* and at the end parts in the channel width direction. Similarly in the TFT 200, the low resistance regions 240*b* are formed to surround respectively the source electrode 260*a* and the drain electrode 260*b* in the channel layer 240. The high resistance region 240*a* remains in the center of the channel layer 240 sandwiched between the two low resistance regions 240*b* and at the end parts in the channel width direction. In this way, because the high resistance regions 140*a*, 240*a* are extended to the end parts in the channel width direction of the channel layers 140, 240, respectively, the off-current flowing through the end parts in the channel width direction reduces. Accordingly, the off-current of the TFTs 100, 200 can be reduced. The annealing may be performed in an atmosphere including oxygen, without being limited to the atmosphere.

By performing the annealing, oxygen is supplied from the passivation film 70 to the channel layers 140, 240, and the lattice defects in the IGZO layer are repaired by the supplied oxygen. Accordingly, the resistance value of the IGZO layer becomes high, and the shift of the threshold voltage when the gate voltage is applied is suppressed, and therefore, reliability of the TFTs 100, 200 becomes high.

The titanium films of the source electrodes 160*a*, 260*a* and the drain electrodes 160*b*, 260*b* that are in contact with the IGZO layer are oxidized, and a titanium oxide layer is formed on these surfaces. Accordingly, the contact resistance values between the source electrode 160*a* and the channel layer 140 and between the drain electrode 160*b* and the channel layer 140, and the contact resistance values between the source electrode 260*a* and the channel layer 240 and between the drain electrode 260*b* and the channel layer 240 become low. This is also applied to the manufacturing method for each TFT described later, and therefore, this description is omitted in the description of each TFT described later.

Next, a photosensitive resin film 80 is formed by falling in drops a photosensitive resin on the passivation film 70. The photosensitive resin film 80 on the contact part is exposed and developed, and a contact hole 90 reaching the gate electrode 20 is opened, by using the photolithography method. Accordingly, the surfaces of the gate electrode 20 and the source electrode 160*a* are exposed in the contact hole 90. Next, a transparent metal film (not shown) of ITO and the like is formed by using the sputtering method to cover the whole surface of the insulating substrate 15 including the inside of the contact hole 90. Next, a connection electrode 91 is left in the contact hole 90 by etching the transparent metal film. In the contact hole 90 of the contact part, the gate electrode 20 and the source electrode 160*a* are electrically connected to each other by the connection electrode 91. At the same time, a pixel electrode (not shown) is formed on the photosensitive resin film of the pixel part. Accordingly, the manufacturing process of the liquid crystal display device can be simplified. In this way, the liquid crystal display device including the TFT 100, the TFT 200, the auxiliary capacitance part, the intersection part, and the contact part are formed.

In the above description, although the gate electrode 20 and the source electrode 160*a* are electrically connected to each other in the contact part, the gate electrode 20 and the drain electrode 160*b* may be electrically connected to each other. At the intersection part, although the gate electrode 20 and the source electrode 160*a* cross, the gate electrode 20 and the drain electrode 160*b* may cross. This is also applied to the manufacturing method for each TFT described later, and therefore, this description is omitted in the description of each TFT described later.

<1.8 Effects>

According to the first embodiment, in the TFT 100, because the high resistance regions 140*a*, 240*a* are extended not only to the channel region sandwiched between the source electrode 160*a* and the drain electrode 160*b* and the channel region sandwiched between the source electrode 260*a* and the drain electrode 260*b*, respectively, but also to the end parts in the channel width direction of the channel layer 140 and the end parts in the channel width direction of the channel layer 240, respectively, the off-current flowing through the end parts in the channel width directions reduces. Similarly in the TFT 200, the off-current flowing through the end parts in the channel width directions reduces. Accordingly, the off-current of the TFTs 100, 200 can be reduced.

In the TFT 200, because the source electrode 260*a* and the drain electrode 260*b* are not overlapped with the gate electrode 20 in the planar view, a parasitic capacitance formed by the source electrode 260*a* and the gate electrode 20 and a parasitic capacitance formed by the drain electrode 260*b* and the gate electrode 20 can be made small. Accordingly, the operation speed of the TFT 200 can be made fast.

When the off-current of one TFT is larger than a predetermined value, the off-current can be set to the predetermined value or less, by connecting a plurality of TFTs in parallel, each TFT having a channel length and a channel width of which an off-current becomes smaller than the predetermined value.

By performing annealing after forming the passivation film 70, oxygen is supplied from the passivation film 70 to the channel layers 140, 240, and the lattice defects in the IGZO layer are repaired by the supplied oxygen. Accordingly, the resistance value of the IGZO layer becomes high, and the shift of the threshold voltage due to the gate voltage stress is suppressed, and therefore, reliability of the TFTs 100, 200 becomes high.

2. Second Embodiment

A liquid crystal display device according to a second embodiment of the present invention is described. The liquid crystal display device according to the present embodiment includes two kinds of TFTs. First, a configuration of each TFT is described.

<2.1 Configuration of Third TFT>

FIG. 13(*a*) is a plan view showing a configuration of a third bottom gate type TFT 300 included in the liquid crystal display device according to the present embodiment, and FIG. 13(*b*) is a cross-sectional view of the third bottom gate type TFT 300 taken along section line C-C shown in FIG. 13(*a*). The third bottom gate type TFT 300 shown in FIG. 13(*a*) and FIG. 13(*b*) is also referred to as a TFT with an etch stopper structure. A configuration of the third bottom gate type TFT 300 is described with reference to FIG. 13(*a*) and FIG. 13(*b*). In the following description, the third bottom gate type TFT 300 is referred to as the TFT 300. Out of components of the TFT 300, the components having the configurations and arrangements as those of the components of the TFT 100 shown in FIG. 1(*a*) and FIG. 1(*b*) are designated by the same or corresponding reference characters, and their descriptions are omitted.

Configurations and arrangements of the gate electrode 20, the gate insulating film 30, and a channel layer 340 formed on the insulating substrate 15 are the same as the configurations and the arrangements of the gate electrode 20, the gate insulating film 30, and the channel layer 140 of the TFT 100 shown in FIG. 1(*a*) and FIG. 1(*b*), and therefore, their descriptions are omitted. Low resistance regions 340*b* and a high resistance region 340*a* that are formed in the channel layer 340 are described later.

An etching stopper layer 350 having a film thickness of 50 nm to 400 nm is formed to cover the channel layer 340, and the gate electrode 20 and the gate insulating film 30 that are not covered by the channel layer 340. In the etching stopper layer 350, contact holes 355 are opened respectively at positions the contact holes 355 are overlapped with the left upper surface and the right upper surface of the gate electrode 20 in the planar view. The etching stopper layer 350 is preferably made of a silicon oxide film that can repair the lattice defects by supplying oxygen to the IGZO layer that becomes the channel layer 340 at the time of annealing.

On the upper surface of the etching stopper layer 350 sandwiched between the two contact holes 355, a source electrode 360a and a drain electrode 360b separated with a predetermined distance are arranged. The source electrode 360a is extended from the left upper surface of the etching stopper layer 350 sandwiched between the two contact holes 355 onto the left-side etching stopper layer 350 through the left-side contact hole 355, and is electrically connected to the low resistance region 340b of the channel layer 340 in the contact hole 355. The drain electrode 360b is extended from the right upper surface of the etching stopper layer 350 onto the right-side etching stopper layer 350 through the right-side contact hole 355, and is electrically connected to the low resistance region 340b of the channel layer 340 in the contact hole 355. In this way, the source electrode 360a and the drain electrode 360b are extended onto the etching stopper layer 350, unlike the source electrode 160a and the drain electrode 160b of the TFT 100 shown in FIG. 1(a) and FIG. 1(b). Although the source electrode 360a and the drain electrode 360b are also configured by laminated metal films, the configurations of the laminated metal films are the same as those of the source electrode 160a and the drain electrode 160b, and therefore, their descriptions are omitted.

Widths of the source electrode 360a and the drain electrode 360b are smaller than the channel width of the channel layer 340. In the channel layer 340, the low resistance regions 340b are formed to surround respectively the source electrode 360a and the drain electrode 360b. The channel layer 340 that is sandwiched between the two low resistance regions 340b remains as the high resistance region 340a. In this case, because the low resistance regions 340b extend to the inside of the end parts of the etching stopper layer 350, a length of the high resistance region 340a becomes smaller than the length of the etching stopper layer 350 by the extended portions of the low resistance regions 340b. The high resistance region 340a is extended not only to the channel region sandwiched between the source electrode 360a and the drain electrode 360b, but also to the end parts in the channel width direction.

Further, the passivation film 70 is formed to cover the whole surface of the insulating substrate 15 including the source electrode 360a and the drain electrode 360b. The passivation film 70 is the same as that of the TFT 100, and therefore, its description is omitted.

In the TFT 300, because the high resistance region 340a is extended to the end parts in the channel width direction of the channel layer 340, the off-current flowing through the end parts in the channel width direction reduces. Accordingly, the off-current of the TFT 300 can be reduced. The effect of reducing the off-current is present if any part of the high resistance region 340a at the end parts in the channel width direction is formed.

Further, the end part of the source electrode 360a is arranged to be overlapped with the left upper surface of the gate electrode 20 in the planar view, and the end part of the drain electrode 360b is arranged to be overlapped with the right upper surface of the gate electrode 20 in the planar view. Therefore, when a predetermined voltage is applied to the gate electrode 20, a high-concentration electron layer is formed in the low resistance regions 340b of the channel layer 340 by the electric field from the gate electrode 20. Based on the formation of the high-concentration electron layer, the source electrode 360a and the drain electrode 360b become in ohmic connection with the channel layer 340. The contact hole 355 may be opened such that at least a part thereof is overlapped with the gate electrode 20 in the planar view.

<2.2 Configuration of Fourth TFT>

FIG. 14(a) is a plan view showing a configuration of a fourth bottom gate type TFT 400 included in the liquid crystal display device according to the present embodiment, and FIG. 14(b) is a cross-sectional view of the fourth bottom gate type TFT 400 taken along section line D-D shown in FIG. 14(a). The fourth bottom gate type TFT 400 shown in FIG. 14(a) and FIG. 14(b) is also referred to as a TFT with an etch stopper structure. A configuration of the bottom gate type TFT 400 is described with reference to FIG. 14(a) and FIG. 14 (b). In the following description, the fourth bottom gate type TFT 400 is referred to as the TFT 400. Out of components of the TFT 400, the components having the same configurations and arrangements as those of the components of the TFT 100 shown in FIG. 1(a) and FIG. 1(b) are designated by the same or corresponding reference characters, and their descriptions are omitted.

Configurations and arrangements of the gate electrode 20, the gate insulating film 30, and a channel layer 440 formed on the insulating substrate 15 are the same as the configurations and the arrangements of the gate electrode 20, the gate insulating film 30, and the channel layer 140 of the TFT 100 shown in FIG. 1(a) and FIG. 1(b), and therefore, their descriptions are omitted. Low resistance regions 440b and a high resistance region 440a that are formed in the channel layer 440 are described later.

An etching stopper layer 450 having a film thickness of 50 nm to 400 nm is formed to cover the channel layer 440, and the gate electrode 20 and the gate insulating film 30 that are not covered by the channel layer 440. In the etching stopper layer 450, two contact holes 455 that reach one end and the other end respectively on the channel layer 440 are opened so as not to be overlapped with the gate electrode 20 in the planar view. The etching stopper layer 450 is preferably made of a silicon oxide film that can repair the lattice defects by supplying oxygen to the IGZO layer that becomes the channel layer 440 at the time of annealing.

A source electrode 460a and a drain electrode 460b that are separated to the left and right are arranged to sandwich the gate electrode 20 on the upper surface of the etching stopper layer 450 that is sandwiched between the two contact holes 455. The source electrode 460a is extended from the left upper surface of the etching stopper layer 450 sandwiched between the two contact holes 455 onto the left-side etching stopper layer 450 through the left-side contact hole 455, and is electrically connected to the low resistance region 440b of the channel layer 440 in the contact hole 455. The drain electrode 460b is extended from the right upper surface of the etching stopper layer 450 onto the right-side etching stopper layer 450 through the right-side contact hole 455, and is electrically connected to the low resistance region 440b of the channel layer 440 in the contact hole 455. In this way, the source electrode 460a and the drain electrode 460b are extended onto the etching stopper layer 450, unlike the source electrode 260a and the drain electrode 260b of the TFT 200 shown in FIG. 3(a) and FIG. 3(b). Although the source electrode 460a and the drain electrode 460b are also configured respectively by laminated metal films, the configurations of the laminated metal films are the same as those of the source electrode 160a and the drain electrode 160b of the TFT 100, and therefore, their descriptions are omitted.

Widths of the source electrode 460a and the drain electrode 460b are smaller than the channel width of the channel layer 440. In the channel layer 440, the low resistance regions 440b are formed to surround respectively the source electrode 460a and the drain electrode 460b. The channel layer 440 sandwiched between the two low resistance regions 440b remains as the high resistance region 440a. In this case, because the low resistance regions 440b extend to the inside of the end parts of the etching stopper layer 450, a length of the high resistance region 440a becomes smaller than the length of the etching stopper layer 450 by the extended portions of the low resistance regions 440b. The high resistance region 440a becomes longer than the high resistance region 340a of the TFT 300 by the increased distance between the source electrode 460a and the drain electrode 460b. The high resistance region 440a is extended not only to the channel region sandwiched between the source electrode 460a and the drain electrode 460b, but also to the end parts in the channel width direction.

Further, the passivation film 70 is formed to cover the whole surface of the insulating substrate 15 including the source electrode 460a and the drain electrode 460b. The passivation film 70 is the same as that of the TFT 100, and therefore, its description is omitted.

In the TFT 400, because the high resistance region 440a is extended to the end parts in the channel width direction of the channel layer 440, the off-current flowing through the end parts in the channel width direction reduces. Accordingly, the off-current of the TFT 400 can be reduced. The effect of reducing the off-current is present if any part of the high resistance region 440a at the end parts in the channel width direction is formed.

Unlike in the TFT 300, a distance between the source electrode 460a and the drain electrode 460b in the TFT 400 is larger than the length of the gate electrode 20. Accordingly, because each of the source electrode 460a and the drain electrode 460b is not overlapped with the gate electrode 20 in the planer view, the parasitic capacitance of the TFT 400 becomes small.

Further, unlike in the TFT 300, each of the source electrode 460a and the drain electrode 460b in the TFT 400 is not overlapped with the gate electrode 20 in the planer view. Therefore, in the TFT 400, a distance between the source electrode 460a and the gate electrode 20 and a distance between the drain electrode 460b and the gate electrode 20 are set small, like in the TFT 200. Accordingly, because the low resistance regions 440b of the channel layer 440 are extended to above the gate electrode 20, the TFT 400 normally operates without becoming in the offset state.

<2.3 Off-Current of TFT Used in Drive Circuit>

Figure 15:
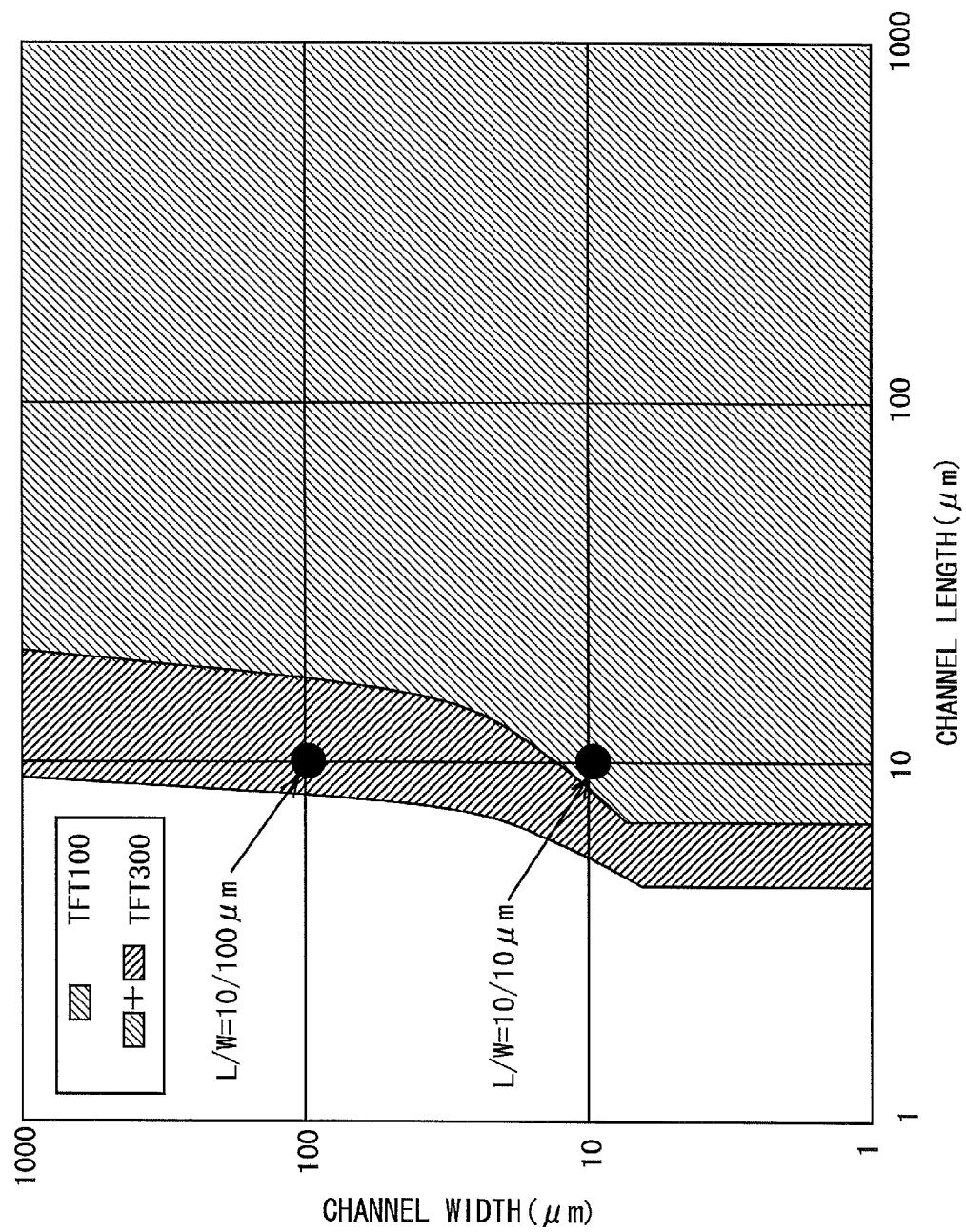
FIG. 15 is a graph showing a range of a channel length and a channel width that can be used as a TFT constituting a drive circuit of the liquid crystal display device according to the second embodiment.

FIG. 15 is a graph showing a range of a channel length and a channel width that can be used as a TFT constituting a drive circuit of the liquid crystal display device according to the present embodiment. In the same measurement condition as that of the TFT used in the drive circuit described in the first embodiment, a channel length and a channel width at which the off-current becomes 100 pA/μm or less are obtained by measuring the off-current of a plurality of TFTs having different channel lengths and channel widths.

As shown in FIG. 15, the range of the off-current that becomes 100 pA/μm or less in the TFT 100 shown in FIG. 1(*a*) and FIG. 1(*b*) is spread to a shorter channel side in the TFT 300. For example, in the TFT 100 having a channel length of 10 μm and a channel width of 100 μm, the off-current becomes larger than 100 pA/μm. However, in the TFT 300 having the same size as that of the TFT 100, the off-current is reduced to 100 pA/μm or less. From this, the off-current of 100 pA/μm or less can be achieved by only one TFT 300, without connecting ten TFTs 100 in parallel, each TFT 100 having a channel length of 10 μm and a channel width of 10 μm like in the first embodiment. In this way, the circuit area becomes small by using the TFT 300 in place of the circuit that has ten TFTs 100 connected in parallel, each TFT 100 having a channel length of 10 μm and a channel width of 10 μm. Therefore, the drive circuit configured by using the TFT 300 can be made small. Further, when the drive circuit can be made small, the liquid crystal panel can have a narrow frame.

<2.4 Manufacturing Method for Liquid Crystal Display Device>

Figure 16:
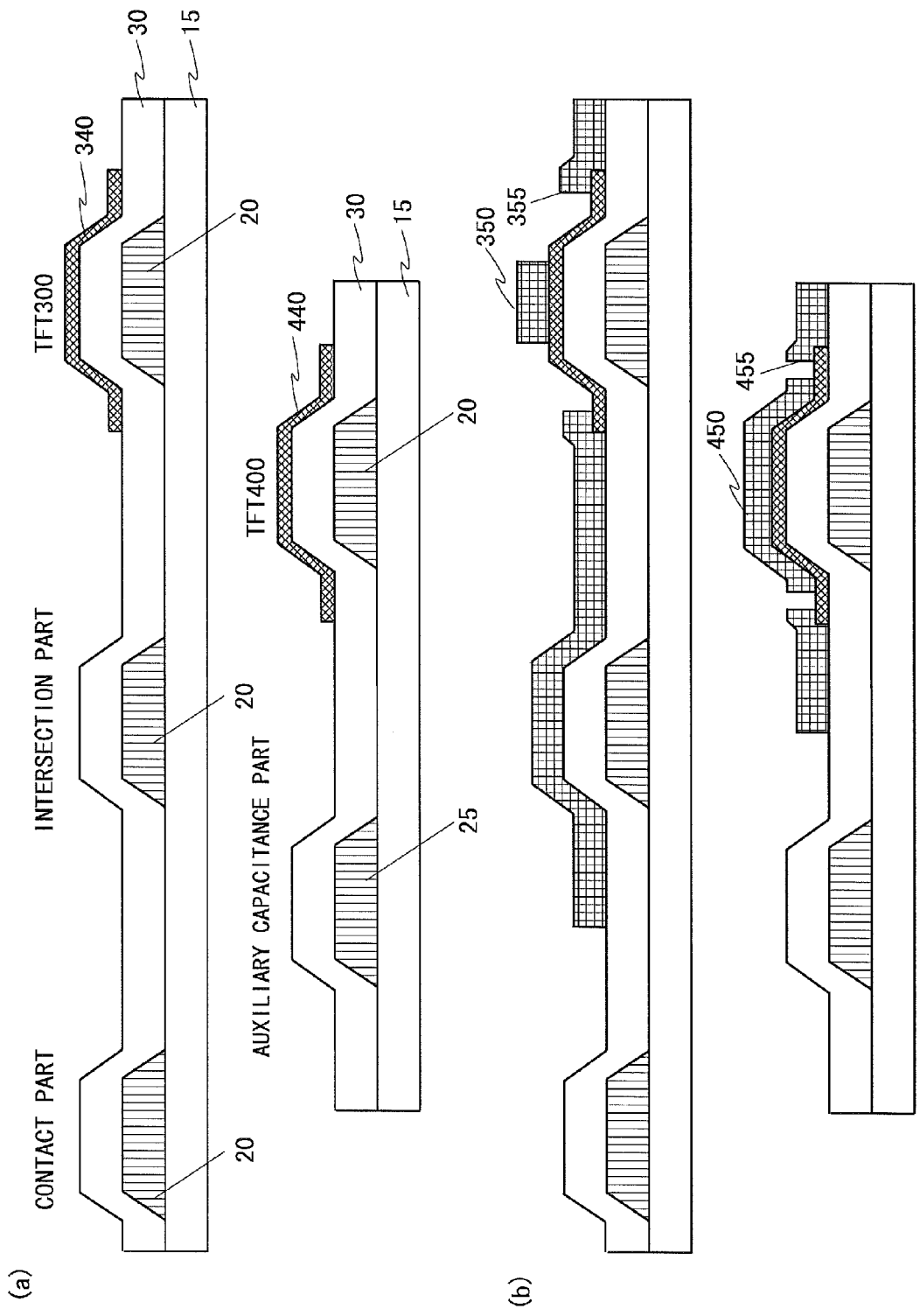
FIG. 16 is a process cross-sectional view showing each manufacturing process of the liquid crystal display device including the TFT shown in FIG. 13, the TFT shown in FIG. 14, the auxiliary capacitance part, the intersection part, and the contact part.
Figure 17:
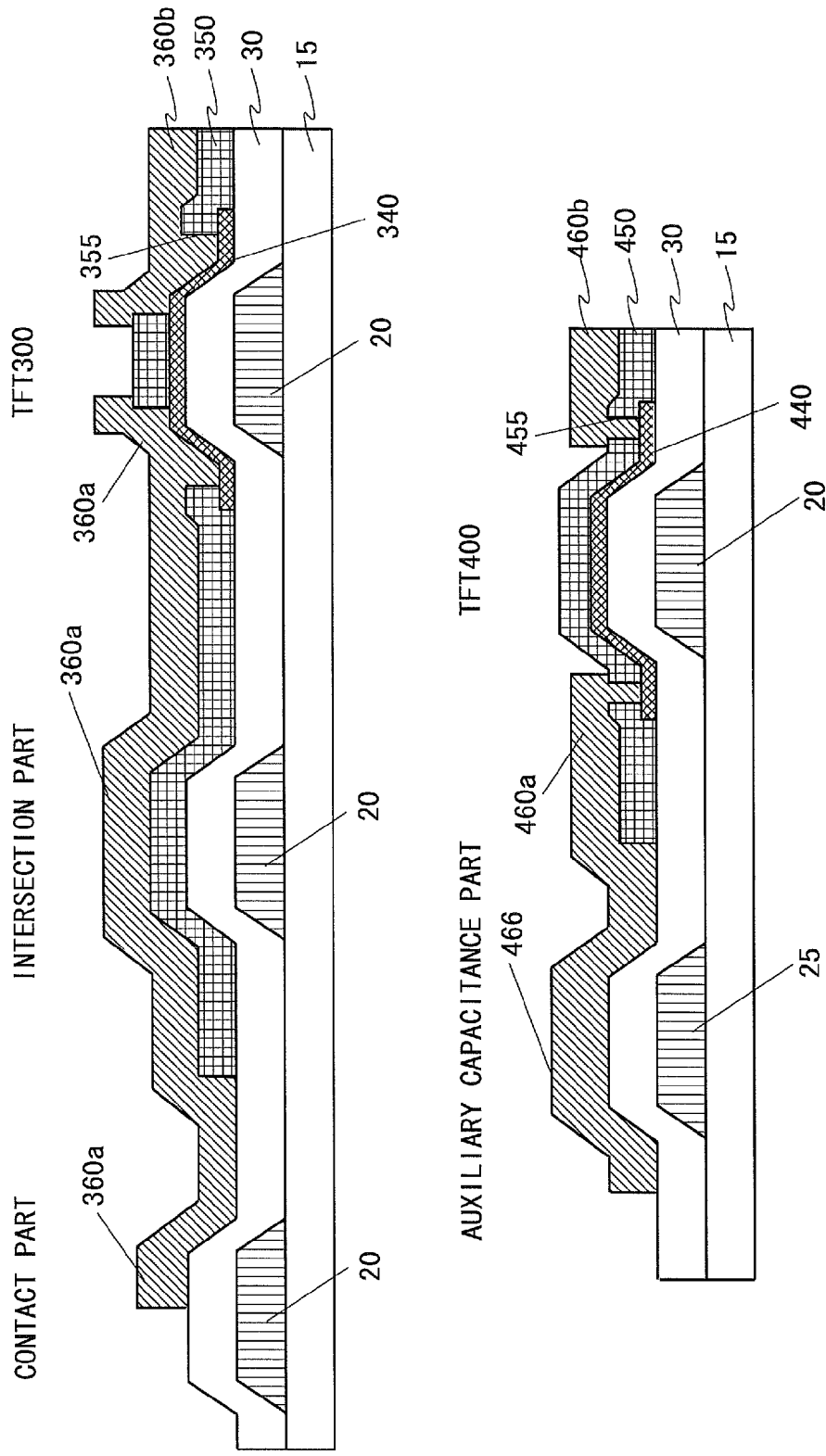
FIG. 17 is a process cross-sectional view showing each manufacturing process of the liquid crystal display device including the TFT shown in FIG. 13, the TFT shown in FIG. 14, the auxiliary capacitance part, the intersection part, and the contact part.
Figure 18:
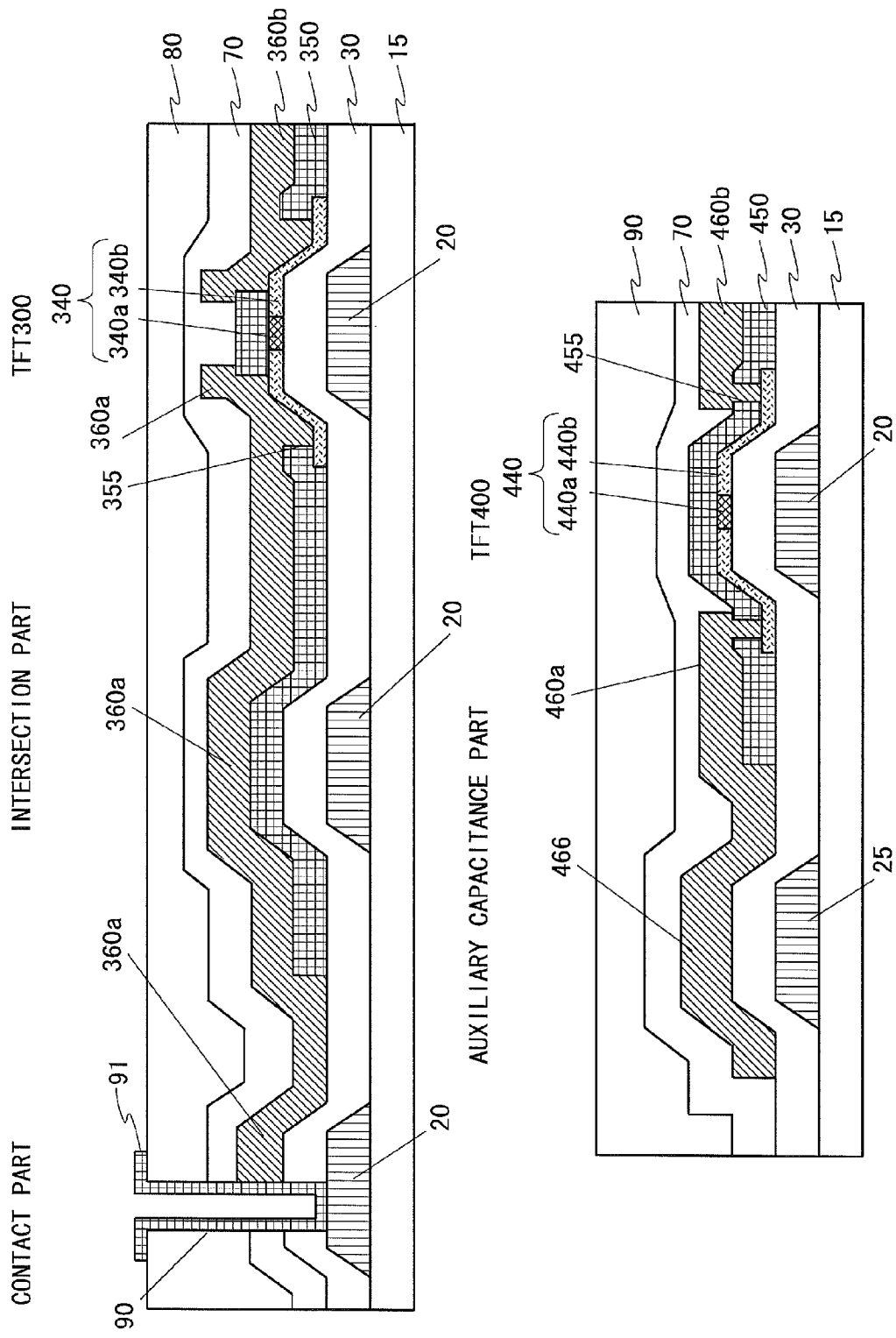
FIG. 18 is a process cross-sectional view showing each manufacturing process of the liquid crystal display device including the TFT shown in FIG. 13, the TFT shown in FIG. 14, the auxiliary capacitance part, the intersection part, and the contact part.

A manufacturing method for the liquid crystal display device including the TFT 300 shown in FIG. 13(*a*) and FIG. 13(*b*) and the TFT 400 shown in FIG. 14(*a*) and FIG. 14(*b*) is described. FIG. 16 to FIG. 18 are process cross-sectional views showing each manufacturing process of the liquid crystal display device including the TFT 300, the TFT 400, the auxiliary capacitance part, the intersection part, and the contact part.

The process of forming the gate electrode 20 and the lower electrode 25, the process of forming the gate insulating film 30, and the process of forming the channel layers 340, 440 on the gate insulating film 30 shown in FIG. 16(*a*) are the same as the process of forming the gate electrode 20 and the lower electrode 25, the process of forming the gate insulating film 30 shown in FIG. 10(*a*), and the process of forming the channel layers 140, 240 shown in FIG. 10(*b*), respectively. Therefore, their descriptions are omitted.

After forming the channel layers 340, 440, silicon oxide films (not shown) that become the etching stopper layers 350, 450 are formed by using the plasma CVD method to cover the whole surface of the insulating substrate 15 including the channel layers 340, 440. A film thickness of the oxide silicon film is 40 nm to 400 nm. Next, annealing is performed for 0.5 hour to two hours in an atmosphere at a temperature of 200° C. to 350° C. By the annealing, oxygen is supplied from the silicon oxide film to the IGZO layer constituting the channel layers 340, 440, and the lattice defects in the IGZO layer are repaired by the supplied oxygen. Accordingly, a resistance value of the IGZO layer becomes high, and the shift of the threshold voltage due to the gate voltage stress is suppressed. Therefore, reliability of the TFTs 300, 400 becomes high. Annealing after forming the silicon oxide film may be also performed in an atmosphere containing oxygen, not in the atmosphere. In the present embodiment, not only annealing is performed after forming the passivation film 70 to be described later, a silicon oxide film that becomes the etching stopper layers 350, 450 is formed after forming the channel layers 340, 440. Therefore, by performing the annealing also after forming the silicon oxide film, the lattice defects in the IGZO film can be repaired more completely.

By using a resist pattern (not shown) formed on the silicon oxide film as a mask, the silicon oxide film is etched by the dry etching method. Accordingly, as shown in FIG. 16(*b*), the contact hole 355 of the TFT 300 and the contact hole 455 of the TFT 400 are opened. The contact hole 355 of the TFT 300 is opened so as to reach the channel layer 340 on the left upper surface and the right upper surface of the gate electrode 20. The contact hole 455 of the TFT 400 is opened so as to reach the channel layer 440 at outer sides of the left and right side parts of the gate electrode 20.

When a silicon oxide film is etched, the silicon oxide film on the lower electrode 25 is removed in the auxiliary capacitance part. Accordingly, the insulating film sandwiched between the lower electrode 25 and an upper electrode 466 to be described later becomes only the gate insulating film 30, and therefore, the capacitance of the capacitor does not decrease. In the intersection part, the silicon oxide film is left on the gate insulating film 30. Accordingly, a film thickness of the insulating film sandwiched between the gate electrode 20 and the source electrode 360a to be described later becomes large, and the parasitic capacitance formed by the gate electrode 20 and the source electrode 360a becomes small. The silicon oxide film is also removed in the contact part. Accordingly, at the time of opening the contact hole 90 for connecting between the gate electrode 20 and the source electrode 360a to be described later, the etching time can be shortened.

A source metal film (not shown) is formed on the etching stopper layers 350, 450 including the contact holes 355, 455. The source metal film includes a laminated metal film obtained by continuously forming a titanium film, an aluminum film, and a titanium film by using the sputtering method. Next, a resist pattern (not shown) is formed so as to sandwich the gate electrode 20 in the planar view, by using the photolithography method. The source metal film is etched by a wet etching method, by using the resist pattern as a mask. Accordingly, as shown in FIG. 17, the source electrodes 360a, 460a and the drain electrodes 360b, 460b are formed.

At the time of forming the source electrodes 360a, 460a and the drain electrodes 360b, 460b, the surfaces of the channel layers 340, 440 have been covered respectively by the etching stopper layers 350, 450. Accordingly, even when the source metal film is etched by the wet etching method, the channel layers 340, 440 are not damaged. Further, in the case of etching the source metal film by the dry etching method in place of the wet etching method, because the surfaces of the channel layers 340, 440 are not directly exposed to plasma, the channel layers 340, 440 are not easily damaged by plasma. Therefore, in either case, the off-current of the TFTs 300, 400 can be reduced.

In the TFT 300, the source electrode 360a is extended from the left upper surface of the etching stopper layer 350 at the center onto the left-side etching stopper layer 350 and is also electrically connected to the channel layer 340 via the contact hole 355 to be overlapped with the left upper surface of the gate electrode 20 in the planar view. The drain electrode 360b is extended from the right upper surface of the etching stopper layer 350 at the center onto the right-side etching stopper layer 350 and is also electrically connected to the channel layer 340 via the contact hole 355 to be overlapped with the right upper surface of the gate electrode 20 in the planar view.

In the TFT 400, the source electrode 460a is extended from the left upper surface of the etching stopper layer 450 at the center onto the left-side etching stopper layer 450 and is also electrically connected to the channel layer 440 via the contact hole 455 not to be overlapped with the left upper surface of the gate electrode 20 in the planar view. The drain electrode 460b is extended from the right upper surface of the etching stopper layer 450 at the center onto the right-side etching stopper layer 450 and is also electrically connected to the channel layer 440 via the contact hole 455 not to be overlapped with the right upper surface of the gate electrode 20 in the planar view.

In the auxiliary capacitance part, the upper electrode 466 is formed to cover the lower electrode 25 with the gate insulating film 30 interposed therebetween. In the intersection part, the source electrode 360a is formed to cover the gate electrode 20 with the gate insulating film 30 and the etching stopper layer 350 interposed therebetween. In the contact part, the source electrode 360a is formed to cover only a half of the gate electrode 20 with the gate insulating film 30 interposed therebetween.

As shown in FIG. 18, the passivation film 70 made of a silicon oxide film is formed to cover the whole surface of the insulating substrate 15 including the source electrodes 360a, 460a and the drain electrodes 360b, 460b. The passivation film 70 is the same as that of the TFT 100, and therefore, its description is omitted by giving the same reference character.

Next, in an atmosphere at a temperature of 200° C. to 300° C., annealing is performed for 0.5 hour to two hours. In the present embodiment, the lattice defects in the IGZO film are repaired by performing the annealing after forming the silicon oxide film that becomes the etching stopper layers 350, 450. Therefore, the temperature of the annealing after forming the passivation film 70 is set lower than the temperature of the annealing in the first embodiment.

By performing the annealing, the low resistance regions 340b, 440b are formed to extend to the inside of the end parts of the etching stopper layers 350, 450. As a result, in the TFT 300, the high resistance region 340a remains at the center of the channel layer 340 sandwiched between the two low resistance regions 340b, and at the end parts in the channel width direction. In the TFT 400, the high resistance region 440a remains at the center of the channel layer 440 sandwiched between the two low resistance regions 440b, and at the end parts in the channel width direction. In this way, the high resistance regions 340a, 440a are extended not only to the channel region sandwiched between the source electrode 360a and the drain electrode 360b and the channel region sandwiched between the source electrode 460a and the drain electrode 460b, respectively, but also to the end parts in the channel width direction of the channel layer 340 and the end parts in the channel width direction of the channel layer 440, respectively. Accordingly, because the off-current flowing through the end parts in the channel width direction reduces, the off-current of the TFTs 300, 400 can be reduced.

By performing annealing, oxygen is supplied from the passivation film 70 to the IGZO layer constituting the channel layers 340, 440. Accordingly, a resistance value of the IGZO layer becomes high, and the shift of the threshold voltage due to the gate voltage stress is suppressed. Therefore, reliability of the TFTs 300, 400 becomes high. The annealing may be performed at the temperature of 250° C. to 350° C. like in the first embodiment. In this case, the lattice defects in the IGZO layer can be repaired more completely.

Next, a process in which, after the contact hole 90 is opened in the photosensitive resin film 80 formed on the passivation film 70, a transparent metal film (not shown) is formed, and the gate electrode 20 and the source electrode 360a are connected in the contact hole 90 is the same as that of the first embodiment. Therefore, the same reference characters are used to designate the same components as those shown in FIG. 12, and its description is omitted. In this way, the liquid crystal display device including the TFT 300, the TFT 400, the auxiliary capacitance part, the contact part, and the intersection part is formed.

<2.5 Effects>

According to the second embodiment, not only the same effects as those of the first embodiment are obtained, the following specific effects are also generated. Annealing is performed not only after forming the passivation film 70, but also after forming the silicon oxide film that becomes the etching stopper layers 350, 450. Therefore, oxygen is supplied from the silicon oxide film to the IGZO layer, and the lattice defects in the IGZO layer can be repaired more completely.

By separating the annealing into two stages, the annealing after forming the passivation film 70 can be performed at a lower temperature than that in the first embodiment. When the annealing temperature is lowered, a variation in the shrinkage of the insulating substrate 15 due to the annealing becomes small. Because an alignment margin can be made small by this, a design margin between the layers can be made small.

As a result, in the TFT 300, because the overlap between the source electrode 360a and the gate electrode 20 and the overlap between the drain electrode 360b and the gate electrode 20 become small, the parasitic capacitance can be made small. Further, in the TFT 400, because the overlap between the low resistance regions 440b of the channel layer 440 and the gate electrode 20 also becomes small for a similar reason, the parasitic capacitance can be made small. In the case of performing the annealing after forming the silicon oxide film that becomes the etching stopper layers 350, 450 and after forming the passivation film 70 like in the present embodiment, the annealing after forming the passivation film 70 is performed preferably at a lower temperature than that of the annealing after forming the silicon oxide film. However, the annealing after forming the passivation film 70 may be performed at the same temperature as that of the annealing after forming the silicon oxide film.

At the intersection part between the gate electrode 20 and the source electrode 360a, the parasitic capacitance of the intersection part can be made small, by using not only the gate insulating film 30 but also the etching stopper layer 350 as the insulating film sandwiched between the gate electrode 20 and the source electrode 360a. Accordingly, the signal voltage applied to the gate electrode 20 and the signal voltage applied to the source electrode 360a are not easily influenced together.

3. Third Embodiment

A liquid crystal display device according to a third embodiment of the present invention is described. The liquid crystal display device according to the present embodiment includes two kinds of TFTs. First, a configuration of each TFT is described.

<3.1 Configuration of Fifth TFT>

FIG. 19(a) is a plan view showing a configuration of a fifth bottom gate type TFT 500 included in the liquid crystal display device according to the present embodiment, and FIG. 19(b) is a cross-sectional view of the fifth bottom gate type TFT 500 taken along section line E-E shown in FIG. 19(a). The fifth bottom gate type TFT 500 shown in FIG. 19(a) and FIG. 19(b) are also referred to as a TFT with a bottom contact structure. A configuration of the fifth bottom gate type TFT 500 is described with reference to FIG. 19(a) and FIG. 19(b). In the following description, the fifth bottom gate type TFT 500 is referred to as the TFT 500. Out of components of the TFT 500, the components having the same configurations and arrangements as those of the components of the TFT 100 shown in FIG. 1(a) and FIG. 1(b) are designated by the same or corresponding reference characters, and their descriptions are omitted.

Configurations and arrangements of the gate electrode 20 and the gate insulating film 30 formed on the insulating substrate 15 are the same as the configurations and the arrangements of the gate electrode 20 and the gate insulating film 30 of the TFT 100 shown in FIG. 1(a) and FIG. 1(b), and therefore, their descriptions are omitted.

On the gate insulating film 30, there are arranged a source electrode 560a and a drain electrode 560b separated into left and right with a predetermined distance. The source electrode 560a is overlapped with the left upper surface of the gate electrode 20, and is further extended onto the left-side gate insulating film 30 in the planar view. The drain electrode 560b is overlapped with the right upper surface of the gate electrode 20, and is further extended onto the right-side gate insulating film 30 in the planar view. Kinds and film thicknesses of metal films included in the laminated metal film constituting the source electrode 560a and the drain electrode 560b are the same as those of the TFT 100, and therefore, their descriptions are omitted.

A channel layer 540 made of an IGZO layer is formed in a region on the gate insulating film 30 and sandwiched between the source electrode 560a and the drain electrode 560b. One end of the channel layer 540 is extended to the upper surface of the source electrode 560a, and the other end is extended to the upper surface of the drain electrode 560b, and these ends are respectively electrically connected to the upper surfaces of the source electrode 560a and the drain electrode 560b.

Widths of the source electrode 560a and the drain electrode 560b are smaller than the channel width of the channel layer 540. In the channel layer 540, the low resistance regions 540b are formed to surround respectively the source electrode 560a and the drain electrode 560b. The channel layer 540 sandwiched between the two low resistance regions 540b remains as the high resistance region 540a. In this case, the high resistance region 540a is extended not only to the channel region sandwiched between the source electrode 560a and the drain electrode 560b, but also to the end parts in the channel width direction.

Further, the passivation film 70 is formed to cover the whole surface of the insulating substrate 15 including the source electrode 560a, the drain electrode 560b, and the channel layer 540. The passivation film 70 is the same as that of the TFT 100, and therefore, its description is omitted.

In the TFT 500, because the high resistance region 540a is extended to the end parts in the channel width direction of the channel layer 540, the off-current flowing through the end parts in the channel width direction reduces. Accordingly, the off-current of the TFT 500 can be reduced. The effect of reducing the off-current is present if any part of the high resistance region 540a at the end parts in the channel width direction is formed.

Further, the end part of the source electrode 560a is arranged to be overlapped with the left upper surface of the gate electrode 20 in the planar view, and the end part of the drain electrode 560b is arranged to be overlapped with the right upper surface of the gate electrode 20 in the planar view. Therefore, when a predetermined voltage is applied to the gate electrode 20, a high-concentration electron layer is formed in the low resistance regions 540b of the channel layer 540 by the electric field from the gate electrode 20. Based on the formation of the high-concentration electron layer, the source electrode 560a and the drain electrode 560b become in ohmic connection with the channel layer 540.

<3.2 Configuration of Sixth TFT>

FIG. 20(a) is a plan view showing a configuration of a sixth bottom gate type TFT 600 included in the liquid crystal display device according to the present embodiment, and FIG. 20(b) is a cross-sectional view of the sixth bottom gate type TFT 600 taken along section line F-F shown in FIG. 20(a). The sixth bottom gate type TFT 600 shown in FIG. 20(a) and FIG. 20(b) are also referred to as a TFT with a bottom contact structure. A configuration of the sixth bottom gate type TFT 600 is described with reference to FIG. 20(a) and FIG. 20(b). In the following description, the sixth bottom gate type TFT 600 is referred to as the TFT 600. Out of components of the TFT 600, the components having the same configurations and arrangements as those of the components of the TFT 100 are designated by the same or corresponding reference characters, and their descriptions are omitted.

Configurations and arrangements of the gate electrode 20 and the gate insulating film 30 formed on the insulating substrate 15 are the same as the configurations and the arrangements of the gate electrode 20 and the gate insulating film 30 of the TFT 100 shown in FIG. 1(*a*) and FIG. 1(*b*), and therefore, their descriptions are omitted.

On the gate insulating film 30, there are arranged a source electrode 660*a* and a drain electrode 660*b* separated into left and right with a predetermined distance. Unlike in the TFT 500, the source electrode 660*a* is extended from the outside of the left side part of the gate electrode 20 onto the further left-side gate insulating film 30 in the planar view. The drain electrode 660*b* is extended from the outside of the right side part of the gate electrode 20 onto the further right-side gate insulating film 30 in the planar view. In this way, the source electrode 660*a* and the drain electrode 660*b* are formed so as not to be overlapped with the gate electrode 20 in the planar view. Kinds and film thicknesses of metal films included in the laminated metal film constituting the source electrode 660*a* and the drain electrode 660*b* are the same as those of the TFT 100, and therefore, their descriptions are omitted.

A channel layer 640 made of an IGZO layer is formed in a region on the gate insulating film 30 and sandwiched between the source electrode 660*a* and the drain electrode 660*b*. One end of the channel layer 640 is extended to the upper surface of the source electrode 660*a*, and the other end is extended to the upper surface of the drain electrode 660*b*, and these ends are respectively electrically connected to the upper surfaces of the source electrode 660*a* and the drain electrode 660*b*.

Widths of the source electrode 660*a* and the drain electrode 660*b* are smaller than the channel width of the channel layer 640. In the channel layer 640, the low resistance regions 640*b* are formed to surround respectively the source electrode 660*a* and the drain electrode 660*b*. The channel layer 640 sandwiched between the two low resistance regions 640*b* remains as the high resistance region 640*a*. In this case, the high resistance region 640*a* becomes longer than the high resistance region 540*a* of the TFT 500 by the increased distance between the source electrode 660*a* and the drain electrode 660*b*. The high resistance region 640*a* is extended not only to the channel region sandwiched between the source electrode 660*a* and the drain electrode 660*b*, but also to the end parts in the channel width direction.

Further, the passivation film 70 is formed to cover the whole surface of the insulating substrate 15 including the source electrode 660*a*, the drain electrode 660*b*, and the channel layer 640. The passivation film 70 is the same as that of the TFT 100, and therefore, its description is omitted.

In the TFT 600, because the high resistance region 640*a* is extended to the end parts in the channel width direction of the channel layer 640, the off-current flowing through the end parts in the channel width direction reduces. Accordingly, the off-current of the TFT 600 can be reduced. The effect of reducing the off-current is present if any part of the high resistance region 640*a* at the end parts in the channel width direction is formed.

Unlike in the TFT 500, a distance between the source electrode 660*a* and the drain electrode 660*b* in the TFT 600 is larger than the length of the gate electrode 20. Accordingly, because each of the source electrode 660*a* and the drain electrode 660*b* is not overlapped with the gate electrode 20 in the planer view, the parasitic capacitance of the TFT 600 becomes small.

Further, unlike in the TFT 500, each of the source electrode 660*a* and the drain electrode 660*b* in the TFT 600 is not overlapped with the gate electrode 20 in the planer view. Therefore, in the TFT 600, a distance between the source electrode 660*a* and the gate electrode 20 and a distance between the drain electrode 660*b* and the gate electrode 20 are set small, like in the TFT 200. Accordingly, because the low resistance regions 640*b* of the channel layer 640 are extended to above the gate electrode 20, the TFT 600 normally operates without becoming in the offset state.

<3.3 Manufacturing Method for Liquid Crystal Display Device>

Figure 21:
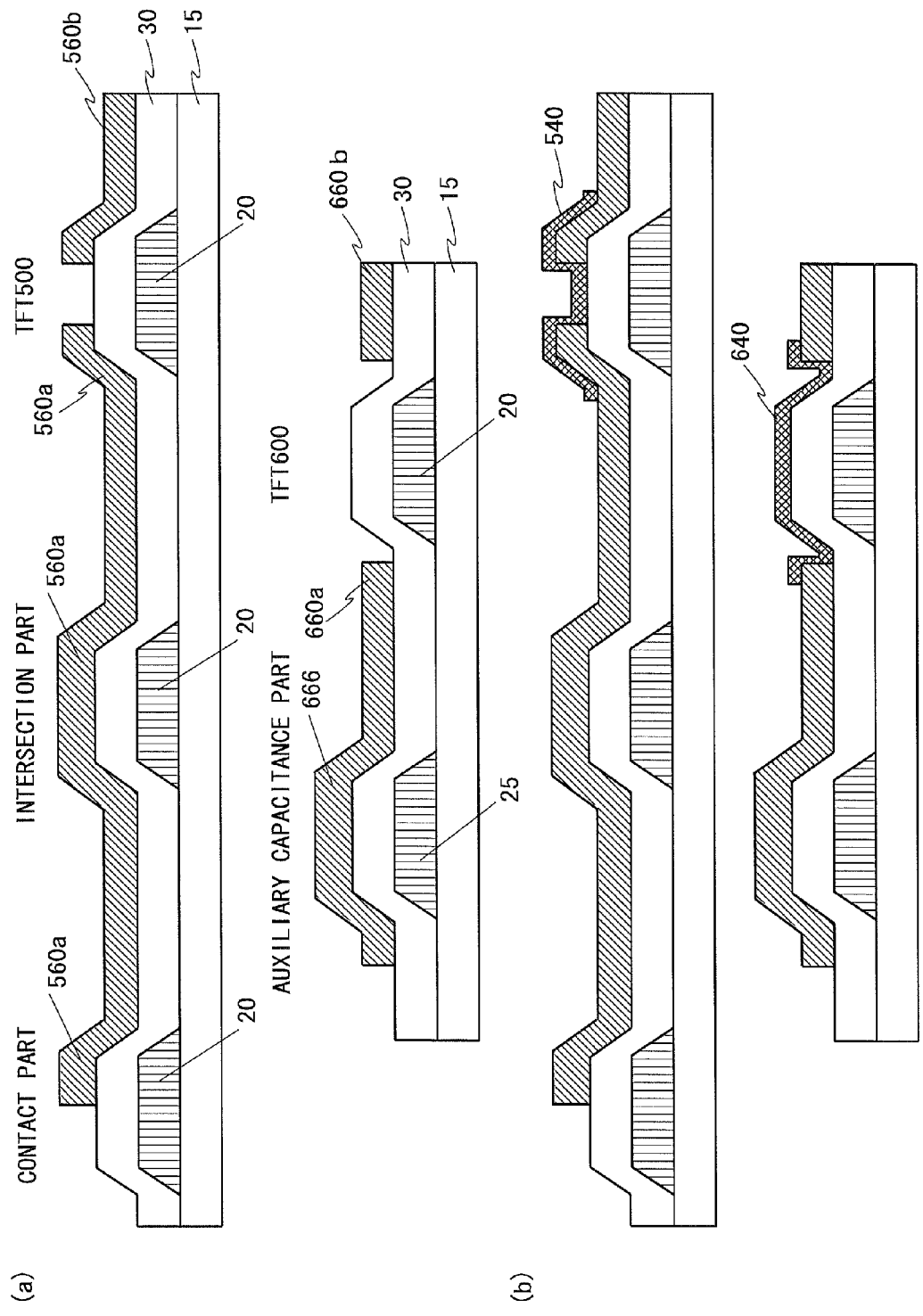
FIG. 21 is a process cross-sectional view showing each manufacturing process of the liquid crystal display device including the TFT shown in FIG. 19, the TFT shown in FIG. 20, the auxiliary capacitance part, the intersection part, and the contact part.
Figure 22:
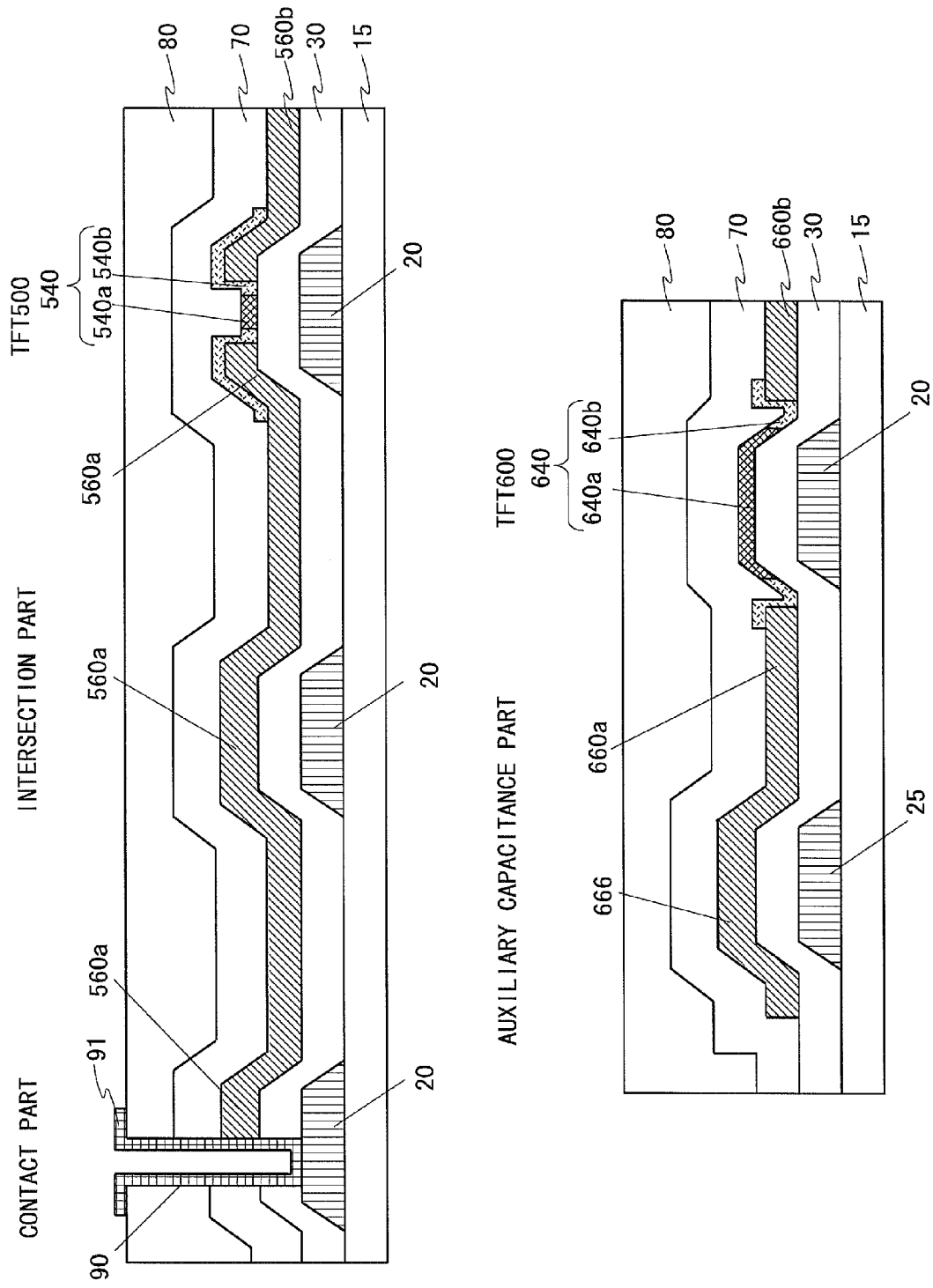
FIG. 22 is a process cross-sectional view showing each manufacturing process of the liquid crystal display device including the TFT shown in FIG. 19, the TFT shown in FIG. 20, the auxiliary capacitance part, the intersection part, and the contact part.

A manufacturing method for the liquid crystal display device including the TFT 500 shown in FIG. 19(*a*) and FIG. 19(*b*) and the TFT 600 shown in FIG. 20(*a*) and FIG. 20(*b*) is described. FIG. 21 and FIG. 22 are process cross-sectional views showing each manufacturing process of the liquid crystal display device including the TFT 500, the TFT 600, the auxiliary capacitance part, the intersection part, and the contact part.

As shown in FIG. 21(*a*), the process of forming the gate electrode 20 and the lower electrode 25 and the process of forming the gate insulating film 30 are the same as the process of forming the gate electrode 20 and the lower electrode 25, and the process of forming the gate insulating film 30 shown in FIG. 10(*a*), respectively, and therefore, their descriptions are omitted.

A source metal film (not shown) is formed on the gate insulating film 30. The source metal film includes a laminated metal film obtained by continuously forming a titanium film, an aluminum film, and a titanium film by using the sputtering method.

Next, a resist pattern (not shown) is formed to sandwich the gate electrode 20 in the planar view, by using the photolithography method. The source metal film is etched by a wet etching method, by using the resist pattern as a mask.

As a result, as shown in FIG. 21(*a*), in the TFT 500, there are formed the source electrode 560*a* that is overlapped with the left upper surface of the gate electrode 20 and is further extended onto the left-side gate insulating film 30 in the planar view, and the drain electrode 560*b* that is overlapped with the right upper surface of the gate electrode 20 and is further extended onto the right-side gate insulating film 30 in the planar view. In the TFT 600, there are formed the source electrode 660*a* that is extended from the outside at the left side part of the gate electrode 20 onto the further left-side gate insulating film 30 in the planar view, and the drain electrode 660*b* that is extended from the outside at the right side part of the gate electrode 20 onto the further right-side gate insulating film 30 in the planar view.

In the auxiliary capacitance part, an upper electrode 666 is formed to cover the lower electrode 25 with the gate insulating film 30 interposed therebetween. In the intersection part, the source electrode 560*a* is formed to cover the gate electrode 20 with the gate insulating film 30 interposed therebetween. In the contact part, the source electrode 560*a* is formed to cover only a half of the gate electrode 20 with the gate insulating film 30 interposed therebetween.

As shown in FIG. 21(*b*), an IGZO film (not shown) containing indium, gallium, zinc, and oxide is formed by using a DC (Direct Current) sputtering method, to cover the whole surface of the insulating substrate 15 including the source electrodes 560*a*, 660*a* and the drain electrodes 560*b*, 660*b*. A film thickness of the formed IGZO film is 20 nm to 200 nm.

Next, a resist pattern (not shown) is formed on the surface of the IGZO film, and the IGZO film is etched by a dry etching method by using the resist pattern as a mask. Accordingly, as shown in FIG. 21(*b*), in the TFT 500, the channel layer 540 made of an IGZO layer is formed in a region on the gate insulating film 30 and sandwiched between the source electrode 560*a* and the drain electrode 560*b*. One end of the channel layer 540 is extended to the upper surface of the source electrode 560*a*, and the other end is extended to the upper surface of the drain electrode 560*b*, and these ends are respectively electrically connected to the source electrode 560a and the drain electrode 560b. In the TFT 600, the channel layer 640 made of an IGZO layer is formed in a region on the gate insulating film 30 and sandwiched between the source electrode 660a and the drain electrode 660b. One end of the channel layer 640 is extended to the upper surface of the source electrode 660a, and the other end is extended to the upper surface of the drain electrode 660b, and these ends are respectively electrically connected to the source electrode 660a and the drain electrode 660b.

As shown in FIG. 22, the passivation film 70 is formed to cover the whole surface of the insulating substrate 15 by using the plasma CVD method. The process of forming the passivation film 70 is the same as that in the first embodiment, and therefore, its description is omitted. Next, in an atmosphere at a temperature of 250° C. to 350° C., annealing is performed for 0.5 hour to two hours. By performing the annealing, the low resistance regions 540b are formed in the channel layer 540 near the source electrode 560a and the drain electrode 560b of the TFT 500, and the low resistance regions 640b are formed in the channel layer 640 near the source electrode 660a and the drain electrode 660b of the TFT 600. As a result, in the TFT 500, the high resistance region 540a remains at the center of the channel layer 540 sandwiched between the two low resistance regions 540b, and at the end parts in the channel width direction. In the TFT 600, the high resistance region 640a remains at the center of the channel layer 640 sandwiched between the two low resistance regions 640b, and at the end parts in the channel width direction. In this way, the high resistance regions 540a, 640a are extended not only to the channel region sandwiched between the source electrode 560a and the drain electrode 560b and the channel region sandwiched between the source electrode 660a and the drain electrode 660b, respectively, but also to the end parts in the channel width direction of the channel layer 540 and the end parts in the channel width direction of the channel layer 640, respectively. Accordingly, because the off-current flowing through the end parts in the channel width direction reduces, the off-current of the TFTs 500, 600 can be reduced.

By performing annealing, oxygen is supplied from the passivation film 70 to the IGZO layer of the channel layers 540, 640. Accordingly, the resistance value of the IGZO layer becomes high, and the shift of the threshold voltage due to the gate voltage stress is suppressed, like in the first embodiment, and therefore, reliability of the TFTs 500, 600 becomes high.

As shown in FIG. 22, after the contact hole 90 is opened in the photosensitive resin film 80 formed on the passivation film 70, a transparent metal film (not shown) is formed, and the gate electrode 20 and the source electrode 560a are connected in the contact hole 90. These processes are the same as the processes of the first embodiment. Therefore, out of components shown in FIG. 22, the same components as those shown in FIG. 12 are designated by the same reference characters, and its description is omitted. In this way, the liquid crystal display device including the TFT 500, the TFT 600, the auxiliary capacitance part, the contact part, and the intersection part is formed.

<3.4 Effects>

The effects of the present embodiment are the same as the effects of the first embodiment, and therefore, their descriptions are omitted.

4. Fourth Embodiment

A liquid crystal display device according to a fourth embodiment of the present invention is described. The liquid crystal display device according to the present embodiment includes two kinds of TFTs. First, a configuration of each TFT is described.

<4.1 Configuration of Seventh TFT>

FIG. 23(a) is a plan view showing a configuration of a seventh bottom gate type TFT 700 included in the liquid crystal display device according to the present embodiment, and FIG. 23(b) is a cross-sectional view of the seventh bottom gate type TFT 700 taken along section line G-G shown in FIG. 23(a). The seventh bottom gate type TFT 700 shown in FIG. 23(a) and FIG. 23(b) is also referred to as a TFT with a bottom contact structure having an interlayer insulating layer. A configuration of the seventh bottom gate type TFT 700 is described with reference to FIG. 23(a) and FIG. 23(b). In the following description, the seventh bottom gate type TFT 700 is referred to as the TFT 700. Out of components of the TFT 700, the components having the same configurations and arrangements as those of the components of the TFT 100 shown in FIG. 1(a) and FIG. 1(b) are designated by the same or corresponding reference characters, and their descriptions are omitted.

Configurations and arrangements of the gate electrode 20 and the gate insulating film 30 formed on the insulating substrate 15 are the same as the configurations and the arrangements of the gate electrode 20 and the gate insulating film 30 of the TFT 100 shown in FIG. 1(a) and FIG. 1(b), and therefore, their descriptions are omitted.

On the gate insulating film 30, there are arranged a source electrode 760a and a drain electrode 760b separated into left and right with a predetermined distance. The source electrode 760a is overlapped with the left upper surface of the gate electrode 20, and is further extended onto the left-side gate insulating film 30 in the planar view. The drain electrode 760b is overlapped with the right upper surface of the gate electrode 20, and is further extended onto the right-side gate insulating film 30 in the planar view. Kinds and film thicknesses of metal films included in the laminated metal film constituting the source electrode 760a and the drain electrode 760b are the same as those of the TFT 100, and therefore, their descriptions are omitted.

An interlayer insulating layer 750 having a film thickness of 50 nm to 400 nm is formed to cover above a channel layer 740 excluding a region sandwiched between the source electrode 760a and the drain electrode 760b, and above the gate electrode 20 not covered by the channel layer 740. The interlayer insulating layer 750 is preferably made of a silicon oxide film that can repair the lattice defects by supplying oxygen to the IGZO layer that becomes the channel layer 740 at the time of annealing.

In the interlayer insulating layer 750, two contact holes 755 are opened to reach the source electrode 760a and the drain electrode 760b, at positions where the respective contact holes are partially overlapped with the left upper surface and the right upper surface of the gate electrode 20 in the planar view.

The channel layer 740 is formed in a region on the gate insulating film 30 and sandwiched between the source electrode 760a and the drain electrode 760b. One end of the channel layer 740 is electrically connected to the source electrode 760a in the left-side contact hole 755, and is further extended to the upper surface of the interlayer insulating layer 750 at the left side of the contact hole 755. The other end of the channel layer 740 is electrically connected to the drain electrode 760b in the right-side contact hole 755, and is further extended to the upper surface of the interlayer insulating layer 750 at the right side of the contact hole 755.

In the channel layer 740 formed between the source electrode 760a and the drain electrode 760b, low resistance regions 740b are formed respectively near the respective ends of the source electrode 760a and the drain electrode 760b. A region sandwiched between the two low resistance regions 740b remains as the high resistance region 740a. In this case, widths of the source electrode 760a and the drain electrode 760b are smaller than the channel width of the channel layer 740, and therefore, the high resistance region 740a is extended not only to the channel region sandwiched between the source electrode 760a and the drain electrode 760b, but also to the ends in the channel width direction.

The passivation film 70 is formed to cover the whole surface of the insulating substrate 15 including the channel layer 740. The passivation film 70 is the same as that of the TFT 100, and therefore, its description is omitted.

In the TFT 700, because the high resistance region 740a is extended to the end parts in the channel width direction of the channel layer 740, the off-current flowing through the end parts in the channel width direction reduces. Accordingly, the off-current of the TFT 700 can be reduced. The effect of reducing the off-current is present if any part of the high resistance region 740a at the end parts in the channel width direction is formed.

Further, the end part of the source electrode 760a is arranged to be overlapped with the left upper surface of the gate electrode 20 in the planar view, and the end part of the drain electrode 760b is arranged to be overlapped with the right upper surface of the gate electrode 20 in the planar view. Therefore, when a predetermined voltage is applied to the gate electrode 20, a high-concentration electron layer is formed in the low resistance regions 740b of the channel layer 740 by the electric field from the gate electrode 20. Based on the formation of the high-concentration electron layer, the source electrode 760a and the drain electrode 760b become in ohmic connection with the channel layer 740.

<4.2 Eighth TFT>

FIG. 24(a) is a plan view showing a configuration of an eighth bottom gate type TFT 800 included in the liquid crystal display device according to the present embodiment, and FIG. 24(b) is a cross-sectional view of the eighth bottom gate type TFT 800 taken along section line H-H shown in FIG. 24(a). The eighth bottom gate type TFT 800 shown in FIG. 24(a) and FIG. 24(b) are also referred to as a TFT with a bottom contact structure having an interlayer insulating layer. A configuration of the eighth bottom gate type TFT 800 is described with reference to FIG. 24(a) and FIG. 24(b). In the following description, the eighth bottom gate type TFT 800 is referred to as the TFT 800. Out of components of the TFT 800, the components having the same configurations and arrangements as those of the components of the TFT 100 are designated by the same or corresponding reference characters, and their descriptions are omitted.

Configurations and arrangements of the gate electrode 20 and the gate insulating film 30 formed on the insulating substrate 15 are the same as the configurations and the arrangements of the gate electrode 20 and the gate insulating film 30 of the TFT 100 shown in FIG. 1(a) and FIG. 1(b), and therefore, their descriptions are omitted On the gate insulating film 30, there are arranged a source electrode 860a and a drain electrode 860b separated into left and right with a predetermined distance. The source electrode 860a is extended from the outside of the left side part of the gate electrode 20 onto the further left-side gate insulating film 30 in the planar view. The drain electrode 860b is extended from the outside of the right side part of the gate electrode 20 onto the further right-side gate insulating film 30 in the planar view. In this way, the source electrode 860a and the drain electrode 860b are formed not to be overlapped with the gate electrode 20 in the planar view. Kinds and film thicknesses of metal films included in the laminated metal film constituting the source electrode 860a and the drain electrode 860b are the same as those of the TFT 100, and therefore, their descriptions are omitted.

An interlayer insulating layer 850 having a film thickness of 50 nm to 400 nm is formed to cover a region sandwiched between the source electrode 860a and the drain electrode 860b, and the source electrode 860a and the drain electrode 860b. In the interlayer insulating layer 850, contact holes 855 that reach the source electrode 860a and the drain electrode 860b are opened respectively at positions where the contact holes 855 are not overlapped with the gate electrode 20 in the planar view. The interlayer insulating layer 850 is preferably made of a silicon oxide film that can repair the lattice defects by supplying oxygen to the IGZO layer that becomes the channel layer 840 at the time of annealing.

The channel layer 840 is formed in the region on the interlayer insulating layer 850 sandwiched between the source electrode 860a and the drain electrode 860b. One end of the channel layer 840 is electrically connected to the source electrode 860a in the left-side contact hole 855, and is further extended onto the left-side interlayer insulating layer 850 through the contact hole 855. The other end of the channel layer 840 is electrically connected to the drain electrode 860b in the right-side contact hole 855, and is further extended onto the right-side interlayer insulating layer 850 through the contact hole 855.

Widths of the source electrode 860a and the drain electrode 860b are smaller than the channel width of the channel layer 840. In the channel layer 840, the low resistance regions 840b are formed to surround respectively the source electrode 860a and the drain electrode 860b. The channel layer 840 sandwiched between the two low resistance regions 840b remains as the high resistance region 840a. In this case, the high resistance region 840a becomes longer than the high resistance region 740a of the TFT 700 by the increased distance between the source electrode 860a and the drain electrode 860b. The high resistance region 840a is extended not only to the channel region sandwiched between the source electrode 860a and the drain electrode 860b, but also to the end parts in the channel width direction.

Further, the passivation film 70 is formed to cover the whole surface of the insulating substrate 15 including the source electrode 860a, the drain electrode 860b, and the channel layer. The passivation film 70 is the same as that of the TFT 100, and therefore, its description is omitted.

In the TFT 800, because the high resistance region 840a is extended to the end parts in the channel width direction of the channel layer 840, the off-current flowing through the end parts in the channel width direction reduces. Accordingly, the off-current of the TFT 800 can be reduced. The effect of reducing the off-current is present if any part of the high resistance region 840a at the end parts in the channel width direction is formed.

In the TFT 800, unlike in the TFT 700, a distance between the source electrode 860a and the drain electrode 860b is larger than the length of the gate electrode 20. Accordingly, because each of the source electrode 860a and the drain electrode 860b is not overlapped with the gate electrode 20 in the planer view, the parasitic capacitance of the TFT 800 becomes small.

Further, unlike in the TFT 700, each of the source electrode 860a and the drain electrode 860b in the TFT 800 is not overlapped with the gate electrode 20 in the planer view.

Therefore, in the TFT 800, like in the TFT 200, a distance between the source electrode 860a and the gate electrode 20 and a distance between the drain electrode 860b and the gate electrode 20 are made small. Accordingly, because the low resistance regions 840b of the channel layer 840 are extended to above the gate electrode 20, the TFT 800 normally operates without becoming in the offset state.

<4.3 Manufacturing Method for Liquid Crystal Display Device>

Figure 25:
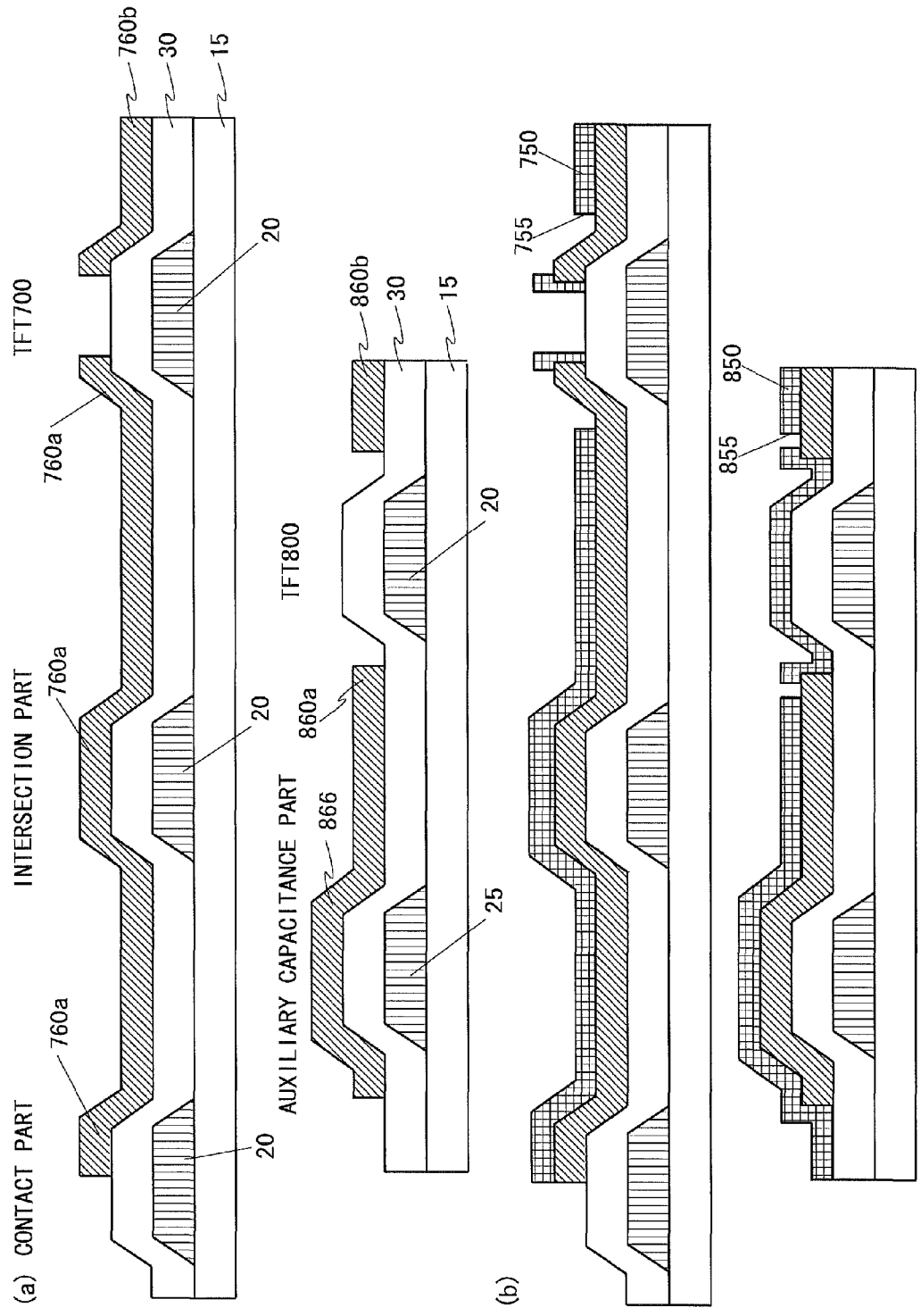
FIG. 25 is a process cross-sectional view showing each manufacturing process of the liquid crystal display device including the TFT shown in FIG. 23, the TFT shown in FIG. 24, the auxiliary capacitance part, the intersection part, and the contact part.
Figure 26:
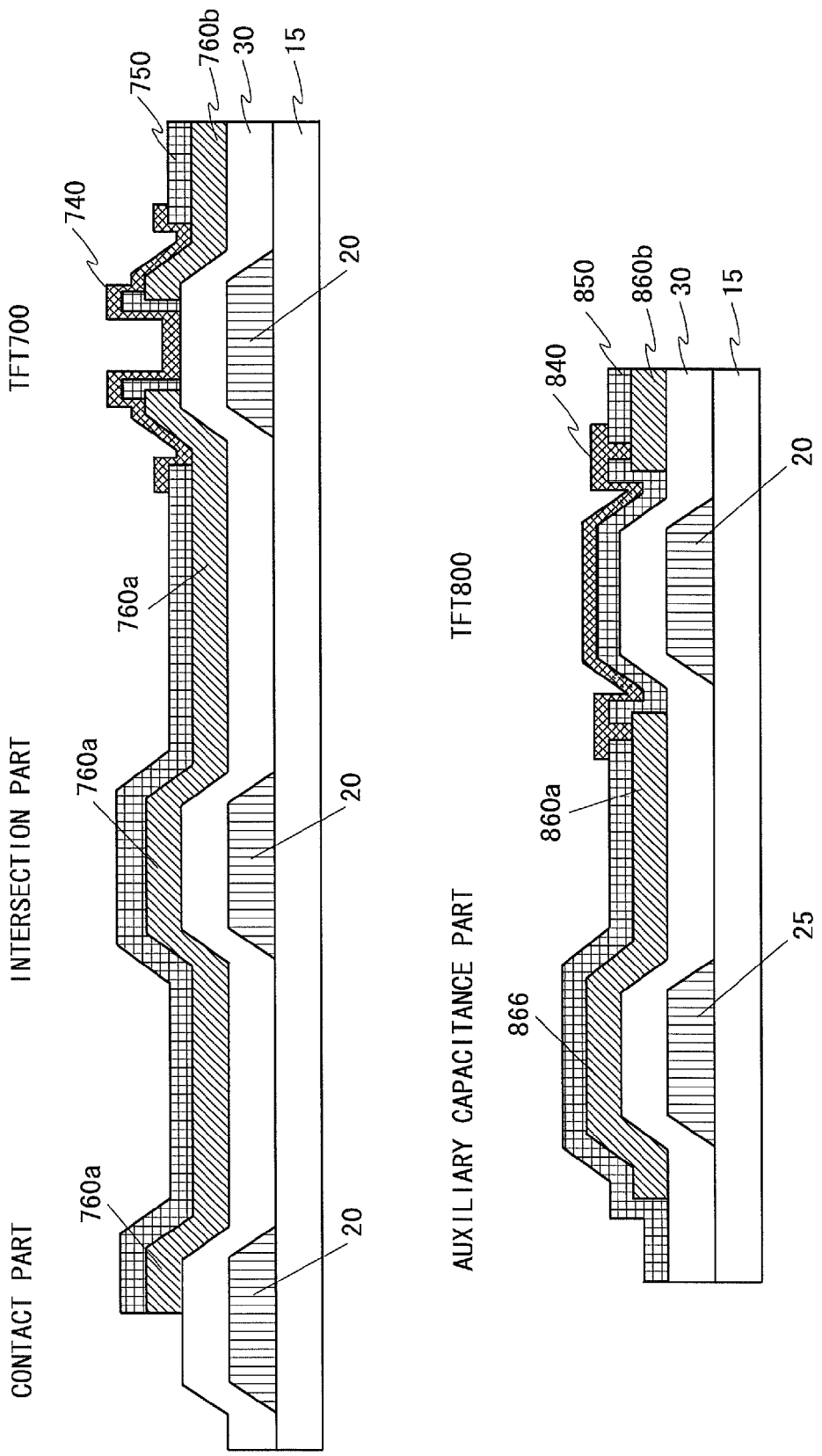
FIG. 26 is a process cross-sectional view showing each manufacturing process of the liquid crystal display device including the TFT shown in FIG. 23, the TFT shown in FIG. 24, the auxiliary capacitance part, the intersection part, and the contact part.
Figure 27:
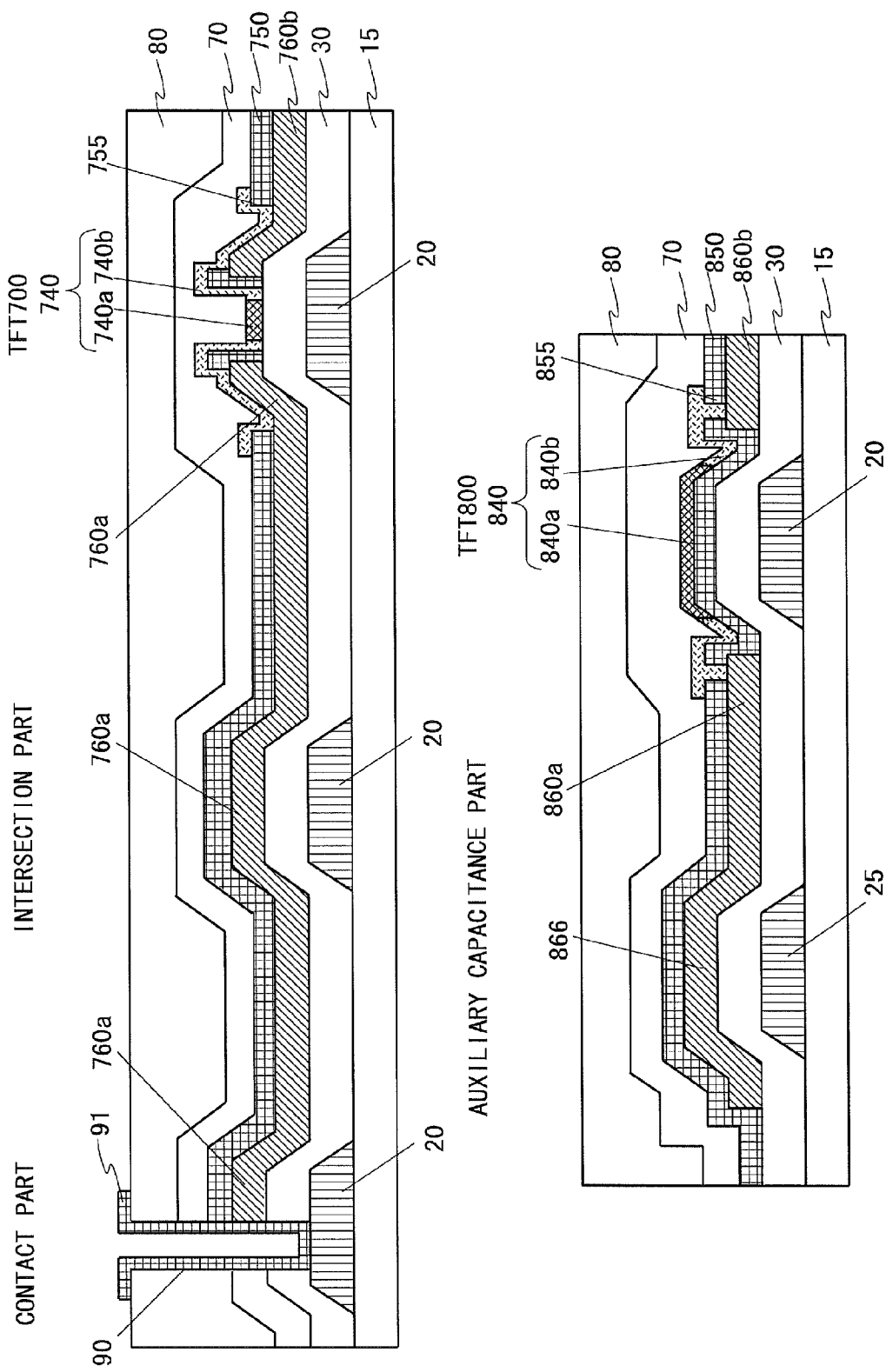
FIG. 27 is a process cross-sectional view showing each manufacturing process of the liquid crystal display device including the TFT shown in FIG. 23, the TFT shown in FIG. 24, the auxiliary capacitance part, the intersection part, and the contact part.

A manufacturing method for the liquid crystal display device including the TFT 700 shown in FIG. 23(*a*) and FIG. 23(*b*) and the TFT 800 shown in FIG. 24(*a*) and FIG. 24(*b*) is described. FIG. 25 to FIG. 27 are process cross-sectional views showing each manufacturing process of the liquid crystal display device including the TFT 700, the TFT 800, the auxiliary capacitance part, the intersection part, and the contact part.

As shown in FIG. 25(*a*), the process of forming the gate electrode 20 and the lower electrode 25 and the process of forming the gate insulating film 30 are the same as the process of forming the gate electrode 20 and the lower electrode 25, and the process of forming the gate insulating film 30 shown in FIG. 10(*a*), respectively, and therefore, their descriptions are omitted.

Next, a source metal film (not shown) is formed on the gate insulating film 30. The source metal film includes a laminated metal film obtained by continuously forming a titanium film, an aluminum film, and a titanium film by using the sputtering method.

Next, a resist pattern (not shown) is formed to sandwich the gate electrode in the planar view, by using the photolithography method. The source metal film is etched by a wet etching method, by using the resist pattern as a mask.

As a result, as shown in FIG. 25(*a*), in the TFT 700, there are formed the source electrode 760a that is overlapped with the left upper surface of the gate electrode 20 and is further extended onto the left-side gate insulating film 30 in the planar view, and the drain electrode 760b that is overlapped with the right upper surface of the gate electrode 20 and is further extended onto the right-side gate insulating film 30 in the planar view. In the TFT 800, there are formed the source electrode 860a that is extended from the outside at the left side part of the gate electrode 20 onto the further left-side gate insulating film 30 in the planar view, and the drain electrode 860b that is extended from the outside at the right side part of the gate electrode 20 onto the further right-side gate insulating film 30 in the planar view.

By using the plasma CVD method, a silicon oxide film (not shown) that becomes the interlayer insulating layers 750, 850 and has a film thickness of 40 nm to 400 nm is formed so as to cover the whole surface of the insulating substrate 15 including the source electrodes 760a, 860a and the drain electrodes 760b, 860b.

Next, by using a resist pattern (not shown) formed on the silicon oxide film as a mask, the silicon oxide film is etched by the dry etching method. The interlayer insulating layers 750, 850 are formed, and the contact hole 755 is formed in the interlayer insulating layer 750 constituting the TFT 700, and further, the contact hole 855 is formed in the interlayer insulating layer 850 constituting the TFT 800. Accordingly, as shown in FIG. 25(*b*), the contact hole 755 of the TFT 700 reaches the source electrode 760a on the left upper surface of the gate electrode 20 and the drain electrode 760b on the right upper surface of the gate electrode 20. The contact hole 855 of the TFT 800 reaches the source electrode 860a at a further outside of the left side part of the gate electrode 20 and the drain electrode 860b at a further outside of the right side part of the gate electrode 20, respectively.

An IGZO film (not shown) is formed by using the DC sputtering method, to cover the whole surface of the insulating substrate 15 including the source electrodes 760a, 860a and the drain electrodes 760b, 860b. Next, a resist pattern (not shown) is formed on the IGZO film. By dry etching the IGZO film by using the resist pattern as a mask, IGZO layers that become the channel layers 740, 840 are formed. Accordingly, as shown in FIG. 26, the IGZO layers that become the channel layers 740, 840 are formed respectively in the region on the gate insulating film 30 and sandwiched between the source electrode 760a and the drain electrode 760b and in the region on the interlayer insulating layer 850 sandwiched between the source electrode 860a and the drain electrode 860b.

In the TFT 700, one end of the channel layer 740 is electrically connected to the source electrode 760a in the left-side contact hole 755, and is further extended onto the interlayer insulating layer 750 at the left side of the contact hole 755. The other end of the channel layer 740 is electrically connected to the drain electrode 760b in the right-side contact hole 755, and is further extended onto the interlayer insulating layer 750 at the right side of the contact hole 755. In the TFT 800, one end of the channel layer 840 is electrically connected to the source electrode 860a in the left-side contact hole 855, and is further extended onto the interlayer insulating layer 850 at the left side of the contact hole 855. The other end of the channel layer 840 is electrically connected to the drain electrode 860b in the right-side contact hole 855, and is further extended onto the interlayer insulating layer 850 at the right side of the contact hole 855.

As shown in FIG. 27, the passivation film 70 made of a silicon oxide film is formed to cover the whole surface of the insulating substrate 15 by using the plasma CVD method. The process of forming the passivation film 70 is the same as that in the first embodiment, and therefore, its description is omitted.

Next, in an atmosphere at a temperature of 250° C. to 350° C., annealing is performed for 0.5 hour to two hours. By performing the annealing, the low resistance regions 740b are formed in the channel layer 740 near the source electrode 760a and the drain electrode 760b, and the low resistance regions 840b are formed in the channel layer 840 near the source electrode 860a and the drain electrode 860b. As a result, in the TFT 700, the high resistance region 740a remains at the center of the channel layer 740 sandwiched between the two low resistance regions 740b, and at the end parts in the channel width direction. In the TFT 800, the high resistance region 840a remains at the center of the channel layer 840 sandwiched between the two low resistance regions 840b, and at the end parts in the channel width direction. In this way, the high resistance regions 740a, 840a are extended not only to the channel region sandwiched between the source electrode 760a and the drain electrode 760b and the channel region sandwiched between the source electrode 860a and the drain electrode 860b, respectively, but also to the end parts in the channel width direction of the channel layer 740 and the end parts in the channel width direction of the channel layer 840, respectively. Accordingly, because the off-current flowing through the end parts in the channel width direction reduces, the off-current of the TFTs 700, 800 can be reduced.

By performing annealing, oxygen is supplied from the passivation film 70 to the IGZO layer of the channel layers 740, 840. Accordingly, the resistance value of the IGZO layer becomes high, and the shift of the threshold voltage due to the gate voltage stress is suppressed, like in the first embodiment, and therefore, reliability of the TFTs 700, 800 becomes high.

As shown in FIG. 27, after the contact hole 90 is opened in the photosensitive resin film 80 formed on the passivation film 70, a transparent metal film (not shown) is formed, and the gate electrode 20 and the source electrode 760a are connected in the contact hole 90. These processes are the same as the processes of the first embodiment. Therefore, out of components shown in FIG. 27, the same components as those shown in FIG. 12 are designated by the same reference characters, its description is omitted. In this way, the liquid crystal display device including the TFT 700, the TFT 800, the auxiliary capacitance part, the contact part, and the intersection part is formed.

<4.4 Effects>

The effects of the present embodiment are the same as the effects of the first embodiment, and therefore, their descriptions are omitted.

5. Modification

In the first to eighth TFTs, it has been described that a positional relationship between the source electrode and the gate electrode and a positional relationship between the drain electrode and the gate electrode are the same in the planar view. However, these may be different. In the TFT 100 shown in FIG. 1(a) and FIG. 1(b), a case where a positional relationship between the source electrode and the gate electrode is different from a positional relationship between the drain electrode and the gate electrode is described as a modification.

FIG. 28(a) is a plan view showing a configuration of a TFT 900 as a modification of the TFT 100 shown in the first embodiment, and FIG. 28(b) is a cross-sectional view showing the configuration of the TFT 900 taken along section line I-I shown in FIG. 28(a). As is clear from FIG. 28(a) and FIG. 28(b), a positional relationship between the source electrode 960a and the gate electrode 20 is the same as a positional relationship between the source electrode 260a and the gate electrode 20 of the TFT 200. On the other hand, a positional relationship between the drain electrode 960b and the gate electrode 20 is the same as a positional relationship between the drain electrode 160b and the gate electrode 20 of the TFT 100. Accordingly, in the TFT 900, in the planar view, the source electrode 960a is not overlapped with the gate electrode 20, and only the drain electrode 960b is overlapped with the gate electrode 20. Therefore, the parasitic capacitance of the TFT 900 becomes about a half of the parasitic capacitance of the TFT 100. A modification like this is also conceivable in other TFTs.

In the first to fourth embodiments, a case where the TFT is used as a TFT constituting a switching element of a pixel part of a liquid crystal display device or a drive circuit has been described. However, the TFT can be also applied to a display device such as an organic EL (Electro Luminescence) display device, without being limited to the liquid crystal display device.

INDUSTRIAL APPLICABILITY

The present invention is suitable for a thin film transistor to be used for a display device such as an active matrix-type liquid crystal display device, and is particularly suitable for a switching element formed in a pixel formation part thereof, or a transistor of a drive circuit that drives the pixel formation part.

DESCRIPTION OF REFERENCE CHARACTERS

20: Gate electrode
25: Lower electrode
30: Gate insulating film
70: Passivation film
90: Contact hole
91: Connection electrode
100 to 900: Thin film transistor (TFT)
140 to 940: Channel layer (IGZO layer)
140a to 940a: High resistance region
140b to 940b: Low resistance region
160a to 960a: Source electrode
160b to 960b: Drain electrode
266, 466, 666, 866: Upper electrode
350, 450: Etching stopper layer
355, 455, 755, 855: Contact hole
750, 850: Interlayer insulating layer

The invention claimed is:

1. A thin film transistor provided on an insulating substrate, comprising:
    a gate electrode provided on the insulating substrate;
    a gate insulating film that covers the gate electrode;
    a source electrode and a drain electrode provided on the gate insulating film with a predetermined distance, to sandwich the gate electrode; and
    a channel layer made of an oxide semiconductor layer which is located in a region sandwiched between the source electrode and the drain electrode and of which one end and the other end are respectively electrically connected to the source electrode and the drain electrode, wherein
    the channel layer includes two first regions each of which is positioned to respectively surround the source electrode and the drain electrode and has a first resistance value, and a second region sandwiched between the two first regions, extending to define entire end portions of the channel layer in a channel width direction, and having a second resistance value higher than the first resistance value, and
    the first regions are not provided in the end portions of the channel layer in the channel width direction.

2. The thin film transistor according to claim 1, wherein the source electrode and the drain electrode are overlapped with the gate electrode in a planar view.

3. The thin film transistor according to claim 1, wherein the source electrode and the drain electrode are not overlapped with the gate electrode in a planar view.

4. The thin film transistor according to claim 3, wherein the first region is overlapped with the gate electrode in a planar view.

5. The thin film transistor according to claim 1, wherein one of the source electrode and the drain electrode is overlapped with the gate electrode in a planar view, and another one of the source electrode and the drain electrode is not overlapped with the gate electrode in a planar view.

6. The thin film transistor according to claim 2, wherein the source electrode covers one end of the channel layer, and the drain electrode covers another end of the channel layer.

7. The thin film transistor according to claim 2, further comprising an etching stopper layer that cover the second region, on the channel layer in a region sandwiched between an end portion of the source electrode and an end portion of the drain electrode,
    wherein the source electrode and the drain electrode are respectively electrically connected to the two first regions of the channel layer via a contact hole formed in the etching stopper layer.

8. The thin film transistor according to claim 2, wherein one end of the channel layer is electrically connected to the source electrode by covering one end of the source electrode, and another end of the channel layer is electrically connected to the drain electrode by covering one end of the drain electrode.

9. The thin film transistor according to claim 2, further comprising an interlayer insulating layer which covers the source electrode and the drain electrode,
wherein one end of the channel layer is electrically connected to the source electrode via a contact hole opened in the interlayer insulating layer on the source electrode, and another end of the channel layer is electrically connected to the drain electrode via a contact hole opened in the interlayer insulating layer on the drain electrode.

10. The thin film transistor according to claim 1, wherein a desired combination of a channel length and a channel width is selected from among data of a plurality of combinations of channel lengths and channel widths determined such that an off-current becomes smaller than a predetermined current value.

11. The thin film transistor according to claim 1, wherein the channel layer is made of an indium gallium zinc oxide layer, and the source electrode and the drain electrode have a titanium film that is in contact with the indium gallium zinc oxide layer.

12. The thin film transistor according to claim 1, wherein the oxide semiconductor layer is made of a microcrystalline oxide semiconductor layer.

13. An active matrix-type display device for displaying an image, the device comprising:
the first thin film transistor according to claim 1;
an auxiliary capacitance portion including a lower electrode, an upper electrode, and an insulating film formed between the lower electrode and the upper electrode;
an intersection portion where a gate electrode of the first thin film transistor intersects with one of a source electrode and a drain electrode; and
a contact portion where the gate electrode is electrically connected to one of the source electrode and the drain electrode by a connection electrode, wherein
the lower electrode is defined when the gate electrode of the first thin film transistor is provided,
the upper electrode is defined when the source electrode and the drain electrode of the first thin film transistor are provided, and
the insulating film is defined when a gate insulating film of the first thin film transistor is provided.

14. An active matrix-type display device for displaying an image, the device comprising:
the thin film transistor according to claim 7;
an auxiliary capacitance portion including a lower electrode, an upper electrode, and an insulating film provided between the lower electrode and the upper electrode;
an intersection portion where a gate electrode of the thin film transistor intersects with one of a source electrode and a drain electrode; and
a contact portion where the gate electrode is electrically connected to one of the source electrode and the drain electrode by a connection electrode, wherein
the insulating film of the auxiliary capacitance portion includes a first insulating film defined when the gate insulating film of the thin film transistor is provided, and
the intersection portion includes the first insulating film, and a second insulating film defined when the etching stopper layer of the thin film transistor is provided.

15. The display device according to claim 13, wherein in the contact portion, the connection electrode which electrically connects the gate electrode to one of the source electrode and the drain electrode is made of a transparent metal film.

* * * * *